(12) United States Patent
Oetzel et al.

(10) Patent No.: US 12,021,058 B2
(45) Date of Patent: Jun. 25, 2024

(54) SYSTEM AND METHOD FOR CONNECTING ELECTRONIC ASSEMBLIES

(71) Applicant: PINK GMBH THERMOSYSTEME, Wertheim (DE)

(72) Inventors: Christoph Oetzel, Freudenberg Boxtal (DE); Stefan Müssig, Dorfprozelten (DE)

(73) Assignee: PINK GMBH THERMOSYSTEME, Werthelm (DE)

( * ) Notice: Subject to any disclaimer, the term of this patent is extended or adjusted under 35 U.S.C. 154(b) by 0 days.

(21) Appl. No.: 18/273,507

(22) PCT Filed: Jan. 28, 2022

(86) PCT No.: PCT/EP2022/052029
§ 371 (c)(1),
(2) Date: Jul. 20, 2023

(87) PCT Pub. No.: WO2022/162135
PCT Pub. Date: Aug. 4, 2022

(65) Prior Publication Data
US 2024/0047413 A1 Feb. 8, 2024

(30) Foreign Application Priority Data

Jan. 29, 2021 (DE) .......................... 102021102129.4
Apr. 7, 2021 (DE) .......................... 102021108635.3

(51) Int. Cl.
*H01L 21/00* (2006.01)
*H01L 23/00* (2006.01)

(52) U.S. Cl.
CPC .... *H01L 24/75* (2013.01); *H01L 2224/75651* (2013.01); *H01L 2224/75701* (2013.01)

(58) Field of Classification Search
CPC ........... H01L 24/75; H01L 2224/75651; H01L 2224/75701
(Continued)

(56) References Cited

U.S. PATENT DOCUMENTS 5,273,911 A * 12/1993 Sasaki .................. C23C 16/545
136/258
5,846,328 A * 12/1998 Aruga .................. C23C 14/568
204/298.25
(Continued)

FOREIGN PATENT DOCUMENTS

DE             20122579 U1    7/2006
DE         102016123362 B3    3/2018
(Continued)

*Primary Examiner* — Vu A Vu
(74) *Attorney, Agent, or Firm* — DINSMORE & SHOHL LLP

(57) ABSTRACT

A system for connecting electronic assemblies and/or for manufacturing workpieces has a plurality of modules for connecting the electronic assemblies and/or for manufacturing the workpieces. At least one module is a loading station and one is an unloading station, or one module is a loading station and unloading station. At least one further module is a manufacturing station, and a manufacturing workpiece carrier is provided for accommodating the electronic assemblies and/or workpieces which is movable in automated manner by a conveying unit from the loading station via the manufacturing station to the unloading station. A multiple gripper is provided by which at least two electronic assemblies and/or workpieces are simultaneously placeable onto the manufacturing workpiece carrier. A foil/film transfer unit and a foil/film detachment unit and a manufacturing workpiece carrier with at least two workpieces is provided. A method for connecting electronic assemblies and/or for manufacturing workpieces is provided.

20 Claims, 27 Drawing Sheets

(58) Field of Classification Search
USPC ........................................................ 438/106
See application file for complete search history.

(56) References Cited

U.S. PATENT DOCUMENTS

| | | | | |
|---|---|---|---|---|
| 6,235,634 | B1* | 5/2001 | White | H01L 21/67161 |
| | | | | 414/217 |
| 6,251,232 | B1* | 6/2001 | Aruga | C23C 14/564 |
| | | | | 204/298.25 |
| 6,517,691 | B1* | 2/2003 | Bluck | H01L 21/67196 |
| | | | | 414/221 |
| 6,795,466 | B1* | 9/2004 | Takei | H01S 5/1231 |
| | | | | 372/102 |
| 7,625,450 | B2* | 12/2009 | Furukawa | C23C 14/568 |
| | | | | 118/632 |
| 7,695,233 | B2* | 4/2010 | Toshima | H01L 21/68778 |
| | | | | 414/217 |
| 8,202,034 | B2* | 6/2012 | Sone | H01L 21/67766 |
| | | | | 414/941 |
| 8,689,686 | B2* | 4/2014 | Moncavage | H05K 3/1225 |
| | | | | 101/118 |
| 8,690,041 | B2* | 4/2014 | Hsieh | B23K 1/0016 |
| | | | | 228/180.1 |
| 9,307,650 | B2* | 4/2016 | Krokoszinski | H05K 3/041 |
| 10,381,034 | B2* | 8/2019 | Nagai | C23C 14/5806 |
| 2008/0127486 | A1 | 6/2008 | Hirata et al. | |
| 2011/0263065 | A1* | 10/2011 | Black | C23C 14/568 |
| | | | | 118/500 |
| 2013/0108406 | A1 | 5/2013 | Schaller et al. | |
| 2014/0220302 | A1 | 8/2014 | Kaga | |
| 2015/0109598 | A1 | 4/2015 | Vergeer | |
| 2019/0283133 | A1* | 9/2019 | Andler | C22C 38/44 |

FOREIGN PATENT DOCUMENTS

| | | |
|---|---|---|
| DE | 102017100053 A1 | 7/2018 |
| DE | 102018004086 A1 | 11/2019 |
| DE | 102019134410 A1 | 6/2021 |
| EP | 0886299 A2 | 12/1998 |
| EP | 1331659 A2 | 7/2003 |
| GB | 1472671 A | 5/1977 |
| JP | H05347321 A | 12/1993 |
| JP | 2013219096 A | 10/2013 |
| WO | 2009150239 A1 | 12/2009 |
| WO | 2019091574 A1 | 5/2019 |

* cited by examiner

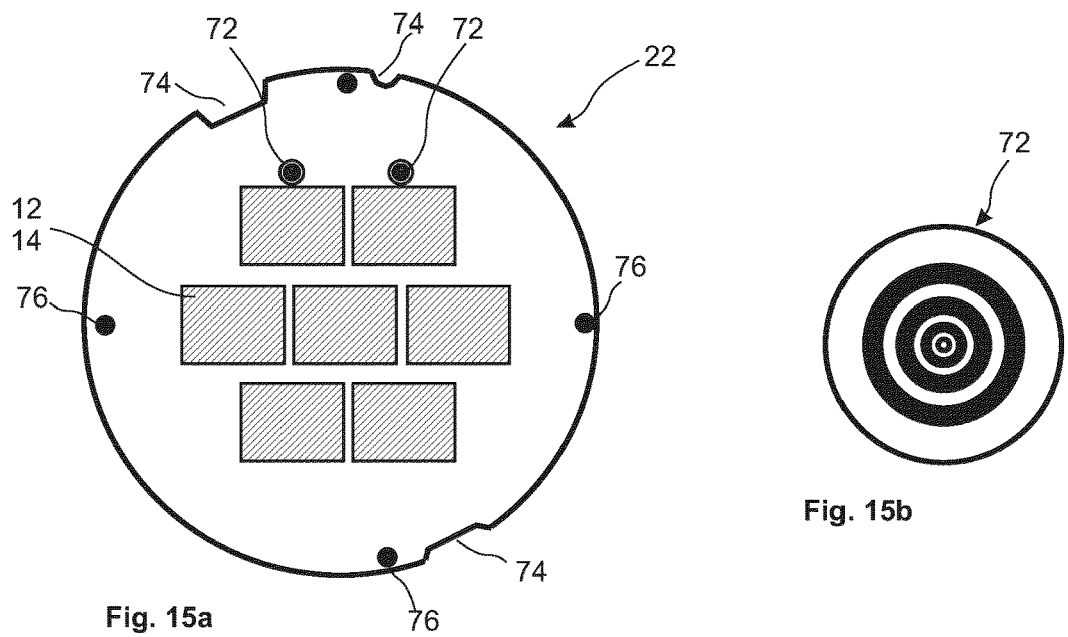
Fig. 15a
Fig. 15b
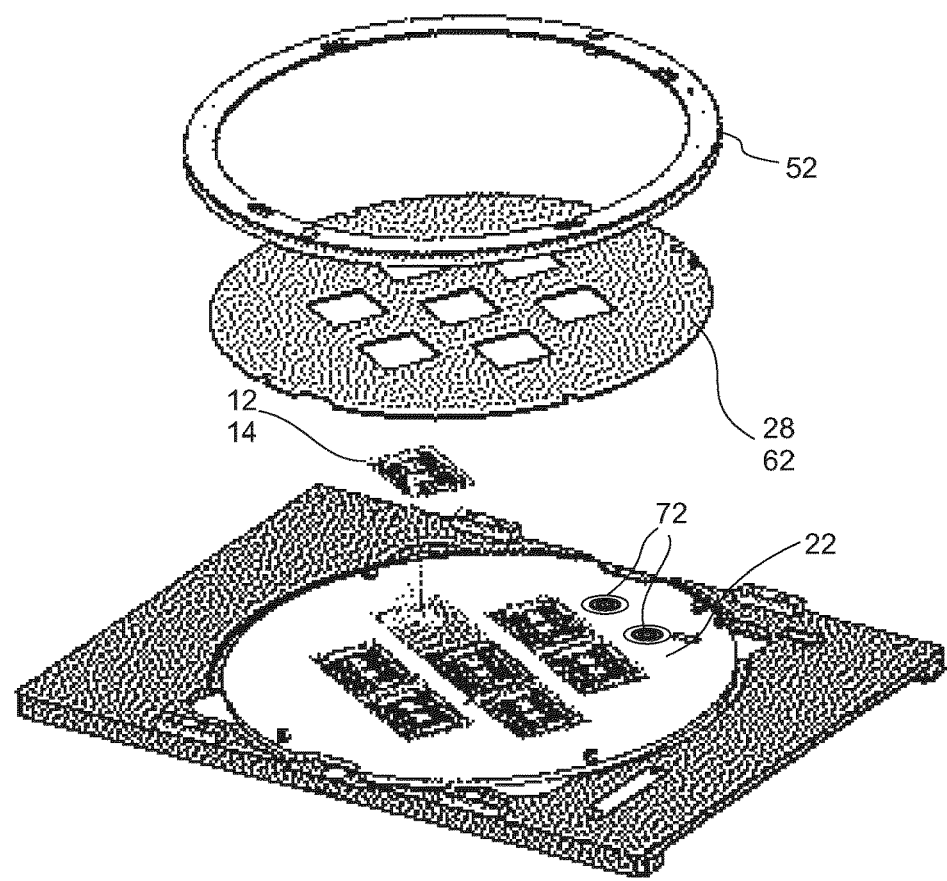
Fig. 16

SYSTEM AND METHOD FOR CONNECTING ELECTRONIC ASSEMBLIES

CROSS-REFERENCE TO RELATED APPLICATIONS

This application is the U.S. National Stage of PCT/EP2022/052029 filed on Jan. 28, 2022, which claims priority to German Patent Application 102021102129.4 filed on Jan. 29, 2021, and German Patent Application 102021108635.3 filed on Apr. 7, 2021 the entire content of both are incorporated herein by reference in their entirety.

FIELD OF THE INVENTION

The invention relates to a system for connecting electronic assemblies and/or for manufacturing workpieces, in particular a sintering or soldering system. The invention also relates to a foil/film transfer unit which provides covering foils/films for covering the workpieces in the system, to a foil/film detachment unit and to a manufacturing workpiece carrier.

The invention further relates to a method for connecting electronic assemblies and/or for manufacturing workpieces, in particular for a sintering or soldering system, in particular for a vacuum sintering or vacuum soldering system, preferably for a diffusion soldering system.

PRIOR ART

Systems and methods for connecting electronic assemblies, in particular soldering and sintering systems with a process atmosphere, in particular a vacuum or gas atmosphere, which are designed as individual systems and not for continuous production, are known from the prior art. In this case, unwelcome idle times arise between the individual method steps or the individual positions of the system, during which idle times individual fabrication operations, such as transferring workpieces onto a conveying unit or covering the workpieces with a process cover, have to be performed manually. Therefore, systems for connecting electronic assemblies which do not operate in a fully automated manner are known from the prior art. In such known systems or methods, individual working steps are performed manually and require manual intervention. In this situation, errors may arise during workpiece fabrication.

Interruption of the individual steps or interruptions between the individual positions mean that provision of a clean room, in particular of an ISO 5 clean room, cannot always be assured.

A clean or ultra-clean room is a room in which the concentration of airborne particles is kept very low. Clean and ultra-clean rooms are required for specific manufacturing procedures—primarily in semiconductor manufacture—where particles present in ordinary ambient air would disrupt the patterning of integrated circuits in a range of fractions of a micrometre. Further applications of clean rooms or ultra-clean room technology are found in optics and laser technology, and in the case of the sintering or diffusion soldering under consideration here.

International standards define specific cleanliness requirements for the operation of controlled environments. The standards and guidelines regulate the particle concentration (for example EN ISO 14644 and VDI 2083 from 2019) or additionally the microbial load of the environments (for example the EU-GPMP guidelines from 2019).

For ultra-clean rooms as used in microelectronics, there are several hierarchical zones with corresponding clean room classes. The ultra-clean room (ISO Class 4 and above) in which work is performed with substrates is thus enclosed by a separate zone with the necessary systems for coating and patterning.

DE 201 22 579 U1 shows an automatic fitting machine and an automatic soldering machine. As a result, at least two modules are formed wherein the circuit carriers are supplied by a slider onto a conveyor belt of the automatic fitting machine. In the automatic fitting machine, further circuit components from a magazine container are attached to the circuit carriers using a gripper arm. The conveyor belt merges inside the automatic fitting machine into the conveyor belt that guides the circuit carriers into the automatic soldering machine. The manufacturing station is formed by the automatic soldering machine.

DE 10 2016 123 362 B3 shows a multiple fitting head. This means that chip retaining devices are arranged in a fixed grid. Accordingly, a plurality of chips can be removed or loaded simultaneously.

DE 10 2019 134 410 A1 shows a system with a foil/film transfer unit.

US 2008/0 127 486 A1 shows an arrangement of a plurality of chips arranged one above the other on a substrate.

DE 10 2018 004 086 A1 shows a throughput system for coating substrates, comprising a process module and a vacuum gate valve. An automated movement of manufacturing workpiece carriers is thus shown. It may comprise a return unit for returning the substrate carrier after removal of the substrates for further use.

US 2013/0 108 406 A1 shows a gripper that can simultaneously pick up a plurality of workpieces arranged in matrix form.

JP 2013-219 096 A shows the loading of a workpiece carrier with workpieces, wherein pads are arranged between the workpieces.

BACKGROUND OF THE INVENTION

The object of the invention is to propose a system or a method which enables an automated, and in particular fully automated sequence, thereby ensuring in particular the provision of an ISO 5 clean room.

A further object of the invention to propose a system or a method in which manual checking of individual positions or individual method steps can be dispensed with.

Moreover, a foil/film transfer unit is proposed, in particular for a sintering system, in which covering foils/films can be fully automatically placed onto and removed from workpieces to be sintered. The object is to enable automated pickup and placement of the foils/films, wherein any adhesion of the foils/films to one another and/or any contamination of the foils/films is to be prevented. In soldering systems, it is preferably possible to dispense with a foil/film transfer unit.

This object is achieved by a system, a method and by a foil/film transfer unit as disclosed herein. Advantageous further developments of the invention are also disclosed.

SUMMARY OF THE INVENTION

The subject matter of the invention is a system for connecting electronic assemblies and/or for manufacturing workpieces, in particular a sintering or soldering system, comprising a plurality of modules for connecting the electronic assemblies and/or for manufacturing the workpieces. The soldering or sintering system is designed in particular for process atmosphere formation, in particular for a vacuum operation. In an embodiment as a vacuum soldering system, the latter may be configured preferably as a diffusion soldering system.

It is proposed that at least one module is designed as a loading station and one module as an unloading station, or one module is designed as a loading and unloading station. In both cases, at least one further module is designed as a manufacturing station, and a manufacturing workpiece carrier for accommodating the electronic assemblies and/or workpieces is provided which is movable in automated manner from the loading station via the manufacturing station to the unloading station by a conveying unit, wherein the system is designed in particular for flow production, wherein a multiple gripper is provided by which at least two electronic assemblies and/or workpieces are simultaneously placeable onto the manufacturing workpiece carrier.

Flow production can for example be ensured with such a system, wherein an automated and in particular fully automated procedure is enabled. Since performance of the various steps in the various modules is in particular not subject to any interruption, a clean room, in particular a clean room to ISO 5, may for example be provided. The system may therefore be suitable in particular for microelectronics, wherein the electronic assemblies and/or workpieces may form microelectronic assemblies or workpieces. It may primarily be used in the production of high power electronics, and for the formation of power semiconductor contact structures with bond buffers, as described for example in DE 10 2009 022 660 B3. The workpieces can comprise in particular high energy semiconductor switches, as used in frequency converters, and associated circuit carriers and/or heat sinks, i.e. they can be multi-part, wherein the individual parts must be connected to one another by means of soldering, sintering or similar methods. A preferred application is the connection of semiconductor components to associated cold transfer media, which must be understood as workpieces in the meaning of the invention.

The system may in particular be a sintering system or a soldering system. Low pressure sintering, as described for example in DE 3414065 A1, DE 10 2014 114 093 B4, DE 10 2004 019 567 B3, is suitable for this purpose. In this context, sintering may on the one hand relate to the production or modification of materials under high pressure and temperature, in particular below melting temperature. Materials may in particular be ceramic or metallic materials. On the other hand, sintering may be understood to mean the connection of multiple elements of a workpiece, for example an electronic unit and a heat sink, or electronic components and printed circuit boards (PCBs). Thermally resistant sintered joints can be produced in this way. Such sintered joints can be an alternative to conventional soldered joints and be used in particular in power electronics. A low pressure connection method (NTV) may be preferred for this purpose and is already being successfully used in the production of large-area components for connecting workpieces, for example IGBT modules. NTV uses pressure sintering of a layer of silver powder to form the connection. Scanning electron microscope examinations make it clear that the NTVsuitable powders sinter spontaneously in air at a temperature of 200° C. in ambient pressure. With the simultaneous effect of a pressure of above 20 MPa, the powder layer is compacted into a solid silver layer which is capable of absorbing high shear stresses. In comparison with conventional connection methods based on solidification of a liquid phase, in NTV the temperature at which the connected arrangement is free of mechanical stresses can be adjusted to a wide range by suitable pressure and temperature curves during the connection process. In particular, copper sintering in any form, for example with a copper-based sintering paste, is appropriate for a flow production sintering system.

On the other hand, the system can be designed as a soldering system, in particular as a vacuum soldering system. A reflow or diffusion soldering method, for example, can be used as the soldering method. Reflow soldering denotes a soft soldering method commonly used in electrical engineering for soldering electronic components. Pre-applied solder deposits such as solder preforms are arranged between workpieces to be soldered and then fused to produce a soldered joint.

In the diffusion soldering process, a solder is alloyed completely to provide an intermetallic phase. The melting point of the resultant phases is markedly higher than the operating temperature of the active components. It is also greatly increased relative to the melting point of the solder. Furthermore, the intermetallic phases have a markedly higher modulus of elasticity. The process is described both for the copper/tin system used in power modules and for the gold/tin system for soldering on printed circuit boards. Load cycle tests with active switching on and off of the chips have revealed that components with this connection technology achieve cycle numbers which are an order of magnitude higher.

To provide a clean room for the sintering or soldering system, the loading station and unloading station, or a module designed as the loading and unloading station, are preferably arranged inside the system. The clean room therefore extends from the loading station to the unloading station via the manufacturing station. At least one manufacturing workpiece carrier, which can be moved in automated manner, can be arranged in this closed system.

To provide flow production, one or more manufacturing workpiece carriers, which are preferably of identical design, are arranged inside the system. A manufacturing workpiece carrier may for example accommodate a plurality of identical electronic assemblies and/or workpieces. Automated movement of the manufacturing workpiece carrier or of the plurality of manufacturing workpiece carriers is achieved using the conveying unit. In the event that one module is designed as a loading and unloading station, the conveying unit preferably runs at least from the loading station to the manufacturing station and back again. If the loading station and the unloading station are designed as separate modules, wherein the manufacturing station is arranged between these two modules, the conveying unit preferably runs from the loading station to the unloading station via the manufacturing station. In this embodiment, the manufacturing workpiece carrier is preferably guided from the unloading station back to the loading station to provide flow production. This can be achieved for example by another conveying method or by another type of conveying. In this way, the manufacturing workpiece carriers can pass through the complete system without any intervention, in particular manual intervention, from outside the system being necessary.

In automated manner means in particular that movement is possible without manual intervention. To this end, the conveying unit may for example be designed at least in part as a type of belt conveyor and/or as a lifting unit. A further advantage of the automated, in particular fully automated system is that a clean room, in particular an ISO 5 clean room, can be provided for each module individually and for the complete system. The system may thus for example be designed closed and/or gas-tight in itself. Individual process chambers inside the system may also be of closed and/or gas-tight design.

A multiple gripper may be used for sintering and soldering systems. A multiple gripper must be understood as a pickup element that can pick up at least two electronic assemblies or at least two workpieces at the same time and convey them from one place to another. The multiple gripper may be used in the loading station and/or in the unloading station. In particular, the multiple gripper may be used in sintering systems and in soldering systems. In particular, at least two workpieces can be gripped and transferred at the same time using the multiple gripper. This allows a workpiece carrier to be loaded and unloaded faster.

In a preferred embodiment, the multiple gripper may have at least two, in particular four gripper arms, which are each designed to pick up one electronic assembly and/or one workpiece. This allows identical workpieces in particular to be moved simultaneously. Each gripper arm may comprise a telescopable and/or pivotable section, and a section for picking up the workpiece or assembly. The receptacle may consist of two gripping elements that can clampably fix one workpiece or one assembly from two sides. The telescopable and/or pivotable section may be telescopically and/or pivotably arranged on a basic element of the multiple gripper. This allows the gripper arms to move relative to one another and relative to the basic element.

Preferably, the gripper arms are movable and/or controllable independently of one another. In particular all gripper arms are arranged in a line, such that workpieces and/or assemblies arranged adjacent to one another can be picked up. In other words, the gripper arms are arranged preferably adjacent to one another on a longitudinal axis of the multiple gripper.

In a preferred embodiment, at least one gripper arm may be pneumatically controlled such that it is movable and/or pivotable relative to the at least one further gripper arm. If several gripper arms are pneumatically controlled, pneumatic control is exerted independently preferably for each gripper arm such that the gripper arms can be moved independently of one another.

In a preferred embodiment, the multiple gripper may have four gripper arms arranged parallel to one another along a line, wherein the two outer gripper arms are movable along the line such that they are movable relative to the two inner gripper arms. The line guidance can be achieved by a form of the multiple gripper where said multiple gripper has for example a linear basic element. The gripper arms can be moved preferably along the linear basic element, for example using telescopable elements and/or rail elements. It is possible here to provide a kind of slide element with the pneumatic control, wherein in particular the two outer gripper arms can be moved away from one another. If the multiple gripper is designed with at least three, in particular four gripper arms, at least the one gripper arm arranged between the two outer gripper arms can be designed fixed. Fixed means in particular that the two outer gripper arms can move relative to the at least one middle gripper arm. Furthermore, fixed means in particular that the at least one middle gripper arm cannot perform any movement relative to the basic element of the multiple gripper. If the multiple gripper is designed with a total of four gripper arms, and hence with two middle gripper arms, the two middle ones can be designed fixed.

In a preferred embodiment, the manufacturing station may comprise at least one further module as a soldering module and/or as a sintering module. The manufacturing station may preferably comprise more than one further module, in particular a preheating module, a plasma module, a soldering module and/or a sintering module and/or a cooling module. A preheating module serves to preheat the workpieces to be connected. A plasma module may be used for example to clean the workpieces. The soldering and/or sintering module may perform connection of the workpieces, in particular in a thermal joining method under a process atmosphere. The cooling module serves for defined cooling of the workpieces, such that a high flow cycle can be achieved for in-line manufacturing, i.e. flow production. One or more contiguous modules possibly connectable by gas-tight airlocks may provide a process atmosphere, in particular a negative pressure or vacuum as a process atmosphere for connection of the workpieces.

The further modules are preferably arranged between the loading station and the unloading station. If the loading station and the unloading station are integrated in one common module, the further modules are preferably arranged on at least one side with regard to the loading station or unloading station. The system may for example be designed as an elongated throughput system. The manufacturing workpiece carrier can preferably pass through all the modules of the system in automated manner. It is conceivable for the manufacturing workpiece carrier to be capable of passing through the system in both directions, i.e. to and fro, creating a circuit. Assembly line manufacture achieved in an automated manner can thereby be particularly advantageously provided. The to-and-fro movement may take place at different levels inside the system.

In a preferred embodiment, one module may be designed as a loading station and one module as an unloading station, wherein the loading station is arranged upstream of the manufacturing station and the unloading station downstream of the manufacturing station, and the conveying unit conveys the electronic assemblies and/or workpieces from the unloading station back to the loading station, in particular bypassing the manufacturing station. Bypassing the manufacturing station should in particular be understood not as spatial bypassing, but as functional bypassing. The manufacturing station may for example be a functional working station which comprises in particular at least one closed and/or gas-tight process chamber. When the manufacturing station is bypassed, this closed process chamber may be bypassed during the return movement of the manufacturing workpiece carrier. The conveying unit may for example be arranged here for return movement outside the process chamber but inside an outer housing surrounding the manufacturing station. The manufacturing workpiece carrier may be returned for example below or adjacent to the at least one working station or process chamber of the manufacturing station. In particular, the return movement takes place inside the system, wherein the manufacturing workpiece carrier preferably does not leave the system during the entire manufacturing process, in particular flow production. The conveying unit may be constructed according to the conveyor belt principle or to the chain guide principle. For vertical conveying of a return conveying unit arranged below the working station, a lifting means may be provided on which the workpiece carriers may be moved according to a lift principle.

As a rule, a conveying workpiece carrier may be used as a manufacturing workpiece carrier, and if so no transfer of the components between the various workpiece carrier types is necessary and return conveying of the manufacturing workpiece carrier can be dispensed with.

In a preferred embodiment, at least one automation robot for guiding the multiple gripper may be provided in the loading station, by which robot at least two electronic assemblies and/or workpieces are transferrable, and if applicable placeable, in automated manner and simultaneously from a conveying workpiece carrier onto the manufacturing workpiece carrier in the loading station. An automation robot may also be provided in the unloading station for unloading the electronic assemblies and/or workpieces. The electronic assemblies and/or workpieces may be supplied to the system by the conveying workpiece carrier. Transfer from the conveying workpiece carrier onto the manufacturing workpiece carrier takes place preferably inside the loading station. This is done by an automation robot arranged preferably inside the loading station. In one embodiment, an automation robot may for example be provided which is designed for loading the manufacturing workpiece carrier at the loading station and for unloading the manufacturing workpiece carrier at the unloading station. This allows transfer of the assemblies from a—typically manufacturer-specific—conveying workpiece carrier to a system-specific manufacturing workpiece carrier. The manufacturing workpiece carrier may here for example accommodate a large number of assemblies, wherein the conveying workpiece carrier conveys just one or few assemblies. To that extent, assemblies from a plurality of conveying workpiece carriers may be accommodated on one manufacturing workpiece carrier. Transfer therefore takes place, at least in the loading station, preferably using the multiple gripper. A plurality of workpieces arranged adjacent to one another on a plurality of conveying workpiece carriers may for example be lifted or gripped at the same time and also set down on the manufacturing workpiece carrier at the same time by the gripper arms which are movable relative to one another. Since the gripper arms are movable relative to one another, in particular pneumatically, any required spatial arrangement is possible on the manufacturing workpiece carrier, even if the workpieces on the conveying workpiece carrier are all arranged adjacent to one another on one line. The multiple gripper is controlled in particular by the robot arm. The transfer of the electronic assemblies or workpieces from the manufacturing workpiece carrier onto the conveying workpiece carrier in the unloading station may also be performed by a multiple gripper.

As a rule, the automation robot is designed as a 3D or 2D handling robot. The automation robot may be advantageously designed as a single-axis handling robot. A onedimensional drive may for example be designed as a linear drive, allowing a high speed to be achieved for a pick-and-place operation at low cost.

In a preferred embodiment, an alignment of at least one, in particular of all accommodated electronic assemblies and/or of at least one, in particular of all accommodated workpieces may be achieved by the gripper arms in an axis transverse or longitudinal to the multiple gripper, wherein the axis is aligned in particular horizontally. A longitudinal axis is preferably aligned in the direction of the line in which the gripper arms are arranged. A transverse direction is orthogonal thereto, wherein in particular both axes are in one horizontal plane. This permits an alignment in at least one horizontal spatial direction when the workpieces or assemblies are picked up by the gripper arms. The alignment is intended to allow the workpieces or assemblies to be placed already aligned into the manufacturing workpiece carrier.

In a preferred embodiment, at least one gripper arm, in particular every gripper arm, may have at least two gripping elements for picking up an electronic assembly and/or workpiece, which effects an alignment of the electronic assembly and/or workpiece in an axis, wherein the axis passes in particular through both gripping elements. The gripping element must be understood as a clamping element that can contact the component or workpiece, in particular at a lateral edge. If two gripping elements are arranged opposite on the gripper arm, a workpiece or an assembly may be held between them in clamping manner. Preferably, the gripping elements may be moved relative to one another in order to hold or release the assembly/workpiece.

The gripping elements are preferably designed for alignment. To do so, each of the gripping elements are preferably in surface contact with one lateral edge of the workpiece, such that the workpiece can be aligned in one direction. In one embodiment, all gripper arms of a multiple gripper are arranged parallel or adjacent to one another on one axis, such that all workpieces can be identically aligned. In particular, the opposite gripping elements are therefore also arranged parallel or on one axis relative to the respective adjacent gripping element. In another embodiment, the gripping elements of the gripper arms are arranged adjacent to one another such that a rear face of a gripping element and a rear face of a gripping element of an adjacent gripper arm are aligned to one another in each case.

A preferred embodiment may comprise an aligning unit that effects an alignment of the electronic assembly and/or workpiece picked up by the multiple gripper in an axis parallel and/or transverse to the multiple gripper. In one embodiment, a first alignment may be achieved by the gripper arms of the multiple gripper in an axis transverse to the axis of the multiple gripper. The aligning unit may be designed as a kind of stop, towards which the multiple gripper is moved so that the free lateral edges of the workpieces not contacted by a gripping element contact the aligning unit. If the aligning unit is designed as an edge, the workpieces/assemblies are all equally aligned by contact with that edge.

In a preferred embodiment, the aligning unit may effect an alignment of the electronic assemblies and/or workpieces in an axis transverse to the alignment by the gripping elements. The aligning unit is here preferably designed similar to the multiple gripper. This means that the aligning unit also has gripping elements designed for picking up or contacting the workpieces. The gripping elements of the aligning unit may here be moved from underneath up against the workpieces already held by the multiple gripper, in order to grip the workpieces at two opposite free lateral edges and align them. The workpieces can therefore at times be contacted by gripping elements at all four lateral edges so that they can be aligned. An alignment can therefore take place in two directions extending orthogonally to one another in a preferably horizontal plane. The aligning unit is then preferably moved away again from the workpieces/assemblies. The aligned assemblies can then be placed already aligned onto the manufacturing workpiece carrier.

In a preferred embodiment, a centering device may be provided in the loading station for alignment and/or centering of the manufacturing workpiece carrier, said device effecting a horizontal and/or vertical alignment and/or centering of the manufacturing workpiece carrier before accommodating the electronic assemblies and/or workpieces. Preferably, the manufacturing workpiece carrier may comprise a conveying frame and a baseplate accommodated therein, wherein workpieces are positioned in the baseplate. This allows the manufacturing workpiece carrier or baseplate to be exactly aligned relative to the conveying frame of the manufacturing workpiece carrier, in order to accommodate with a precise fit the workpieces/assemblies aligned with the multiple gripper.

The centering device can effect centering or alignment of the manufacturing workpiece carrier in relation to the conveying unit. This allows the manufacturing workpiece carrier to be designed practically in two parts, wherein a so-called baseplate provides the areas for accommodating the workpieces or electronic assemblies and a conveying frame is designed as a kind of frame element for accommodating the baseplate. This allows the baseplate to be aligned and fixed in relation to the conveying frame. The baseplate is in the following a essential element of the manufacturing workpiece carrier, or it can provide the manufacturing workpiece carrier in its entirety or in its essential features together with the frame element, as it comprises the receptacles for the large number of workpieces/assemblies. The baseplate can here preferably be moved, lifted or lowered relative to the conveying frame. Furthermore, the baseplate and conveying frame can be rotated in relation to one another. This allows alignment of the receptacles for the workpieces/assemblies. This may preferably be used for positionally correct alignment of workpieces in relation to press plungers inside the manufacturing station for a press process.

In a preferred embodiment, the centering device may comprise a centering plate and/or a lifting unit, wherein control is in particular pneumatic. The manufacturing workpiece carrier or baseplate is arranged on the centering plate such that a movement of the centering plate is possible relative to the manufacturing workpiece carrier or conveying frame. Preferably, the centering plate and the manufacturing workpiece carrier or baseplate are displaceably contacted using at least two, in particular three supports. The supports can be ball bearing-type supports. The centering plate can be lifted and lowered using the lifting unit.

In a preferred embodiment, at least one projection or peg, which is contactable with a stop on the manufacturing workpiece carrier or baseplate, may be provided on the centering plate, such that alignment and/or centering of the manufacturing workpiece carrier relative to the centering plate can take place in the horizontal clamping plane. This may be achieved for example using a pressing element which is pressed against the manufacturing workpiece carrier or baseplate, wherein the projection or peg comes into contact with the stop. This allows the manufacturing workpiece carrier or baseplate to be aligned in the conveying frame of the manufacturing workpiece carrier. The pressing element may be designed as a kind of eccentric, and moved at right angles to the clamping plane, in particular by an electric motor. Alternatively, the pressing element may be designed as a plunger inside the clamping plane and be controlled for example by a pneumatic cylinder.

In a further embodiment, a suction gripper, which can lift the workpieces by means of negative pressure while avoiding mechanical gripping forces, may be used for transfer. Furthermore, more than one automation robot may be provided inside the system. In a preferred embodiment, one automation robot is arranged in the loading station and a further automation robot in the unloading station. In this way, continuous loading or unloading of the manufacturing workpiece carrier may take place inside the system, whereby flow production may be achieved particularly advantageously. The specification of the conveying workpiece carrier is thus independent of the specification of the manufacturing workpiece carrier suitable for the joining process, e.g. the sintering or soldering process.

Correct fabrication, in particular the position and arrangement of the assemblies on the manufacturing workpiece carrier in the loading station, may be checked and archived optically by means of at least one camera. At least one camera for optical alignment in the loading and/or unloading station may also be provided for aligning a gripper arm of an automation robot/handling robot. The camera may for example determine a correct alignment of the workpieces or joining counterparts inside the workpieces, for example the DCBs (Direct Copper Bonded), relative to one another or in relation to the manufacturing workpiece carrier and/or the covering foil/film and/or covering mask, and pass on adjustment information to the automation robot. This enables for example edge and corner contours to be detected and from that an X/Y offset to be determined. The automation robot may take the form of a conventional industrial robot with an arm movable about multiple axes. It may also be designed as a single-axis or multi-axis conveying system for conveying workpiece carriers, foils/films, covering masks etc.

A stacking magazine for manufacturing workpiece carriers may be provided inside or in front of the loading station, this enabling population of the conveying unit with a sequential chain of manufacturing workpiece carriers, in particular at the start of production. A continuous process may thus be immediately started up without the need to wait for the first manufacturing workpiece carrier to return. High unit rates can thus be achieved even during the startup of manufacturing, in particular if a plurality of workpieces can be picked up simultaneously using a multiple gripper.

In particular at the end of a batch run in which a number of workpiece carriers are to be joined, dummy workpieces can be placed onto the remaining empty places of the manufacturing workpiece carrier in the case of a last manufacturing workpiece carrier which cannot be completely filled with workpieces, and can be placed from the manufacturing workpiece carrier back onto a dummy position after the joining process, in particular after a sintering or diffusion soldering process.

In a preferred embodiment, a further conveying unit may be provided for accommodating the conveying workpiece carrier and is movable, independently of the modules, from the loading station to the unloading station, in particular bypassing the manufacturing station. This further conveying unit may for example be guided to the system in the loading station, and guided away from the system in the unloading station. The blanks or unconnected components, which may originate from external manufacturers, are in particular arranged on the conveying workpiece carrier. Bypassing the manufacturing station should be understood as already explained above. In particular, the further conveying unit may be movable autonomously, and in particular independently of the conveying unit of the manufacturing workpiece carrier of the system. The conveying unit of the conveying workpiece carrier can move preferably parallel to the modules of the system.

In a preferred embodiment, the loading station may be configured to attach a process cover onto the electronic assemblies and/or workpieces, and/or the unloading station may be configured to remove the process cover from the electronic assemblies and/or workpieces, in particular to attach and/or remove it by means of an automation robot. The process cover may be a mask or covering mask, in particular for a sintering process, which can be placed in automated manner onto the electronic assemblies and/or workpieces which are arranged on the manufacturing workpiece carrier. It can be attached using an automated device or an automation robot. The process cover may here be moved/displaced to and fro between a parked position, in particular for intermediate storage of the process cover, and the position on the manufacturing workpiece carrier. The process cover may be mounted on a type of storage device and moved to the appropriate position using a rail. This may be computer-controlled. If a plurality of manufacturing workpiece carriers are provided inside the system, in particular for continuous manufacture, a plurality of process covers are preferably arranged inside the system. For example, a process cover may be continuously placed at the parked position, if the process cover previously arranged there has been removed or placed onto the manufacturing workpiece carrier. Furthermore, a process cover may be provided for each manufacturing workpiece carrier, wherein upon return of the manufacturing workpiece carrier the process cover is returned with the manufacturing workpiece carrier. Prior to returning from the unloading station to the loading station, the process cover may be placed back onto the manufacturing workpiece carrier for return conveying.

In a preferred embodiment, the loading station and/or the unloading station may comprise at least two working positions, in particular three or four working positions, wherein the manufacturing workpiece carrier is movable in automated manner, in particular by a displacement unit, from one working position to an adjacent working position. Each of the working positions may perform a work step different from the other working position. In a first working position, the process cover, in particular a covering mask, may for example be placed onto the manufacturing workpiece carrier with the electronic assemblies and/or workpieces. Alternatively, the mask may also be dispensed with. After passage through the final working position, the electronic assemblies and/or workpieces on the manufacturing workpiece carrier are preferably prepared in such a way that they can pass through the manufacturing station, in particular a preheating module, soldering or sintering module and cooling module. The displacement unit may be designed as a type of conveying unit, for example as a belt conveyor or conveyor belt. The displacement unit may form, together with the conveying unit a type of circuit for returning the manufacturing workpiece carrier in order to provide flow production. If a plurality of manufacturing workpiece carriers are arranged in the system, they are preferably arranged on the displacement unit at a constant spacing to one another. The working stations may be arranged sequentially and linearly one behind the other, or circularly adjacent to one another in the form of a rotary indexing table.

In a preferred embodiment, the loading station may comprise three working positions connected to one another by a displacement unit. To this end, the electronic assemblies and/or the workpieces may be placed in automated manner on a first working position by an automation robot. At least one mask may be placed in automated manner as a first process cover onto the electronic assemblies and/or workpieces by an automation robot. Alternatively or additionally, in a second working position at least one foil/film or a plurality of foil/film pieces may be placed in automated manner onto the mask as a second process cover or instead of the mask by an automation robot, and in a third working position closure of the manufacturing workpiece carrier with the foil/film may take place automatically in particular using a retaining frame, in particular a retaining ring. It is conceivable for a single automation robot to be provided for performing all the operations in all the working positions. Preferably, separate automation robots or other types of computer-controlled actuator devices are provided at each working position in order to perform the respective working steps in the working positions.

The foil/film transfer unit is used in particular when the system is a sintering system. In the case of a soldering system, it is possible to dispense with a foil/film transfer unit and accordingly with any use whatsoever of a foil/film.

The foil/film may for example be a thermally resistant equalizing foil/film, for example for temperature ranges around 250° C., for example a PTFE film, an FKM film, a silicone film, a polyurethane elastomer film, Eladur films, a PFA film, PI film or the like, such as a graphite film, an aluminum foil or the like. The foil/film may preferably serve as protection for an SMD (Surface Mounted Device). SMD components have an extremely compact design. Such electronic components have no leads, and instead are soldered directly to a printed circuit board by means of solderable lands. This technique may also be designated as surface mounting. The foil/film may prevent unwelcome sticking of a gel pad to a component surface in the context of a sintering process.

In a preferred embodiment, the loading station and the unloading station may be designed as mirror images of one another. As a result, the electronic assemblies and/or workpieces in the loading station may particularly advantageously be continuously prepared for the subsequent sintering operation or soldering operation. In the unloading station, by contrast, the auxiliary devices needed for sintering or soldering, such as a process cover or foil/film, may be continuously removed again. Since the working steps of the loading station in particular are performed in complementary manner in the unloading station, the two modules may preferably be of identical construction but designed as mirror images of, or complementarily to, one another.

In a preferred embodiment, the conveying unit for conveying the manufacturing workpiece carrier may comprise a lifting unit and an underfloor conveying unit, wherein the movement path of the underfloor conveying unit is arranged inside the system, in particular bypassing the manufacturing station, in particular a gas-tight process chamber, and in particular extends underneath a level in which loading and/or unloading of the manufacturing workpiece carrier and conveying of the manufacturing workpiece carrier through the manufacturing station take place. Bypassing the manufacturing station should be understood as already explained above. The manufacturing workpiece carrier can be moved parallel to the working positions of the loading station or unloading station by the underfloor conveying unit. This allows structural space to be saved, since returning can take place inside the system. The manufacturing workpiece carrier may therefore be particularly advantageously moved from the loading station to the unloading station. In the unloading station, the further conveying unit may pick-up the electronic assemblies and/or workpieces from the manufacturing workpiece carrier before the manufacturing workpiece carrier is returned to the loading station.

In a preferred embodiment, an optical inspection unit comprising at least one inspection camera may be provided. The at least one inspection camera may be in the loading station and/or in the unloading station, and can at least detect and log a positionally correct alignment of the assemblies and/or workpieces in the manufacturing workpiece carrier. The inspection camera can verify the rotational position and X-Y offset of the workpieces on the manufacturing workpiece carrier. Preferably, the inspection camera or a second inspection camera may furthermore detect the rotational position and an X-Y offset of the workpieces on a conveying workpiece carrier or the relative position of the joining counterparts of the workpieces (DCBs—Direct Copper Bonded). The inspection camera may be provided with an illumination unit. Advantageously, at least one inspection camera may be arranged on a gripper arm of an automation robot, which ensures transfer of the workpieces from the conveying workpiece carrier onto the manufacturing workpiece carrier. Such optical inspection cameras may be comprised both in the loading station and in the unloading station. The inspection unit can record position and appearance before and after connection of the workpieces. In addition, the inspection unit can control the automation robot by detection of an X-Y offset. For instance, once a workpiece has been gripped by the automation robot, a positional correction of the automation robot may be determined by means of a first inspection camera. With a second inspection camera, the precise position of the manufacturing workpiece carrier may be determined, such that the workpieces are placeable in the manufacturing workpiece carrier without positional offset and in a precise alignment. This allows incorrect positioning of a workpiece in the conveying workpiece carrier to be corrected and exact positioning in the manufacturing workpiece carrier to be ensured. To this end, one or more optical reference marks may be provided on the manufacturing workpiece carrier for simplified detection by the inspection means. The reference marks permit reliable and exact identification of the position, enabling use of an inspection camera with a low optical resolution or under difficult light conditions or with simple auxiliary lighting. A lightweight inspection camera may also be used for example on a gripper arm, thus achieving a high movement speed and a low weight for the automation robot.

A preferred embodiment may comprise a foil/film transfer unit with at least one, in particular two or more foil/film transfer means, which are designed for automated attachment of foils/films as a process cover in the loading station. The foil/film transfer unit is designed in each case to place a foil/film onto the manufacturing workpiece carrier with the electronic assemblies and/or workpieces, preferably on the mask. A foil/film transfer means may for example be designed with a gripper, wherein the foil/film may be picked up pneumatically and/or by vacuum. In this respect, a foil/film transfer means can be regarded as a handling unit capable of picking up a foil/film, which may be in the form of a precut foil/film piece, and placing it again at a spatially different location. For example, a foil/film may be picked up by a vacuum nozzle arranged on the foil/film transfer means. Consequently, placing of the foil/film may take place in automated or fully automated manner. Manual intervention is unnecessary. In this way, a clean room, in particular an ISO 5 clean room, may be provided.

In a preferred embodiment, the foil/film transfer unit may comprise at least one, in particular two, foil/film stacks, which are designed as a foil/film magazine and have at the top a removal surface for a top foil/film. The foil/film may thus be an individual foil/film element prepared precisely fitting for a workpiece accommodating area of the manufacturing workpiece carrier. The foil/film stack of these individual foil/film elements may accordingly consist of a stack of individual foils/films, already pre-cut, which may be placed continuously, in particular in a working position in the loading station, onto the manufacturing workpiece carriers passing through the working position. For this purpose, the top or bottom foil/film may be in each case removed at the removal surface, i.e. at that side at which the top or bottom foil/film of the stack is arranged. The at least one foil/film stack, in particular two foil/film stacks, may be arranged next to or in the loading station. If two foil/film stacks are present, uninterrupted flow production may be particularly advantageously provided. Thus, a first foil/film stack may be replenished while foils/films continue to be removed from the second foil/film stack. The foil/film transfer unit with the foil/film stack and the foil/film transfer means may preferably be arranged inside the system.

The foil/film stack with pre-cut foils/films allows the foil/film blank to be optimized, waste to be reduced and thus costs to be saved. Preferably, the foils/films may be adapted to the shape of the manufacturing workpiece carrier and the retaining frame, in particular they may be designed round, rectangular, square or hexagonal. The change of foil/film and the change between the two foil/film stacks take place automatically, resulting in long cycle times and virtually no production delay or idle time. Uniformity of temperature between the foil/film stack and ambient temperature can be achieved, which is not ensured when the foil/film is removed from a roll. Foil/film blanks of different thicknesses and different foil/film or material types may be provided on the foil/film stack for sequential removal and easily adapted. On completion of production, foil/film dummies may also be provided, for example as plastic or metal sheets in the foil/film stack, such that no unnecessary scrap or foil/film waste arises. The thickness of the foils/films may be 1 mm or less, in particular 0.25 mm or less, preferably 0.1 mm or less, especially 0.05 mm or less, and the number of foils/films in the foil/film stack may also be precisely in line with the quantity of assemblies/components to be processed. ESD (electrostatic discharge) techniques may be used to load and unload the foil/film stack in order to prevent the foils/films from adhering to one another electrostatically.

It is conceivable in principle to remove a bottom or a top foil/film from a foil/film stack. In a preferred embodiment, the foil/film stack may have a foil/film lifting unit which enables gradual raising of the foil/film stack towards the top. A top foil/film of the foil/film stack may in this way be arranged at a substantially constant height. In this way, it can be ensured that the foil/film transfer means can in each case reach the top foil/film of the foil/film stack if the latter is moved on one and the same movement path, in particular continuously at the same height.

In a further embodiment, a continuous foil/film on a roll may be used instead of individual foils/films. The individual foil/film sections or foils/films can be separated or cut from the continuous foil/film. The continuous foil/film may for example be wound on a roll. Using a foil/film infeed roll, the front end of the continuous foil/film can be gripped and guided to a gripping position by rotation of the foil/film infeed roll. The end of the continuous foil/film thus reachable can be pulled out to a required length by a gripper. Preferably, the foil/film infeed roll is lifted slightly during pulling. Once the required length has been reach, the foil/film infeed roll is preferably set down onto the foil/film in order to fix it in place. The foil/film can then be stretched to the required length by the gripper and cut at a required position by a separating element. The foil/film may then for example be cleaned before it is placed onto a manufacturing workpiece carrier. By continually repeated the steps just described, a plurality of manufacturing workpiece carriers may be provided with individual foil/film sections. The complete device may be arranged in the area of the loading station, in particular at the working position at which the foil/film is to be attached to the already filled manufacturing workpiece carrier.

The present invention further provides a foil/film transfer unit. The foil/film transfer unit is suitable in particular for a system as described above. Furthermore, the foil/film transfer unit may be used independently of the system described above and/or be retrofitted for example into or onto existing systems.

It is proposed that at least one, in particular two, foil/film transfer means and at least one, in particular two, foil/film stacks are comprised. The features and advantages explained above also apply to the independent foil/film transfer unit.

With a foil/film transfer unit, it is in particular possible to pick up foils/films, in particular a thermally resistant equalizing foil/film for example for temperature ranges around 250° C., for example a PTFE film, an FKM film, a silicone film, a PFA film, a PI film, an aluminum foil, a graphite film or the like. The use of such foils/films has already been explained: they may be used in a sintering method as a process cover between a sintering pad or hard punch and a component surface and/or a covering mask on the components.

A preferred embodiment may comprise a cleaning unit for cleaning a top and/or bottom foil/film before transfer onto the electronic assemblies and/or workpieces. In this way, any foil/film may be cleaned by means of the cleaning unit, for example prior to being placed onto a manufacturing workpiece carrier with electronic assemblies and/or workpieces. The cleaning unit may for example be arranged between a foil/film stack and the position of the manufacturing workpiece carrier.

When foils/films are removed from the foil/film stack, these may adhere to one another, primarily due to static charging. To avoid this, and to enable the use of different foil/film materials, the foils/films may advantageously be statically discharged. This may be achieved for example using an ionization system, for example from Keyence Deutschland GmbH, Neu-Isenburg. Using automatic ion control by an ionizer, electrostatic charges may be rapidly and reliably neutralised irrespective of polarity. For this, discharging bars for applying ions can be operated with or without compressed air.

In a preferred embodiment, the foil/film stack may be designed as a foil/film magazine with a foil/film lifting unit, such that a respectively top foil/film of the foil/film stack is movable towards the top by an certain upward travel, and the foil/film transfer means has a height-equalizing system. It is for example possible in each case, after a certain number of foils/films have been removed from the foil/film stack, to perform an upward travel of mm to 15 mm, in particular 10 mm. The foil/film lifting unit may for example be moved mm upwards after 5 to 15, in particular 10, foils/films have been removed from the foil/film stack. The height-equalizing system enables the foil/film transfer means to compensate for deviations from the height at which the top foil/film to be removed is located. In this way, the foil/film transfer means can in effect provide a tolerance when accommodating foils/films. In particular, the tolerance in respect of the height at which a top foil/film of the foil/film stack is located can be equalized.

In a preferred embodiment, a foil/film stack may contain a plurality of foils/films. In particular, a foil/film stack may contain foils/films for production over a period of, for example, 24 hours. Other periods of time are also conceivable.

In a preferred embodiment, the cleaning unit may comprise a linear cleaning unit or be designed as a contactlessly operating surface cleaning system. The linear cleaning unit may in each case pass one foil/film through the cleaning system. In this case, the foil/film may for example be placed first of all with a first foil/film transfer means onto the linear cleaning unit, moved and cleaned there, and then removed from the cleaning unit again with a second foil/film transfer means.

In a preferred embodiment, the cleaning unit may be designed as a contactlessly operating surface cleaning system. This allows contamination of three-dimensional or patterned surfaces to be advantageously removed. For example, contamination may be removed by a pulsating and high turbulence air flow. In particular, using compressed air and/or vacuum and/or ionized air, in particular in that order, positive and negative charges may be introduced into the foil/film to prevent dirt particles from adhering electrostatically to the film surface.

In a preferred embodiment, the foil/film can be electrostatically discharged in the cleaning unit by the introduction of positive and negative charges. Air may then preferably be blown under high pressure onto the foil/film to remove the impurities or particles. The particles are then in particular drawn off by suction, for example by an extraction unit. As a result, the foil/film is in the discharged state, such that no particles can adhere due to electrostatic attraction. This method is suitable in particular for thermally resistant equalizing foil/films, for example for temperature ranges around 250° C., for example a PTFE film, an FKM film, a silicone film, a PFA film, PI film, aluminum foil, graphite film or similar foil/film types.

Contactless cleaning may for example be achieved by pulsating compressed air from a rotary nozzle or through a flat jet nozzle. This is suitable for patterned components, for example. Electrostatic charges can be eliminated by ionization, such that a electrostatic attraction may be eliminated. Ionization with compressed air assistance provided by flat jet nozzles has proven particularly advantageous. An extraction duct may in particular be integrated. Such cleaning units may have a compact design for narrow working widths. These may also be used for retrofitting to existing production facilities.

In a preferred embodiment, the cleaning unit may be take the form of the STATIK-AIR product range from Dr. Escherich GmbH, Munich. This offers contactlessly operating surface cleaning with the elimination of electrostatic charges and removal of disruptive dust and material particles. An integrated extraction duct is provided for clean room application.

Individual foils/films, in particular thermally resistant equalizing foils/films for example for temperature ranges around 250° C., for example PTFE films, FKM films, silicone films, PFA films, PI films, aluminum foils, graphite films or the like, preferably do not adhere to one another due to positive and negative charges. The foils/films can be in effect deionized in this way. This can ensure that only a top foil/film is removed from a foil/film stack by the foil/film transfer means.

In a preferred embodiment, a height measurement and/or thickness measurement may be used to determine whether two foils/films have been picked up. The height or thickness measurement may for example take the form of a transparency measurement, wherein it is possible to determine whether just one foil/film has been picked up by determining the optical transparency of the picked-up foil(s)/film(s). Alternatively, the thickness of the foil/film may be mechanically measured, in particular downstream of the cleaning station and prior to placement of the foil/film onto the manufacturing workpiece carrier or onto the assembly or assemblies, in order to check for reliable separation of the foils/films. This may be achieved for example by means of scanning tips, for example, on the surface of the foil/film stack. This allows the thickness measuring system to be used for all shapes, materials and thicknesses of the covering foils/films. In particular, both opaque and transparent foils/films may thus be checked. In this way, a separation check can be carried out even with thick equalizing foils/films, in other words foils/films for height equalization such as silicone mats or reflective foils/films.

In a preferred embodiment, a first foil/film transfer means may be designed to remove a top and/or bottom foil/film from the foil/film stack and insert it into the cleaning device, and a second foil/film transfer means is designed to remove the foil/film from the cleaning unit and place it onto the manufacturing workpiece carrier with the electronic assemblies and/or workpieces.

The subject matter of the invention is furthermore a foil/film detachment unit for a system in accordance with the invention, preferably for a foil/film transfer unit. It is proposed that a peeling-off unit for detaching at least one foil/film from the electronic assemblies and/or workpieces is comprised. The foil/film detachment unit is therefore preferably inserted or arranged in the unloading station. The foil/film is detached preferably after passage through the manufacturing station, i.e. after performance of a sintering process in a sintering facility. In the case of soldering systems, no foil/film is needed as a rule.

In a preferred embodiment, the foil/film detachment unit may be movable relative to the manufacturing workpiece carrier, wherein a peeling-off element is placeable underneath the foil/film, in particular underneath an individual foil/film element, and a retaining element above the foil/film, in particular above the individual foil/film element, such that the foil/film is detached from the electronic assemblies and/or workpieces. Preferably, the manufacturing workpiece carrier is first moved to the appropriate working position in the unloading station. The foil/film is preferably designed as a single foil/film, i.e. as an individual foil/film element, which is storable on a foil/film stack and has already been trimmed to match the shape of the workpiece receiving area of the manufacturing workpiece carrier. This may be reusable, saving on material costs. The foil/film, or the individual foil/film element, can then be lifted and detached from the substrate, i.e. from the workpieces or electronic assemblies, using the peeling-off element. The peeling-off element may be designed for example as a kind of slider that passes over the full width of the foil/film or of the individual foil/film element. To facilitate lifting of the foil/film and arrangement of the peeling-off element underneath the foil/film, the latter may be lifted for example using a suction element of similar at a front end. While the peeling-off element is arranged underneath the foil/film, the retaining element is preferably placed above the foil/film in order to guide the latter between the peeling-off element and the retaining element. The retaining element can be designed identically to the peeling-off element in its geometry and shape. The retaining element therefore preferably extends over the full width of the foil/film, such that the foil/film can be guided between the peeling-off element and the retaining element. If the foil/film detachment unit is now moved relative to the manufacturing workpiece carrier, the foil/film is detached from the workpieces or electronic assemblies over the full length of the manufacturing workpiece carrier. At the same time, the workpieces or assemblies are held on the manufacturing workpiece carrier by the peeling-off element. The peeling-off element and the retaining element may be held in position at the respective edge areas using a retaining structure, wherein the latter may be movable along the working position. To do so, rail elements may be arranged for example outside the conveying unit in the working position, along which elements the retaining structure may be movable.

In a preferred embodiment, the manufacturing workpiece carrier may be movable relative to the foil/film detachment unit, wherein the manufacturing workpiece carrier may be movable and the foil/film detachment unit may be stationary. In such an embodiment, the manufacturing workpiece carrier is preferably moved on the conveying unit while the foil/film detachment unit remains at a fixed position. This also allows the foil/film to be detached from the manufacturing workpiece carrier.

An alternative embodiment may comprise a contact element that is contactable with the at least one foil/film, wherein the foil/film can be picked up by a gripping element in an area in front of the contact element and is removable from the electronic assemblies and/or workpieces by movement of the manufacturing workpiece carrier in the direction of the gripping element. In particular, the gripping element grips the foil/film while the manufacturing workpiece carrier is being moved. The manufacturing workpiece carrier is moved preferably in the direction of the gripping element, such that the manufacturing workpiece carrier in effect passes through underneath the gripping element while the foil/film is held and detached from the manufacturing workpiece carrier. It is also conceivable that the gripping element is moved away during detachment of the foil/film from the manufacturing workpiece carrier, in order to keep the detached end of the foil/film taut.

In a preferred embodiment, the contact element may be designed as a roller, wherein a rolling movement of the roller over a surface of the foil/film is performable by a movement of the manufacturing workpiece carrier and upon contact with the foil/film. This allows the foil/film to be detached from the manufacturing workpiece carrier with the workpieces or assemblies in a controlled manner. At the same time, movement of the workpieces or assemblies relative to the manufacturing workpiece carrier can be prevented. The contact element or roller extends preferably over the full width of the foil/film or over the full area on which workpieces/assemblies are arranged on the manufacturing workpiece carrier. In other words, the roller may be designed as a kind of drum or pressure roller which ensures positioning of the assemblies or workpieces on the manufacturing workpiece carrier during detachment of the foil/film. In a preferred embodiment, the roller may be adapted to the arrangement of the workpieces or assemblies on the manufacturing workpiece carrier. The roller may for example form a negative impression with recessed and raised areas, wherein recessed areas are arranged in the roller at those points at which workpieces or assemblies are located as it rolls over the manufacturing workpiece carrier. By contrast, raised areas are arranged where the roller does not come into contact with the workpieces or assemblies (since the foil/film is arranged between the roller and the workpieces or assemblies, the roller would not really come into contact with the latter). This ensures a precisely fitting position of the roller is achieved when rolling over the manufacturing workpiece carrier.

In a preferred embodiment, the roller may extend over the width of several workpiece carriers in order to detach several foils/films from several workpiece carriers at the same time.

To facilitate detachment of the foil/film from the manufacturing workpiece carrier, and in particular to ensure gripping of the foil/film by the gripping element, a foil/film lifter may be provided. The latter can form a stop against which the foil/film is moved when the manufacturing workpiece carrier on the conveying unit is moved. As a result, that end of the foil/film coming into contact with the foil/film lifter is slightly lifted and can be picked up more easily by the gripping element behind the foil/film lifter.

In a preferred embodiment, the foil/film detachment unit may be arranged in the unloading station. Preferably, the foil/film detachment unit is integrated in the working position at which the foil/film is to be detached from the manufacturing workpiece carrier. The contact element, the foil/film lifter and the gripping element may be arranged in this working position in this case.

The subject of the invention is furthermore a manufacturing workpiece carrier with at least two workpieces for use in a system in accordance with the invention, in particular with a foil/film transfer unit in accordance with the invention. It is proposed that the at least two workpieces are arranged one above the other on the manufacturing workpiece carrier. In such an embodiment, the at least two workpieces are preferably arranged directly one above the other, wherein they are only separated from one another by one foil/film. Preferably, the workpieces arranged one above the other are of identical design at least in terms of the shape and circumferential size of the geometry of the workpieces. In other words, this means that in particular two equal-sized workpieces are arranged one above the other. In a sintering method, this allows two workpieces arranged one above the other to be manufactured in a sintering operation, wherein they are separated from one another by at least one foil/film and hence do not stick to one another. The manufacture of two separate workpieces is therefore possible in a way that saves on both space and time.

In a preferred embodiment, a foil/film may be arranged between the at least two workpieces. The foil/film is used in particular for separating the two workpieces during a sintering process. The foil/film may be designed as an individual foil/film. It is also possible to arrange more than one foil/film between the workpieces, wherein these may be designed as a protective foil/film and/or pressure-equalizing foil/film.

In a preferred embodiment, at least three workpieces may be arranged one above the other on the manufacturing workpiece carrier. In such an embodiment, three workpieces arranged one above the other may be sintered at the same time. To do this, n particular, at least one foil/film is arranged between each workpiece in order to separate the workpieces from one another.

In a preferred embodiment, a foil/film may be arranged under the bottom workpiece. This enables a selective detachment of the sintered workpieces from the manufacturing workpiece carrier.

In a preferred embodiment, a plurality of first workpieces are arranged adjacent to one another on the manufacturing workpiece carrier, and a plurality of second workpieces above the first workpieces on the manufacturing workpiece carrier. Preferably, a first workpiece and a second workpiece are arranged directly one above the other in each case, wherein the respective first workpiece matches in its geometry, in particular its circumferential shape, the respective second workpiece. During the sintering process and the pressure exerted as a result on each workpiece, a respective first workpiece and a respective second workpiece can brace each other. The sintering process for each manufacturing workpiece carrier can thereby be optimized.

The manufacturing workpiece carrier in accordance with the invention may be used at different positions inside a sintering system. The loading and unloading of the manufacturing workpiece carrier with at least two workpieces arranged one above the other may be manual or automatic. It is for example possible to use the multiple gripper for loading and unloading. It is also possible for a robot arm with an individual gripping element, in particular in combination with a suction element, to grip the workpieces singly.

The invention furthermore relates to a method for connecting electronic assemblies and/or for manufacturing workpieces, in particular for flow production.

It is proposed that prefabrication of electronic assemblies and/or workpieces be performed by a multiple gripper, by which at least two electronic assemblies and/or workpieces are placed simultaneously on a manufacturing workpiece carrier in the loading station. This takes place as preparation for processing, in particular joining, in a manufacturing station, in particular comprising a preheating module, a soldering or sintering module as the joining module, and/or a cooling module.

It is proposed that the manufacturing workpiece carrier is moved in automated manner from the loading station to at least the manufacturing station. In a further step, the manufacturing workpiece carrier is returned in automated manner to the loading station, in particular bypassing the manufacturing station. Bypassing the manufacturing station should in particular be understood not as spatial bypassing, but as functional bypassing. This should be understood as already explained with regard to the system. It is moreover conceivable for the manufacturing workpiece carrier to be guided not to the loading station, but rather to an unloading station, after passage through the manufacturing station.

Alternatively, the conveying workpiece carrier may be used as a manufacturing workpiece carrier, meaning that no transfer of the components between the various workpiece carrier types is required and return conveying of the manufacturing workpiece carrier can be dispensed with.

The same features and advantages apply to the method as explained with reference to the system in accordance with the invention. The method in accordance with the invention enables an automated, in particular fully automated, procedure for the connection of electronic assemblies and/or the manufacture of workpieces. Furthermore, it is possible to dispense with manual checking of individual method steps. In this way, a clean room, preferably an ISO 5 clean room, may be provided.

The method may be used for example to form soldered joints or sintered joints between electronic assemblies and/or workpieces. Such sintered joints can be an alternative to conventional soldered joints and be used in particular in power electronics. With regard to the sintered joints, reference should be made to the explanations relating to the system.

To provide flow production, the presented method may be performed continuously and repeatedly. In this way, a plurality of electronic assemblies and/or workpieces may be subjected to the method. In particular, a plurality of manufacturing workpiece carriers may be prefabricated or loaded in the loading station, at preferably identical time intervals.

As a rule, a conveying workpiece carrier may be used as the manufacturing workpiece carrier, wherein a separate conveying system for returning the manufacturing workpiece carrier to the start of the system may be dispensed with.

In a preferred embodiment of the method, the electronic assemblies and/or workpieces may be transferred by the multiple gripper in automated manner from a component-specific conveying workpiece carrier onto a system-specific manufacturing workpiece carrier during prefabrication in the loading station. To that end, the conveying workpiece carrier is preferably moved into the loading station, allowing transfer to take place inside the loading station under controllable conditions. The same conveying workpiece carrier can then be used to pick up the electronic assemblies and/or workpieces again after they have passed through the manufacturing station. Transfer of the electronic assemblies and/or workpieces from the manufacturing workpiece carrier onto the conveying workpiece carrier may be carried out in an unloading station. The manufacturing workpiece carrier may accommodate components from a plurality of conveying workpiece carriers.

In a preferred embodiment of the method, the electronic assemblies and/or workpieces can be unloaded by the multiple gripper in an unloading station from the manufacturing workpiece carrier onto the conveying workpiece carrier after passage of the electronic assemblies and/or workpieces through the manufacturing station, in particular prior to an automated return of the manufacturing workpiece carrier from the loading station to the unloading station. Preferably, manufacturing workpiece carriers may arrive in the unloading station in particular at identical time intervals, and are in each case unloaded. The electronic assemblies and/or the workpieces may be unloaded from a manufacturing workpiece carrier onto one conveying workpiece carrier or onto a plurality of conveying workpiece carriers.

In a further preferred embodiment, at least one automated attachment of at least one process cover, in particular placing of at least one mask and/or of at least one foil/film, onto the electronic assemblies and/or workpieces may take place during prefabrication. The process cover may be a mask or covering mask, which can be placed in automated manner onto the electronic assemblies and/or workpieces arranged on the manufacturing workpiece carrier. It can be attached using an automated device or an automation robot. The process cover may here preferably be moved or displaced to and fro between a parked position, in particular for intermediate storage of the process cover, and the position on the manufacturing workpiece carrier. Furthermore, the features stated in relation to the system also apply.

In a preferred embodiment of the method, a mask may be placed in automated manner as a first process cover onto the electronic assemblies and/or workpieces arranged on the manufacturing workpiece carrier in a first working position in the loading station. Furthermore, a thermally resistant foil/film may be placed in automated manner onto the mask as a second process cover, in particular for a sintering process, in a second working position in the loading station. It is also conceivable to dispense with the mask. Optionally, a further equalization foil/film may additionally be put in place. It is then possible, in particular at a third working position, to fix in place the foil/film with the mask and the manufacturing workpiece carrier in automated manner, preferably with a retaining frame, in particular a retaining ring. With regard to the advantages and further features, reference should be made to the explanations relating to the system.

In a preferred embodiment, the working positions may be arranged in reverse order in the unloading station and performed in reverse order. Since the same steps that were also performed in the loading station are in particular performed complementarily in the unloading station, the two modules may preferably be of identical design, but mirror images of one another. The loading station may also simultaneously serve as an unloading station if the manufacturing component carrier is returned together with the components to the entrance of the system after passage through the system.

In a preferred embodiment, return of the manufacturing workpiece carrier may take place in a plane arranged below, above or adjacent to a horizontal plane in which the manufacturing workpiece carrier during loading and/or unloading, and the manufacturing station, are arranged. Preferably, return is achieved using a lifting unit with an underfloor conveying means, wherein the manufacturing workpiece carrier is moved by the lifting unit vertically one level downwards or upwards and then conveyed in the direction of the unloading station by the underfloor conveying means.

In a preferred embodiment, the manufacturing workpiece carrier may be returned by a first conveying unit, and the conveying workpiece carrier may be arranged on a further conveying unit which is moved in particular in automated manner, wherein the first conveying unit and the further conveying unit are movable mutually independently, in particular bypassing the manufacturing station. Bypassing the manufacturing station is to be understood to mean bypassing as already explained with regard to the system. Furthermore, the same advantages apply as already explained with regard to the system.

In a preferred embodiment, the conveying workpiece carrier may accommodate one electronic assembly and/or one workpiece, and the manufacturing workpiece carrier may accommodate more than two, preferably more than five, in particular seven or more, specifically twenty-four or more, electronic assemblies and/or workpieces. Thus, the manufacturing workpiece carrier may pause at a position in the loading station during loading and/or unloading until the conveying unit has fully loaded the manufacturing workpiece carrier with electronic assemblies and/or workpieces.

In a joining process under a process atmosphere, e.g. vacuum sintering or vacuum soldering or diffusion soldering under a process atmosphere, a process time which leads to a time lag in flow production is required to build up and relieve the vacuum or process atmosphere that is needed. The time lag is caused by opening and closing of gas-tight airlocks, by build-up and relief of the process atmosphere in the process chamber(s) and by the heating and cooling operations. A high rate of throughput in the remainder of the flow production may furthermore be achieved by a large number of workpieces being collectable in one workpiece carrier, wherein a relatively time-consuming soldering or sintering method under a process atmosphere may also simultaneously connect a large number of workpieces parallel to this. It is moreover possible for the conveying workpiece carrier to accommodate more than one electronic assembly and/or more than one workpiece. A manufacturing cycle time may thus be increased, in particular in the case of flow production. The further conveying unit may have a higher conveying speed for conveying the conveying workpiece carrier than the first conveying unit of the manufacturing workpiece carrier, in particular if a manufacturing workpiece carrier accommodates assemblies from a plurality of conveying workpiece carriers.

In a preferred embodiment, a foil/film may be placed in the loading station onto the manufacturing workpiece carrier with the electronic assemblies and/or workpieces as a process cover, wherein the foil/film may either be a new foil/film or a foil/film already used in a previous operation of the method. This allows an already used foil/film to be used again to save on material. The foil/film may be returned from the unloading station to the loading station for re-use, in particular conveyed back to the loading station together with the manufacturing workpiece carrier and there used again. The foil/film may also be placed onto a foil/film stack directly after removal, wherein the complete foil/film stack may be returned to the loading station once it has accommodated a given number of foils/films. This can be done using a displacement unit, which preferably runs parallel to a movement path of the manufacturing workpiece carrier between the loading station, the manufacturing station and in particular the unloading station. Already used foils/films may preferably be cleaned by a cleaning unit prior to their next use.

It is also conceivable that it is not a single foil/film that is placed onto the manufacturing workpiece carrier, but one foil/film piece, i.e. a plurality of separate foil/film pieces, per workpiece or group of workpieces on the manufacturing workpiece carrier. The foil/film pieces may be placed one behind the other or simultaneously onto the plurality of workpieces and removed again in the unloading station.

In a preferred embodiment, the foil/film may be removed from the foil/film stack using a foil/film transfer means and placed onto the electronic assemblies and/or workpieces, wherein the foil/film stack is gradually moved upwards in the direction of the top of the foil/film stack, such that the respectively top foil/film is reachable with the foil/film transfer means. The features and advantages already explained with regard to the system and the foil/film transfer unit in accordance with the invention apply mutatis mutandis to the foil/film transfer means. Preferably, it is automatically checked in the course of removal that only one foil/film, or a predetermined number of foils/films, is being removed. This may for example be achieved optically by measuring the transparency of the removed foil/film or removed foil/film stack and comparing it with reference transparency values. Alternatively or additionally, the thickness of the removed foil/film or removed foil/film stack may be determined. In this way, it can be ensured that on the one hand the correct foil/film is removed and on the other hand just one or a required number of foils/films is removed. The thickness of any type of foil/film may be reliably and rapidly measured using a highly accurate digital sensing probe. This may be used irrespective of color and for transparent or opaque foils/films, and also in the case of corrugated or planar foils/films. For example, a measuring position may in this way be determined at the periphery, and a foil/film stack height may be determined before and after removal, or the thickness of the foil/film on a reference plane. A sensing probe for example can thus be used with 1 μm accuracy, such as a Keyence GT2 digital sensing probe. When using sensing probes, high accuracy or high repeatability may be assumed. If the object for measurement must under no circumstances be scratched, softer models or different spindle tips may be used. Long lifespans of over 20 million cycles in permanent use, and automatic calculation with a plurality of sensing probes, are possible.

In a preferred embodiment, the foil/film stack may be moved upwards by a travel distance of 5 mm to 15 mm, in particular 10 mm, after a given number of foils/films have been removed, wherein the foil/film stack is moved upwards in particular after 5 to 10 foils/films have been removed. The foil/film transfer means may thus selectively grip a respectively top foil/film of the foil/film stack, even if the foil/film stack has a different number of foils/films over a period of time.

In a preferred embodiment, automated cleaning of the foil/film by means of a cleaning unit may take place prior to the foil/film being placed onto the manufacturing workpiece carrier with the electronic assemblies and/or workpieces.

Preferably, each foil/film may be supplied to the cleaning unit before being placed onto the manufacturing workpiece carrier with the electronic assemblies and/or workpieces. The cleaning unit is to that end preferably located inside a closed space, in particular a clean room, in which the method is performed.

In a preferred embodiment, the foil/film may be electrostatically discharged in the cleaning unit, and then contaminants can be removed by being blown off using compressed air and/or negative pressure. The cleaning unit may for example perform contactless surface cleaning. This allows contamination of three-dimensional or patterned surfaces to be advantageously removed. For example, contamination may be removed by a pulsating and high turbulence air flow. In particular, positive and negative charges may be introduced into the foil/film using compressed air and/or negative pressure down to a vacuum, and/or ionized air, in particular in that order. This may advantageously further assist in preventing individual foils/films from adhering to one another.

In a preferred embodiment, at least two or a plurality of foil/film stacks may be arranged adjacent one another, wherein a second or a further foil/film stack is moved to a position of a first or preceding foil/film stack as soon as the first or preceding foil/film stack no longer contains any foils/films, so ensuring an uninterrupted procedure. The various foil/film stacks may also accommodate different foils/films for different workpieces, thus enabling flow production of different workpieces for each workpiece carrier. While foils/films are being removed from the first foil/film stack, the second foil/film stack may be replenished, or vice versa. One foil/film stack may for example contain foils/films which are sufficient for production or manufacture using the method over a 24 hour period. Other time periods or differently dimensioned foil/film stacks are also conceivable. It is also conceivable for a predetermined sequence of different foils/films to be contained in one foil/film stack synchronously with a planned processing sequence of, for example, different workpieces.

In a preferred embodiment of the method, the foil/film may be removed in the unloading station by a foil/film detachment unit in accordance with the invention. For the method with a foil/film detachment unit in accordance with the invention, the same features and advantages apply as were explained in relation to the embodiments of the foil/film detachment unit.

In a preferred embodiment of the method, a positionally correct alignment of the assemblies and/or of the workpieces at least in the manufacturing workpiece carrier may be optically detected and logged. To that end, an inspection means may be provided which, by using at least one inspection camera, can detect an exact position and alignment of a workpiece in the manufacturing workpiece carrier and correct it in combination with an automation robot. An automation robot, which performs insertion or positional correction of the workpieces in the manufacturing workpiece carrier, can be corrected using the inspection means. When transferring workpieces in particular from a conveying workpiece carrier to a manufacturing workpiece carrier, a rotational alignment and precise position may be checked and corrected. This is because precise alignment is essential when connecting workpieces, in particular by sintering or diffusion soldering, and can be ensured and logged by the optical inspection means. To this end, one or more optical reference marks may be provided on the manufacturing workpiece carrier for simplified detection by the inspection means.

The subject matter of the invention is furthermore a method for loading and unloading a workpiece carrier, in particular for loading a workpiece carrier in accordance with the invention with a stack of workpieces or levels of workpieces. It is proposed that the method comprises the following steps: Loading of the manufacturing workpiece carrier with at least one first workpiece or a first level of workpieces, subsequent placing of a foil/film and/or of a pressure pad or equalizing foil/film onto the first workpiece or first level of workpieces, subsequent further loading with at least one second workpiece or a second level of workpieces above the foil/film or pressure pad or equalizing foil/film and above the already arranged first workpiece, subsequent placing of a further foil/film and/or pressure pad or equalizing foil/film onto the second workpiece or second level of workpieces. The described steps may be repeated as often as required, such that a plurality of workpieces can be arranged one above the other. With this method, a plurality of workpieces arranged one above the other may be jointly sintered, thereby permitting both time and costs to be saved.

Advantageously, a foil/film may first be placed onto the workpiece carrier prior to loading. A separating foil may also be arranged both above and below each pressure pad or equalizing foil/film. A pressure pad or equalizing foil/film may also consist of silicone or a comparable thermally resistant and compressible material. When pressure and temperature is applied, parts of the pad may stick to the workpiece carrier and/or workpieces and contaminate them. To prevent this, a contact surface of the pressure pad with the workpiece carrier and/or workpiece can be protected by a foil/film.

In a further embodiment of the method, a centering device may be arranged in the loading station, wherein the centering device performs alignment and centering of the manufacturing workpiece carrier. This allows the manufacturing workpiece carrier to be exactly aligned to the workpieces/components.

In the unloading station, the steps for loading a multi-layer sintering stack of workpieces may be performed mutatis mutandis in the opposite direction for unloading. In this way, first a foil/film and/or a pressure pad or equalizing foil/film can be removed from an upper stack of workpieces from a manufacturing workpiece carrier, then the upper workpiece or the upper level of workpieces can be removed. After this a further foil/film and/or a further pressure pad or further equalizing foil/film can be removed and a further workpiece or further level of workpieces can be removed from the manufacturing workpiece carrier until the entire workpiece carrier has been emptied.

In a preferred embodiment of the method, the different steps can be performed at any two working positions inside the loading station of a system in accordance with the invention. The manufacturing workpiece carrier is in particular moved to and fro between the two working positions by the conveying unit. In particular, at the first working position loading of the manufacturing workpiece carrier with at least one workpiece takes place, and at the second working position the placing of the foil/film. When the method in accordance with the invention is performed, the manufacturing workpiece carrier may be moved back and forth between the two working positions in order to alternatingly place at least one workpiece and at least one foil/film.

In a preferred embodiment of the method, a plurality of first workpieces may be arranged adjacent to one another on the manufacturing workpiece carrier before a first foil/film and/or a pressure pad or equalizing foil/film is placed. In a following step, a plurality of second workpieces may be placed onto the first foil/film or a pressure pad or equalizing foil/film, wherein the second workpieces are arranged directly above the first workpieces such that the workpieces brace one another during the sintering process, i.e. while pressure is applied. On a so-called stacked arrangement, a plurality of layers of workpieces, preferably separated by a foil/film and/or pressure pad or equalizing foil/film, may be sintered onto a workpiece carrier one above the other, thereby reducing the time and costs enormously. A foil/film and/or a pressure pad or equalizing foil/film may be arranged between the layers of workpieces. The transfer and stacking of the layers of workpieces is expediently performed using a multiple gripper.

In a preferred embodiment of a loading method, an alignment of at least the first workpiece, in particular of several workpieces and preferably all gripped workpieces may be performed by the multiple gripper and/or an aligning unit prior to the foil/film being placed, such that the at least one workpiece/component is aligned in a horizontal plane transversely and/or longitudinally to an axis of the multiple gripper. Alignment by the multiple gripper may for example be performed with gripping elements, as described with relation to the device. Furthermore, the aligning unit may be designed as described with relation to the device.

In a further preferred embodiment of a loading method, an alignment of the manufacturing workpiece carrier or of a baseplate of the manufacturing workpiece carrier accommodated in a conveying frame may be performed by a centering device. It is thus possible, preferably before loading of the manufacturing workpiece carrier, to exactly align the latter or a baseplate accommodated in a conveying frame of the manufacturing workpiece carrier. This is used for positionally exact alignment of the manufacturing workpiece carrier or baseplate relative to a conveying unit or to a displacement unit of the conveying unit.

The two aforementioned loading methods serve for an exact and positionally correct alignment and positioning of workpieces or electronic assemblies on the manufacturing workpiece carrier. This is essential for further processing in a subsequent manufacturing station. It is thus possible to perform a pressing operation in a manufacturing station with a plurality of press plungers, e.g. a sintering or diffusion soldering method, wherein exact positioning and alignment of the assemblies or workpieces relative to the press plungers is crucial for the quality of the connection. An alignment of the workpieces on the manufacturing workpiece carrier and a further alignment of the manufacturing workpiece carrier or of a baseplate comprised therein relative to the conveying unit or to a displacement unit of the conveying unit ensures later alignment of the workpieces or electronic assemblies relative to the press plungers in the loading station.

Generally speaking, it can be said that the advantages in accordance with the invention can be achieved with all the different versions that are used in particular in sintering or soldering systems.

Firstly, it is possible by using at least one multiple gripper, in particular at least one quadruple gripper, to achieve a time-saving and cost-saving transfer of workpieces or electronic assemblies. The multiple gripper can be used in the loading station and/or in the unloading station. In particular, a multiple gripper is used at least in the loading station to transfer the workpieces or electronic assemblies from a conveying workpiece carrier onto a manufacturing workpiece carrier. The same or a further multiple gripper can be advantageously used in the unloading station for unloading.

Furthermore, it is possible with the foil/film transfer unit in accordance with the invention and/or with the foil/film detachment unit in accordance with the invention to improve the placement, removal and cleaning of the foil/film by time-saving placement and removal and by cost-saving re-use of the foil/film. A device and a method for cutting a foil/film off at least one roller may also be used to assist this.

Using the foil/film detachment unit and further methods in accordance with the invention for foil/film removal, foil/film removal may be achieved by peeling off, in particular by sintered foil/film removal, and sticking to substrate, such as workpieces and/or electronic assemblies, or catching with one another can be prevented.

Stacked loading in accordance with the invention of a plurality of workpieces and/or electronic components one above the other to form a process stack of workpieces or electronic assemblies also allows time and material to be saved.

These aforementioned embodiments may be used or implemented individually or jointly in the system in question in accordance with the invention. The respective features and advantages can therefore be implemented using the system in accordance with the invention. A joint inventive overall concept is therefore presented.

The described features and advantages also apply for the system in accordance with the invention, for the foil/film transfer unit in accordance with the invention and for the method in accordance with the invention. The features may in this case be combined together in different ways.

BRIEF DESCRIPTION OF THE DRAWINGS

Further advantages are revealed by the appended drawings and the descriptions of the drawing. The drawing shows examples of the invention. The drawing, description contain numerous features in combination. A person skilled in the art will expediently also consider the features individually and combine them into meaningful further combinations.

In the figures:

FIGS. 15*a, b* show an embodiment of a manufacturing workpiece carrier with optical reference marks in a plan view;

FIG. 16 shows a perspective view of a combination of a manufacturing workpiece carrier with workpieces, process cover and retaining frame;

DETAILED DESCRIPTION OF THE INVENTION

In the figures, identical or similar components are indicated with identical designations.

Figure 1:
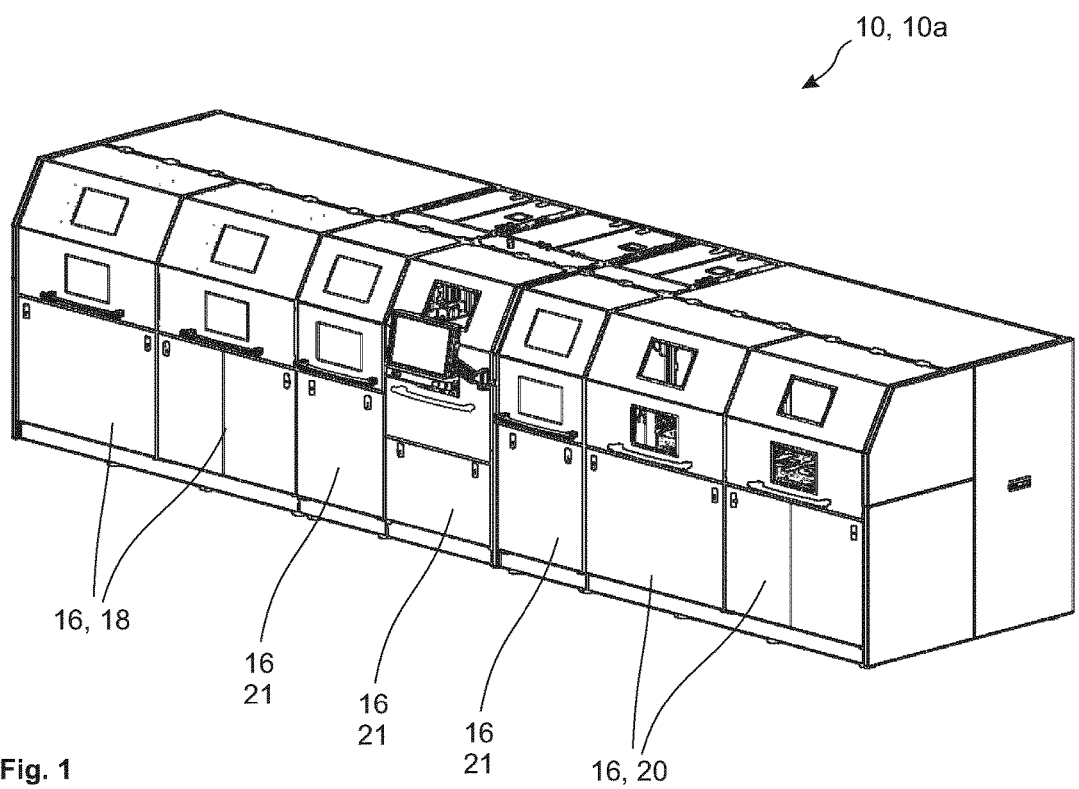
FIG. 1 shows an embodiment of a system in accordance with the invention for connecting electronic assemblies and/or for manufacturing workpieces with multiple modules.

FIG. 1 shows an embodiment of a system 10 in accordance with the invention for connecting electronic assemblies 12 and/or workpieces 14. The system 10 has multiple modules 16. Such a system 10 may for example form a sintering or soldering system 10a. In this context, sintering may, as already mentioned, be understood as both the manufacture or modification of materials under high pressure and temperature, and as the connection of a plurality of elements in a joining process. Using such a system 10, it is possible to produce for example thermally resistant sintered joints or soldered joints. In this embodiment, the system 10 shows five modules 16. The first module 16 is designed as a loading station 18. This is followed by a manufacturing station 21 with, for example, a preheating module, a sintering module and a cooling module. The module 16 at the righthand end of the system 10 is designed as an unloading station 20. To form a clean room, in particular an ISO 5 clean room, the system is preferably designed as a closed chamber and/or gas-tight. The modules 16 are therefore preferably connected to one another, but protected from external influences in a common housing.

Figure 2:
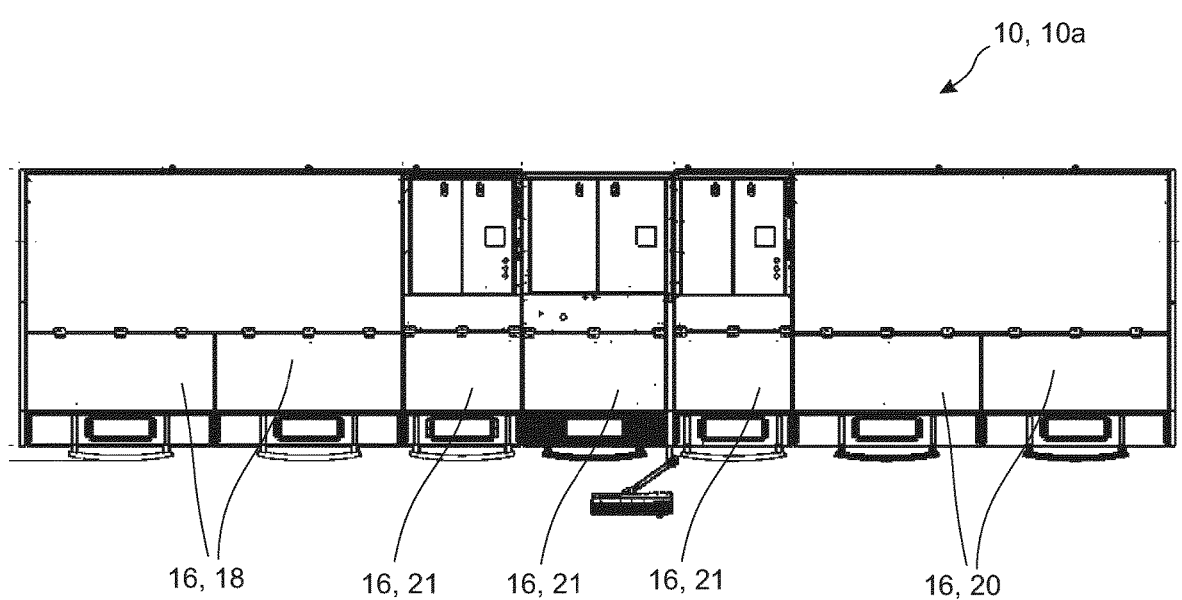
FIG. 2 shows the system from FIG. 1 in a plan view.

FIG. 2 shows the system 10 from FIG. 1 in a plan view. The individual chambers of the modules 16 are visible therein. The system 10 is overall of elongate design, such that a manufacturing workpiece carrier 22 with electronic assemblies 12 and/or workpieces 14 can pass in one direction through the system 10, in particular in a straight line or on a rectilinear path. The electronic assemblies 12 and/or workpieces 14 may for example be supplied to the system 10 from that side thereof which is on the left in the illustration. The electronic assemblies 12 and/or workpieces 14 can then be removed again from the system 10 on the side thereof which is on the right in the illustration.

Figure 3:
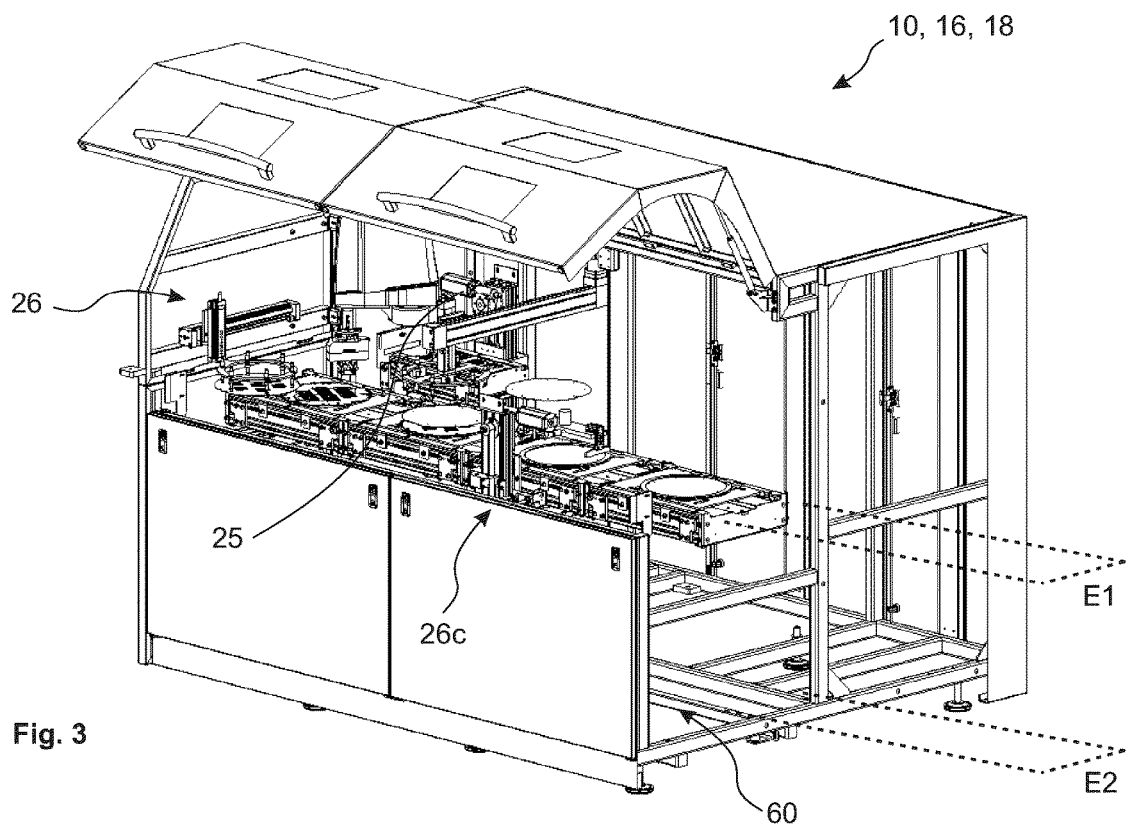
FIG. 3 shows an embodiment of a module of a system in accordance with the invention which is designed as a loading station.

FIG. 3 shows a module 16 of a system 10 in accordance with the invention which is designed as a loading station 18. The housing of the loading station 18 is shown open at the front. Individual working positions 26 of the loading station 18 can thus be discerned. These are arranged at an upper or middle level E1 inside the loading station 18. Below this level E1, an underfloor conveying unit 60 of a conveying unit 24 which is arranged at a level E2 is visible. This enables the manufacturing workpiece carriers 22 to be returned. This means that the manufacturing workpiece carriers 22 pass through the working positions 26 in the opposite direction to a conveying direction of the conveying unit 24. In this illustration, a lifting unit 25 of the conveying unit 24 is shown on level E1. It is connected to the underfloor conveying unit 60. The lifting unit 25 can be used to convey the manufacturing workpiece carriers 22 from the lower level E2, on which the underfloor conveying unit 60 is arranged, to the upper level E1, on which the working positions 26 are arranged. The lifting unit 25 may convey the manufacturing workpiece carriers 22 by traveling from level E1 to level E2 or vice versa. In this embodiment, the lifting unit 25 is arranged at the working position 26c. Consequently, the manufacturing workpiece carriers 22 can be guided to this working position 26c. In an embodiment diverging therefrom, the manufacturing workpiece carrier 22 may be returned to any desired working position 26a-26d by the lifting unit 25. A closed conveying circuit of the manufacturing workpiece carrier 22 through the manufacturing station 21 is thus provided.

Figure 4:
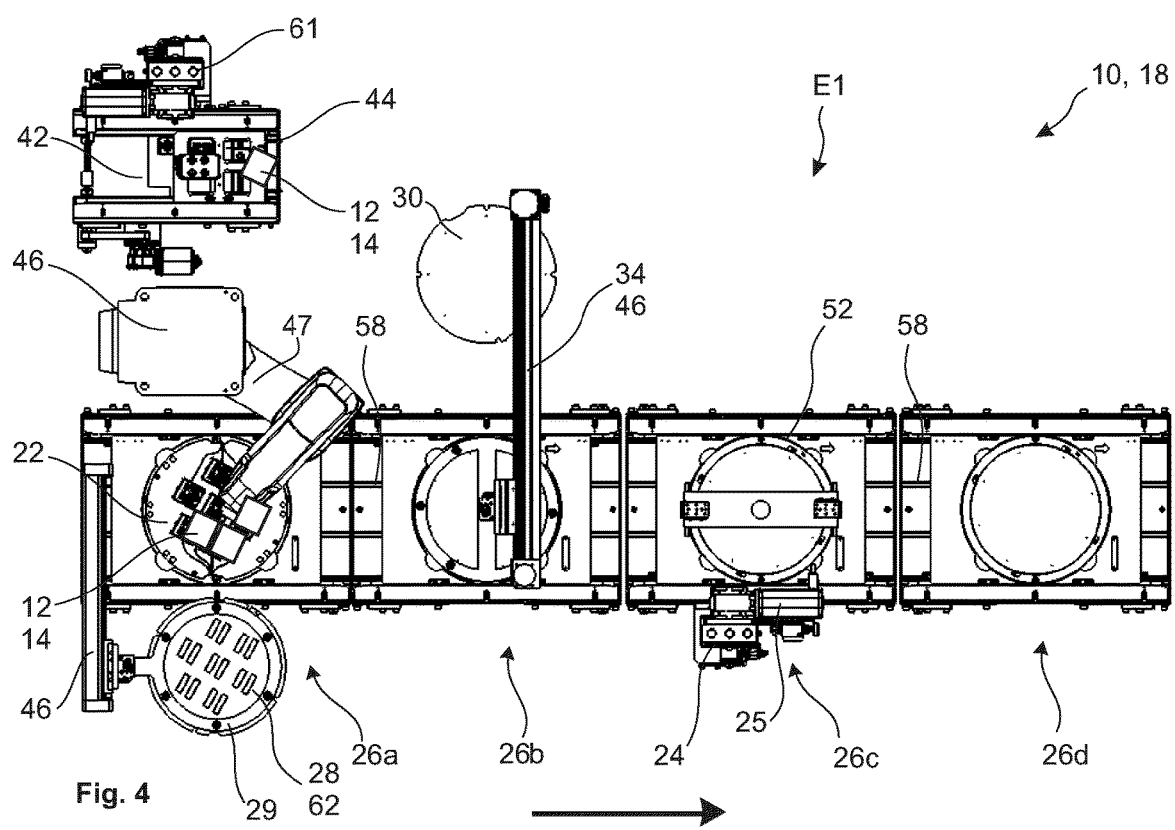
FIG. 4 shows the module from FIG. 3 in a plan view, showing different working positions and an embodiment of a further conveying unit.

FIG. 4 shows a plan view of the loading station 18 from FIG. 3 showing different working positions 26 and with an embodiment of a second conveying unit 42. The upper level E1 is shown in plan view. It can be seen from FIGS. 3 and 4 that the working positions 26a-26d are arranged at this upper level E1.

In working position 26a, the electronic assemblies 12 and/or workpieces 14 are placed by a conveying workpiece carrier 44 onto a manufacturing workpiece carrier 22. This may also be referred to as prefabrication in relation to the method 100. The electronic assemblies 12 and/or workpieces 14 may be transferred from the conveying workpiece carrier 44, which is located on a second conveying unit 42, onto the manufacturing workpiece carrier 22 using an automation robot 46, in particular a robot arm 47. The second conveying unit 42 may be located inside the system 10, but move independently of the working positions 26 and in particular independently of the loading station 18. In this way, the second conveying unit 42 may move in automated manner for example from the loading station 18 to an unloading station 20 (not shown in this illustration), in order to pick up there the electronic assemblies 12 and/or workpieces 14 again. The second conveying unit 42 may pick up one or more electronic assemblies 12 and/or workpieces 14. The second conveying unit 42 comprises a lifting unit 61 by which an emptied conveying workpiece carrier 44 may be lowered from a first conveying level E1 to a second conveying level E2. Here the empty conveying workpiece carriers 44 may be moved through the system 10 as far as the unloading station 20, bypassing atmospherically tight system modules 16, in order to there pick up workpieces 14 from the manufacturing workpiece carriers 22 again. To this end, the unloading station 20 may have a further lifting unit 61 for raising the conveying workpiece carriers from level E2 to level E1.

Furthermore, in the working position 26a, a process cover 62, in particular a mask 28, is set in place. The process cover 62 may have openings, such that sintered joints or soldered joints may be produced at selected positions of said openings. The process cover 62 may initially be located in a parked position 29. From this parked position 29 arranged next to the working position 26a, the process cover 62 may be moved in automated manner onto the manufacturing workpiece carrier 22 with the electronic assemblies 12 and/or workpieces 14. This may be achieved for example by a type of rail and by a gripper or frame which are controlled in automated manner. The process cover 62 may also be placed by an automation robot 46. In this case, the automation robot 46 may be same one used to place the electronic assemblies 12 and/or workpieces 14. Furthermore, a second and independent automation robot 47 (not shown) may be used. Once these steps have been carried out, the manufacturing workpiece carrier 22, with the electronic assemblies 12 and/or workpieces 14 and with the process cover 62, is moved in automated manner to the next working position 26b. This may be done by a displacement unit, for example a type of conveyor belt.

In this embodiment, a foil/film 30 is placed in the working position 26b onto the already partly prefabricated manufacturing workpiece carrier 22. The foil/film 30 can also be located in a type of parked position next to the working position 26b before being moved to the working position 26b. This may also be done by a rail with a gripper or by another type of attachment device. Then the further prefabricated manufacturing workpiece carrier 22 with the foil/film 30 is moved in automated manner to the next working position 26c.

In the working position 26c, the foil/film 30 is fixed in place on the manufacturing workpiece carrier 22 by a retaining ring 52. This is also done in automated manner, for example by a computer-controlled actuator device or by a further automation robot 46. The lifting unit 25 of the conveying unit 24 can also be seen in the working position 26c. The lifting unit 25 may return the manufacturing workpiece carrier 22 with attached foil/film and the process cover 62 from a further module 16, for example the unloading station to the loading station 18 at working position 26c. It is also conceivable for the manufacturing workpiece carrier 22 to be returned by the conveying unit 24 to another working position 26 (not shown here).

Working position 26d serves as a buffer position, where a further step could take place which is needed before the prefabricated manufacturing workpiece carrier 22 is moved in automated manner into a further module 16, in particular the manufacturing station 21.

The manufacturing workpiece carrier 22 can be moved to a level E2 below the level shown in FIG. 4 and returned to at least one of the working positions 26a-26d by the lifting unit 25 and an underfloor conveying unit 60 (not visible in this plan view).

Figure 5:
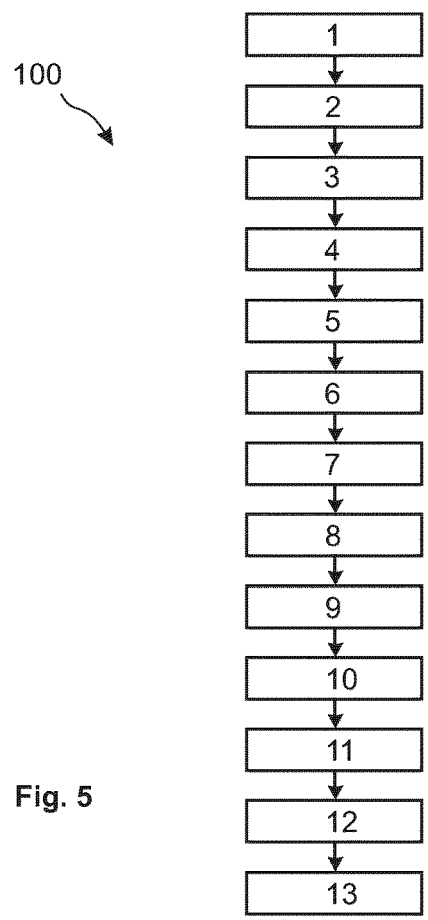
FIG. 5 shows a flow chart of possible different working steps in the loading station from FIG. 4.

FIG. 5 shows an embodiment of a possible sequence of the various working steps 1 to 13 of a method 100 in the loading station 18 from FIG. 4. In step 1, the manufacturing workpiece carrier 22 is initially fetched by a lifting unit 25 from the underfloor conveying unit 60 of the unloading station 20. A process cover 62 and a retaining ring 52 can be arranged on the manufacturing workpiece carrier 22 during return. The manufacturing workpiece carrier 22 may therefore first be guided to the working position 26c in step 1. Performance of all the working steps in step 1 may take 19 seconds, for example. In step 2, the retaining ring 52 can finally be removed at the working position 26c. This may take 4 seconds, for example. In step 3, the manufacturing workpiece carrier 22 can be conveyed from the working position 26c to the working position 26a, taking 15 seconds, for example. In step 4, the process cover 62 can finally be gripped in automated manner and set down to the side in a parked position 29. This may take 4 seconds, for example. In step 5, the electronic assemblies 12 and/or workpieces 14 may be placed into the manufacturing workpiece carrier 22 using an automation robot 46. In this case, seven electronic assemblies 12 and/or workpieces 14 may be moved every five seconds. Performance of the working steps falling under step 5 may therefore take 35 seconds, for example. In step 6, the second conveying unit 42 may move in automated manner to an unloading station 20. This may also be done for example under the floor, in particular taking 100 seconds, for example. In step 7, the process cover 62 can be placed back onto the manufacturing workpiece carrier 22, taking 4 seconds, for example. In step 8, the manufacturing workpiece carrier 22 can be moved from the working position 26a to the working position 26b, taking 7 seconds, for example. In step 9, a foil/film 30, in particular a thermally resistant foil/film, may be placed onto the manufacturing workpiece carrier 22, taking 4 seconds, for example. In step 10, the manufacturing workpiece carrier 22 can be moved from the working position 26b to the working position 26c, in particular taking 7 seconds, for example. In step 11, the retaining ring 52 can be placed back onto the manufacturing workpiece carrier 22, in particular taking 4 seconds, for example. In step 12, the manufacturing workpiece carrier 22 can be moved from the working position 26c to the working position 26d, in particular taking 7 seconds, for example. The working position 26d may constitute a buffer position. In step 13, the manufacturing workpiece carrier 22 can finally be conveyed from the working position 26d into a further module 16, for example a preheating module of the manufacturing station 21. This may be carried out within a timeframe of 10 seconds, for example. The total time for performing steps 1-13 may therefore amount to 80-120 seconds, for example, in particular 100-110 seconds. It goes without saying that performance may also take a different amount of time, wherein the time may be a little longer or a little shorter. Preferably, the time for performing steps 6 and 13 is not added to the total, since these steps can take place in parallel with the performance of steps 1-5 and 7-12.

Figure 6:
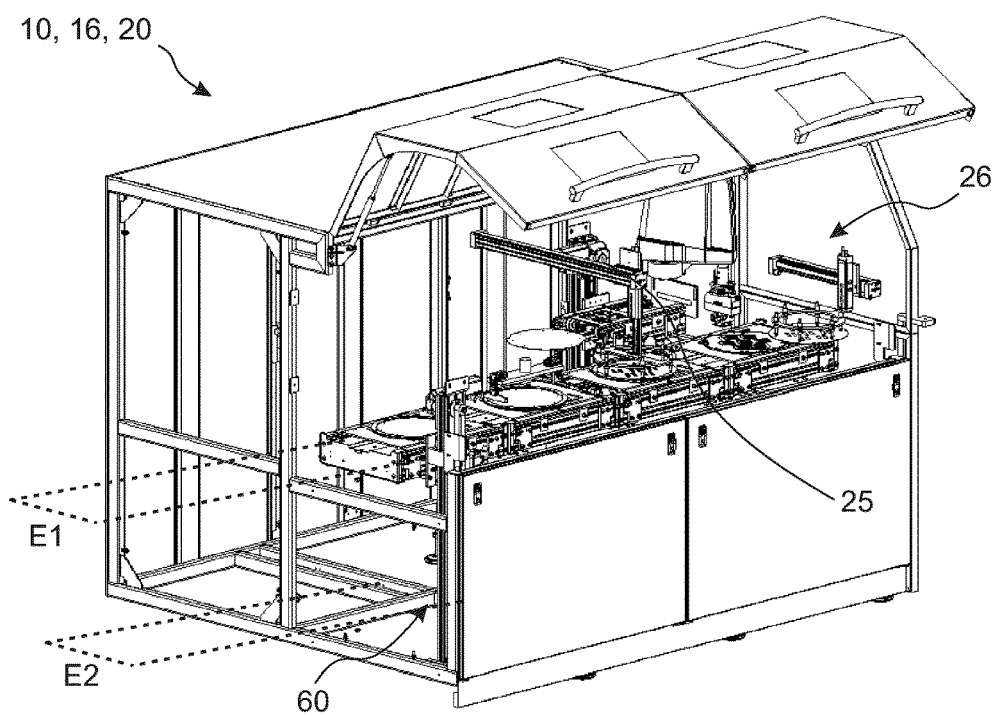
FIG. 6 shows an embodiment of a module of a system in accordance with the invention which is designed as an unloading station.

FIG. 6 shows a module 16 of a system 10 in accordance with the invention which is designed as an unloading station 20. The working positions 26 of the unloading station 20 are arranged in reverse order to the working positions 26a-26d of the loading station 18 in FIG. 3. The upper level E1 in which the working positions 26a-26d are arranged is also shown, as well as the lower level E2 which is used to return the manufacturing workpiece carrier 22, in particular using an underfloor conveying unit 60. The unloading station 20 may operate in a functionally complementary manner to loading station 18.

Figure 7:
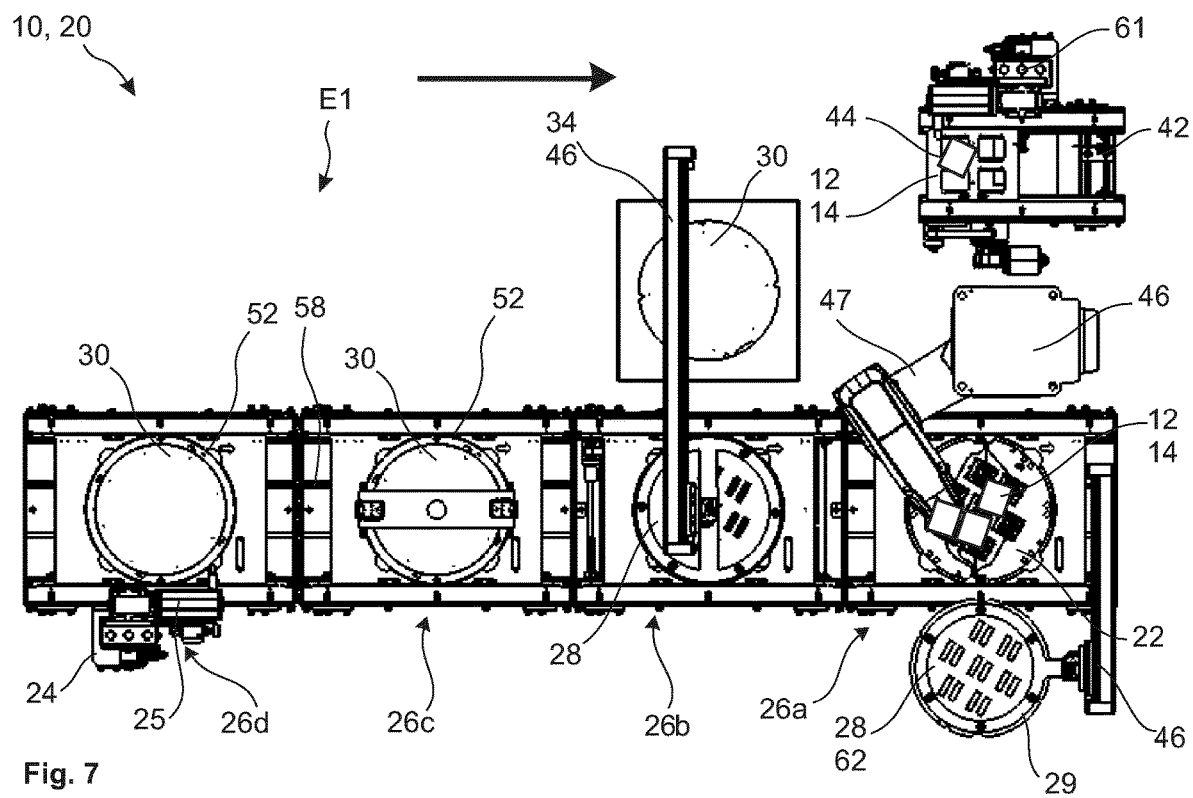
FIG. 7 shows the module from FIG. 6 in a plan view, showing different working positions and an embodiment of a conveying and lifting unit.

FIG. 7 shows a plan view of the module 16 from FIG. 6 showing different working positions 26 at the upper level E1, and an embodiment of a second conveying unit 42. The working positions 26a-26d are in a mirror-image, i.e. functionally complementary arrangement to the working positions 26a-26d in the loading station 18. Consequently, the working steps that were performed in succession in the loading station 18 can be carried out in the opposite order in the unloading station 20. A further lifting unit 61 lifts empty conveying workpiece carriers, which have been conveyed from the loading station 18 to the unloading station 20, from level E2 to level E1, where processed workpieces 14 are transferred from a manufacturing workpiece carrier 22 by means of the automation robot 62.

Figure 8:
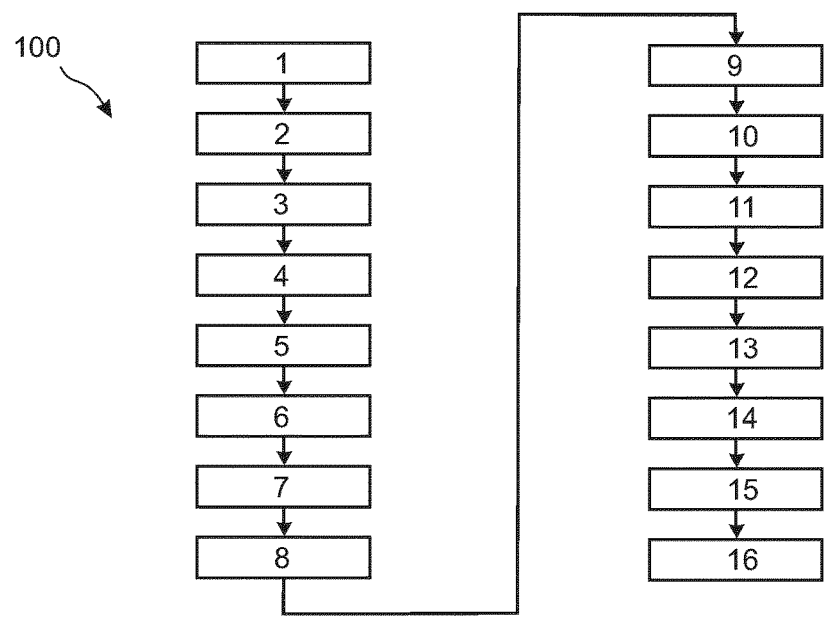
FIG. 8 shows a flow chart of possible different working steps in the unloading station from FIG. 7.

FIG. 8 shows a possible sequence of different working steps of an embodiment of a method 100 in accordance with the invention, carried out in the unloading station 20 from FIG. 7 with steps 1 to 16. In step 1, the manufacturing workpiece carrier 22 is moved from the manufacturing station 21, in particular a module 16 designed as a cooling module, into the unloading station 20. This may take place in automated manner and take 10 seconds, for example. The manufacturing workpiece carrier 22 is then located at the working position 26d, which may be designed as a buffer station. In step 2, the manufacturing workpiece carrier 22 can be conveyed from the working position 26d to the working position 26c, taking 7 seconds, for example. In step 3, the retaining ring 52 can be removed in automated manner. The retaining ring 52 can be lifted, for example, which in particular requires 4 seconds. In step 4, the manufacturing workpiece carrier 22 can be moved from the working position 26c to the working position 26b, taking 7 seconds, for example. In step 5, the process cover 62 on the manufacturing workpiece carrier 22 can be gripped, for example by a retaining unit, which in particular takes 3 seconds. Subsequently or in parallel, in step 6 the foil/film 30, in particular the PDFE film, can be gripped and drawn off, which in particular takes 4 seconds. This can be brought about for example by a foil/film transfer means 34. In step 7, the process cover 62 can finally be released, this in particular requiring 3 seconds. In step 8, the manufacturing workpiece carrier 22 can be conveyed from the working position 26b to the working position 26a, in particular in automated manner and taking 7 seconds, for example. In step 9, the process cover 62 can finally be gripped and set down at the side in a parked position 29, which in particular takes 4 seconds. In step 10, the electronic assemblies 12 and/or workpieces 14 can be transferred from the manufacturing workpiece carrier 22 onto a conveying workpiece carrier 44 using an automation robot 46. In this case, seven electronic assemblies 12 and/or workpieces 14 can be moved every five seconds, for example, in particular over a period of 35 seconds. In step 11, the process cover 62 can finally be placed back onto the manufacturing workpiece carrier 22. This can also be done in the working position 26a and take 4 seconds, for example. In step 12, the manufacturing workpiece carrier 22 can be conveyed from the working position 26a to the working position 26c. This can preferably take place in automated manner and take 14 seconds, for example. In this working position 26c, the retaining ring 52 can be placed back onto the manufacturing workpiece carrier 22 in step 13, which in particular takes 4 seconds. Then the manufacturing workpiece carrier 22 can be conveyed from the working position 26c to the working position 26d in step 14, which in particular takes 7 seconds. Subsequently, the manufacturing workpiece carrier 22 can be placed onto the conveying unit 24 in step 15, in particular placed by the lifting unit 25 onto the underfloor conveying unit 60. This can take 19 seconds, for example. In step 16, the manufacturing workpiece carrier 22 can finally be returned to the loading station 18 by the underfloor conveying unit 60. The manufacturing workpiece carrier 22 can be returned to the working position 26c of the loading station 18, at which the retaining ring 52 can firstly be removed. The subsequent method 100, in particular having steps 1-13, has already been explained on the basis of FIG. 5.

Figure 9:
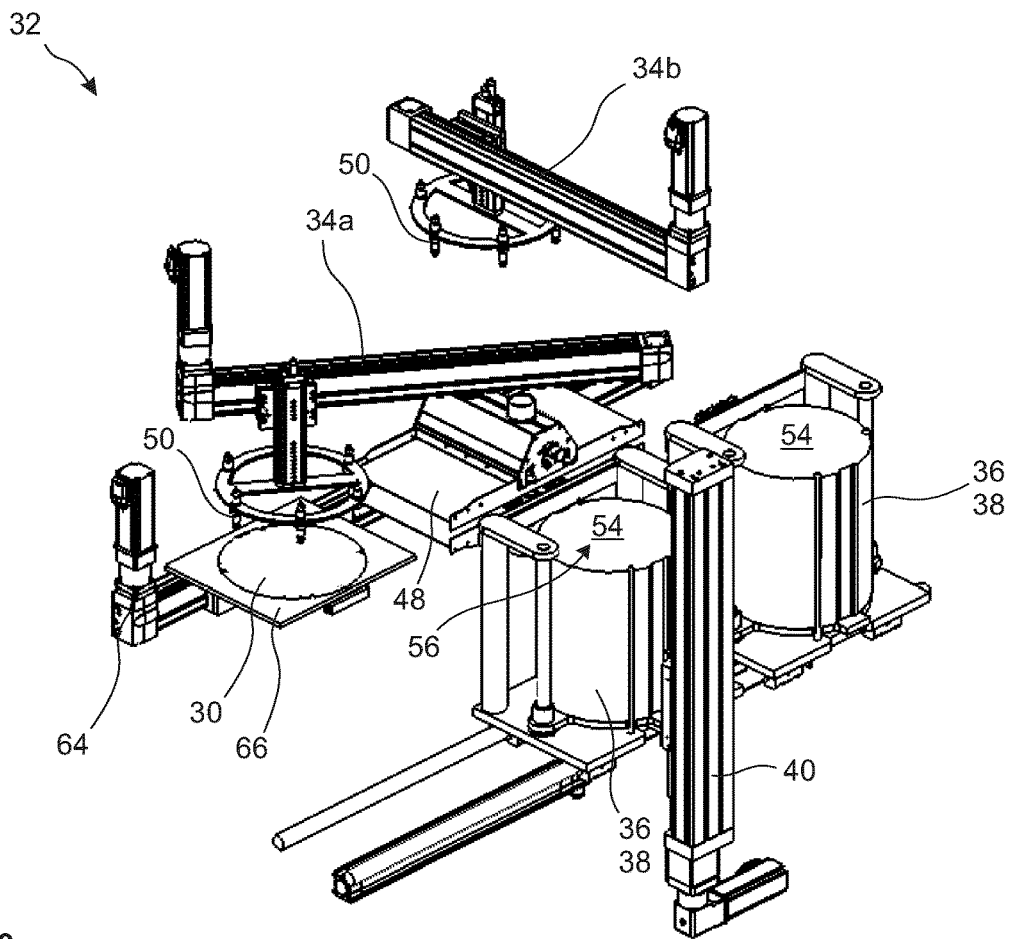
FIG. 9 shows an embodiment of a foil/film transfer unit in accordance with the invention with two foil/film transfer means and showing two foil/film stacks.

FIG. 9 shows an embodiment of a foil/film transfer unit 32 in accordance with the invention with two foil/film transfer means 34, and also two foil/film stacks 36. Using a foil/film transfer means 34, the top foil/film 30 can in each case be removed from a top 54 of a foil/film stack 36. The top 54 serves as a removal surface 56. The foil/film stacks 36 are in each case designed as a foil/film magazine 38.

If the first foil/film magazine 38 (on the left in the illustration) is empty, a second foil/film magazine 38 can be moved to the position of the first foil/film magazine 38. The second foil/film magazine 38 can accommodate the same foils/films, but also other types of these. In this way, a continuous procedure can be ensured. While foils/films 30 are being removed from the second foil/film magazine 38, the first foil/film magazine 38 can be replenished. The foil/film transfer unit 32, in particular with the foil/film transfer means 34 and the foil/film magazines 38, can for example be retrofitted to any existing system. Also, the setting down and/or removal of the foils/films 30 in the working position 26b of the loading station 18 and/or the unloading station 20 of the system 10 in accordance with the invention can be performed by such a foil/film transfer unit 32.

FIG. 9 also shows a cleaning unit 48. One foil/film 30 is initially removed from the first foil/film magazine 38 by the first film transfer means 34a and placed onto the cleaning unit 48. Once the foil/film 30 has been cleaned, the foil/film 30 is removed from the cleaning unit 48 by the second foil/film transfer means 34b and placed onto a manufacturing workpiece carrier 22. The cleaning unit 48 can be a linear cleaning unit 64, or it can be a contactlessly operating surface cleaning system. In the case of a system 10 in accordance with the invention or of a method 100 in accordance with the invention, a foil/film 30 can be supplied by a cleaning unit 48 in particular to the working position 26c of the loading station 18 from FIGS. 3 and 4.

The foil/film stack 36 can be pushed vertically upwards by a foil/film lifting unit 40. In this way, the top foil/film 30 of the foil/film stack 36 can be located at substantially the same position in every situation. This ensues that the foil/film transfer means 34a can reliably remove the top foil/film 30 of the foil/film stack 36 irrespective of the number of foils/films 30 contained in the foil/film stack 36. Furthermore, the foil/film transfer means 34 can comprise a height-equalizing system 50 by which differences in the position of the top foil/film 30 in the foil/film stack 36 can be equalized. The foil/film transfer means 34 can be designed for example with a gripper, wherein the foil/film 30 can be picked up pneumatically and/or by vacuum, in particular using a vacuum nozzle. In this way, the foil/film 30 can be particularly advantageously placed and cleaned in an automated, in particular fully automated, manner. Manual intervention for placing or removing the foil/film 30 is not necessary, allowing a clean room, in particular an ISO 5 clean room, to be particularly advantageously provided.

Figure 10:
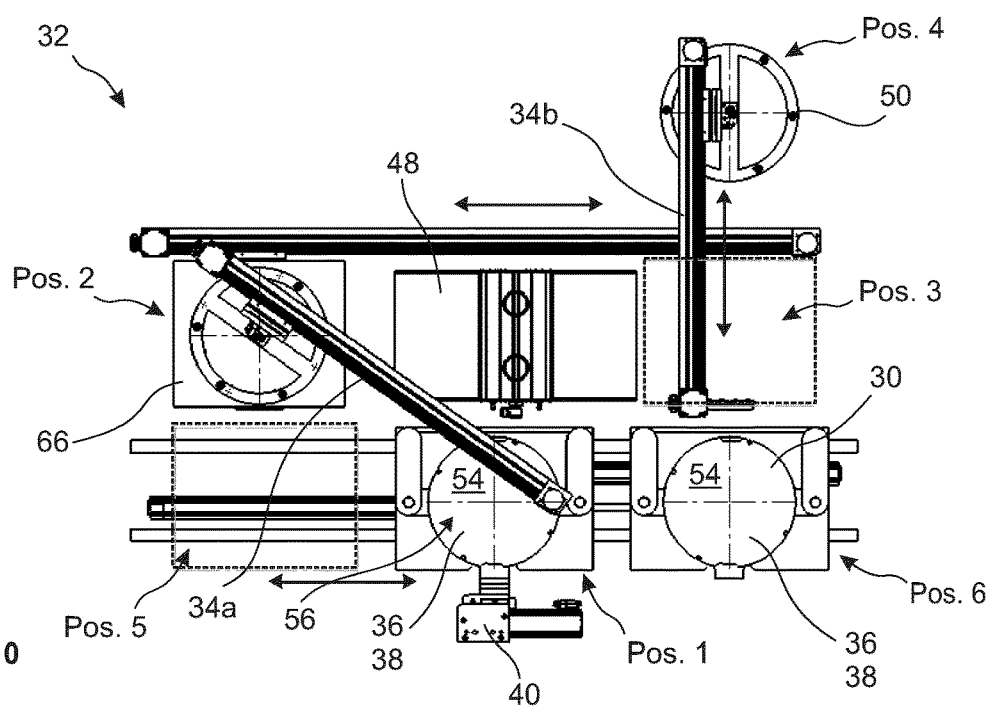
FIG. 10 shows the foil/film transfer unit from FIG. 9 in a plan view.

FIG. 10 shows a plan view of the foil/film transfer unit 32 from FIG. 9. The same components are labelled with the same reference numerals, and therefore do not need to be dealt with in more detail. This view advantageously shows that the two foil/film stacks 36 are located next to the cleaning unit 48. In the upper part of the illustration, i.e. next to the cleaning unit 48, a foil/film 30 may be placed onto a manufacturing workpiece carrier 22 with electronic assemblies 12 and/or workpieces 14 (not shown in this illustration) using the foil/film transfer means 34b. A manufacturing workpiece carrier 22 could consequently be located next to the cleaning unit 48 in the upper part of the figure, if the latter is arranged in a loading station 18. To ensure that just one foil/film has been removed and that it was the correct foil/film, a check can be performed at position 3 using a mechanical thickness measuring system, for example a high-precision sensing probe, to determine the thickness of the removed foil/film. It is possible to determine here, irrespective of the type of foil/film, whether no, one or more foils/films have been removed. The foil/film probe can in this case determine the film thickness at a peripheral region in order to leave the process-relevant regions untouched, for example for sintering.

Figure 11:
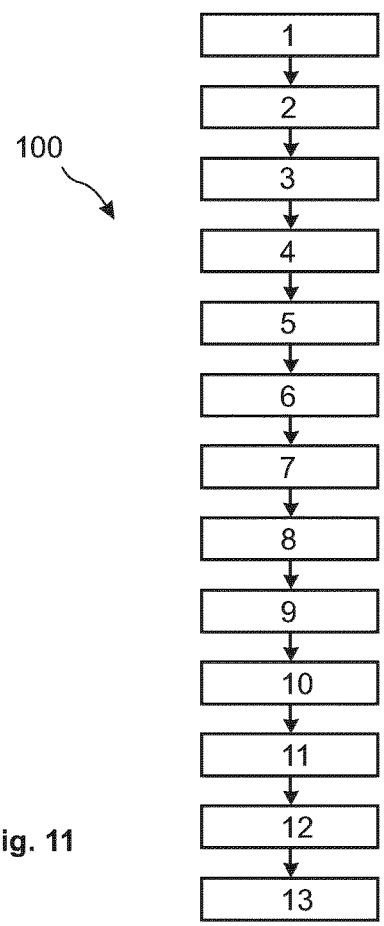
FIG. 11 shows a flow chart of possible different working steps in the foil/film transfer unit from FIG. 10.

FIG. 11 shows a possible sequence of different working steps 1 to 13 for the foil/film transfer unit 32 from FIG. 10. In step 1, individual foils/films 30 may be removed from a foil/film stack 36 at position 1 and placed onto a foil/film carrier 66 at position 2. In step 2, the foil/film carrier 66 may travel with a foil/film 30 from position 2 through the cleaning unit 48 to position 3. In step 3, the foil/film 30 can finally be placed onto a manufacturing workpiece carrier 22 (not shown) located at position 4. In step 4, the foil/film carrier 66, now without a foil/film 30, can be moved from position 3 back to position 2 again. In a fifth step, steps 1-4 can be repeated. In step 6 the foil/film stack 36 located at position 1 can be lifted. This can be done using a foil/film lifting unit 40. After usage of 10 foils/films 30, for example, or once the position of the top foil/film 30 has dropped by for example 10 mm, the foil/film lifting unit 40 can for example move the complete foil/film stack 36 upwards by a corresponding 10 mm. A further difference in height can be equalized directly at the foil/film transfer means 34 by a height-equalizing system 50, for example by a vacuum nozzle holder. In step 7, the foil/film stack 36 located at position 6 can be replenished or filled. The foil/film stack 36 is preferably designed as a foil/film magazine 38. Replenishing can take place in particular during ongoing operation of the foil/film transfer unit 32 or of the system 10. In step 8, the empty foil/film magazine 38 located at position 1 can be moved to position 5. In step 9, the now replenished foil/film magazine 38 located at position 6 can be moved to position 1. In step 10, the other foil/film magazine 38 now located at position 5 can finally be replenished during ongoing operation. In step 11, a foil/film magazine 38, once again empty and located at position 1, can be moved to position 6. In step 12, the now replenished foil/film magazine 38 can be moved from position 5 to position 1. In step 13, steps 5-12 can be repeated. Steps 1-13 as shown can be part of the method 100 in accordance with the invention.

Figure 12:
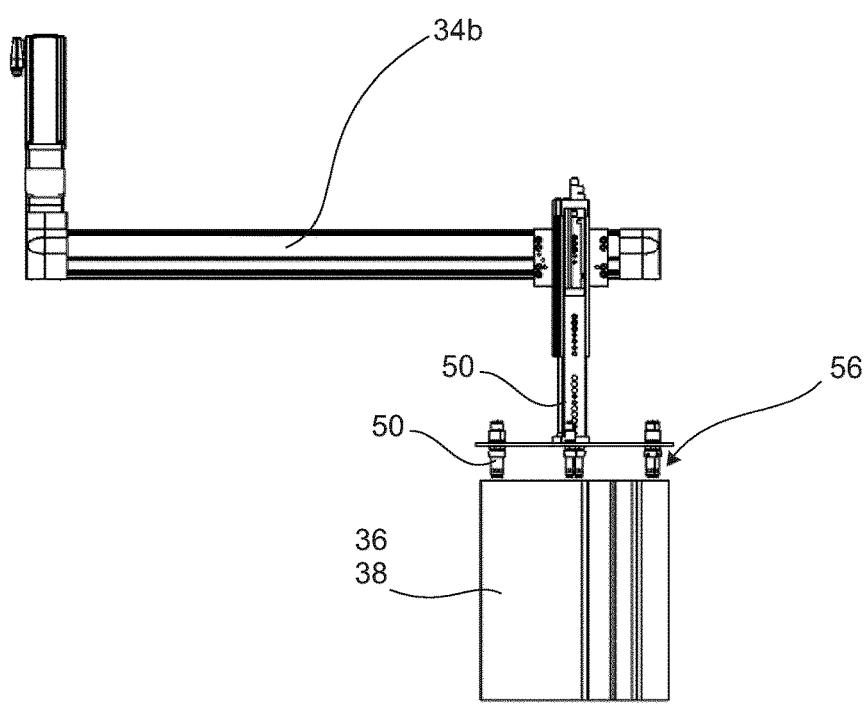
FIG. 12 shows an embodiment of a height-equalizing system of a foil/film stack and of a foil/film transfer means.

FIG. 12 illustrates the height-equalizing system 50 of the foil/film stack 36 and of the foil/film transfer means 34. In this case it is possible to ensure, using the tolerance range of the foil/film transfer means 34 and the travel distance of the foil/film stack 36, that in each case only the top foil/film 30 on the removal surface 56 of the foil/film stack 36 is picked up by the foil/film transfer means 34. In this illustration, the height-equalizing system 50 is visible in the form of vacuum nozzle holders. The vacuum nozzle holders can for example equalize a spring compensation of 10-30 mm, in particular 20 mm.

It goes without saying that the illustrated embodiments of the system 10, of the foil/film transfer unit 32 and of the method 100 can be combined with one another such that different embodiments of the foil/film transfer unit 32 can for example be combined with different embodiments of the system 10 or of the method 100.

Figure 13:
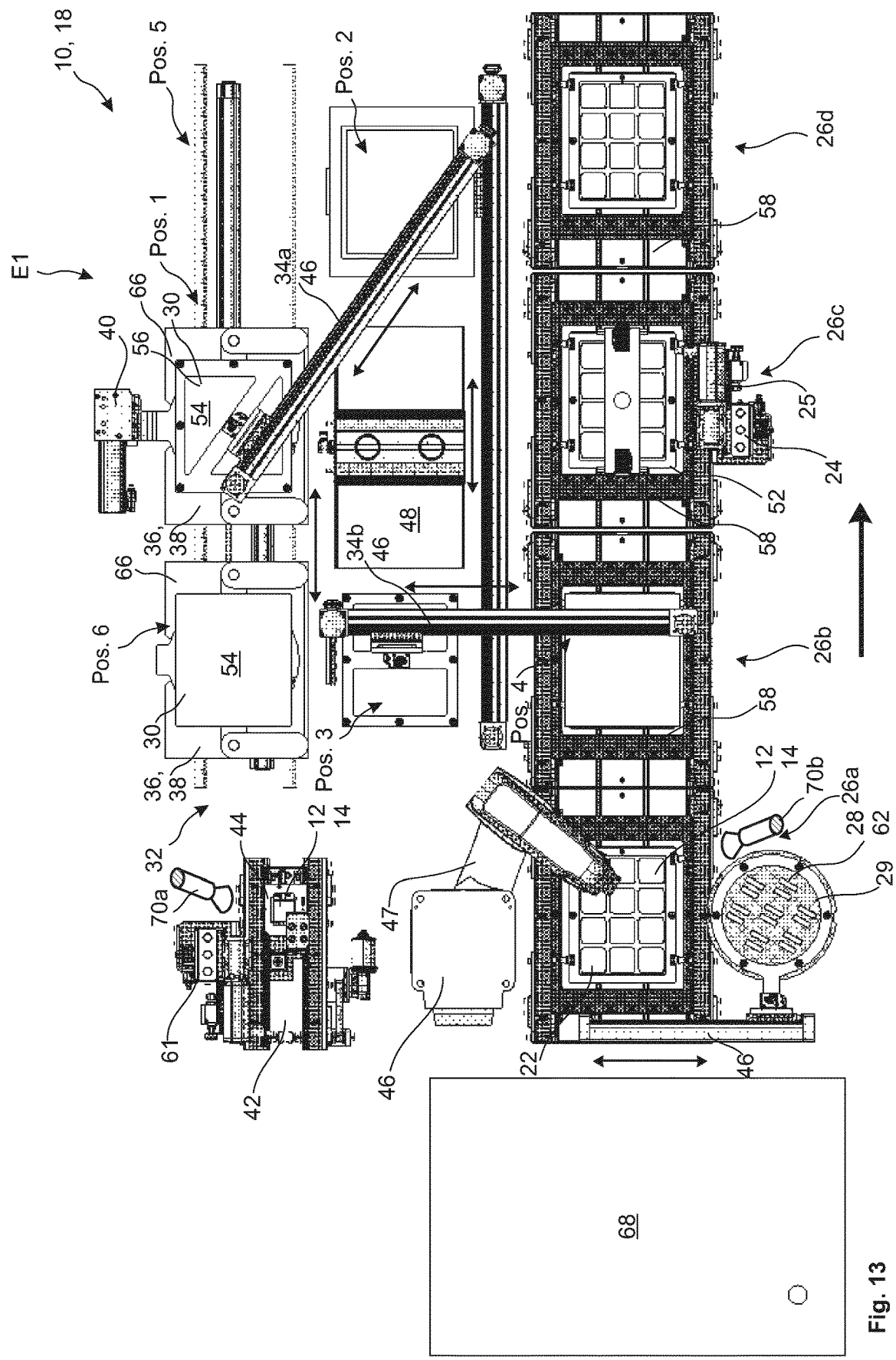
FIG. 13 shows a further embodiment of a loading station with a foil/film transfer unit and an optical inspection unit in a plan view.

FIG. 13 shows a further embodiment of the loading station 18 illustrated in FIG. 4, in which a foil/film transfer unit 32 as illustrated in FIG. 10 is integrated. To avoid repetition, reference is made to the description of FIG. 4 and of FIG. 10 in relation to the identical reference numerals.

In the loading station in FIG. 13, rectangular manufacturing workpiece carriers 22 with a capacity of twelve workpieces 14 are used, onto which a covering mask 28 can be placed in the working position 26a and a covering foil/film 30 at the working position 26b.

At the inlet to the loading station 18, a stack magazine 68 of manufacturing workpiece carriers 22 is arranged, from which empty manufacturing workpiece carriers 22 can be taken at least when initially charging the system 10, or stored at the end of manufacture. An automation robot 46 transfers workpieces 14 from a conveying workpiece carrier 44 onto a manufacturing workpiece carrier 22 by means of a gripper arm 47, such that workpieces from twelve conveying workpiece carriers 44 can be brought together in one manufacturing workpiece carrier 22. In this respect, the system can operate in a cycle which is slower by a factor of twelve than a conventional production line.

An inspection camera 70a which detects a rotational position and X/Y positioning of the workpiece 14 on the conveying workpiece carrier 44 is arranged above the lifting unit 61. By means of this information, the rotary arm 47 of the automation robot 46 can pick up the workpiece 14 and set it down on the manufacturing workpiece carrier 22 in an exact rotational position and X/Y alignment. To this end, a further inspection camera 26b is aligned above the working position 26a on the manufacturing workpiece carrier 22 located there, which camera controls the precise setting-down position for the automation robot 46 and ensures correct alignment of the workpieces 14 on the manufacturing workpiece carrier 22.

Figure 14:
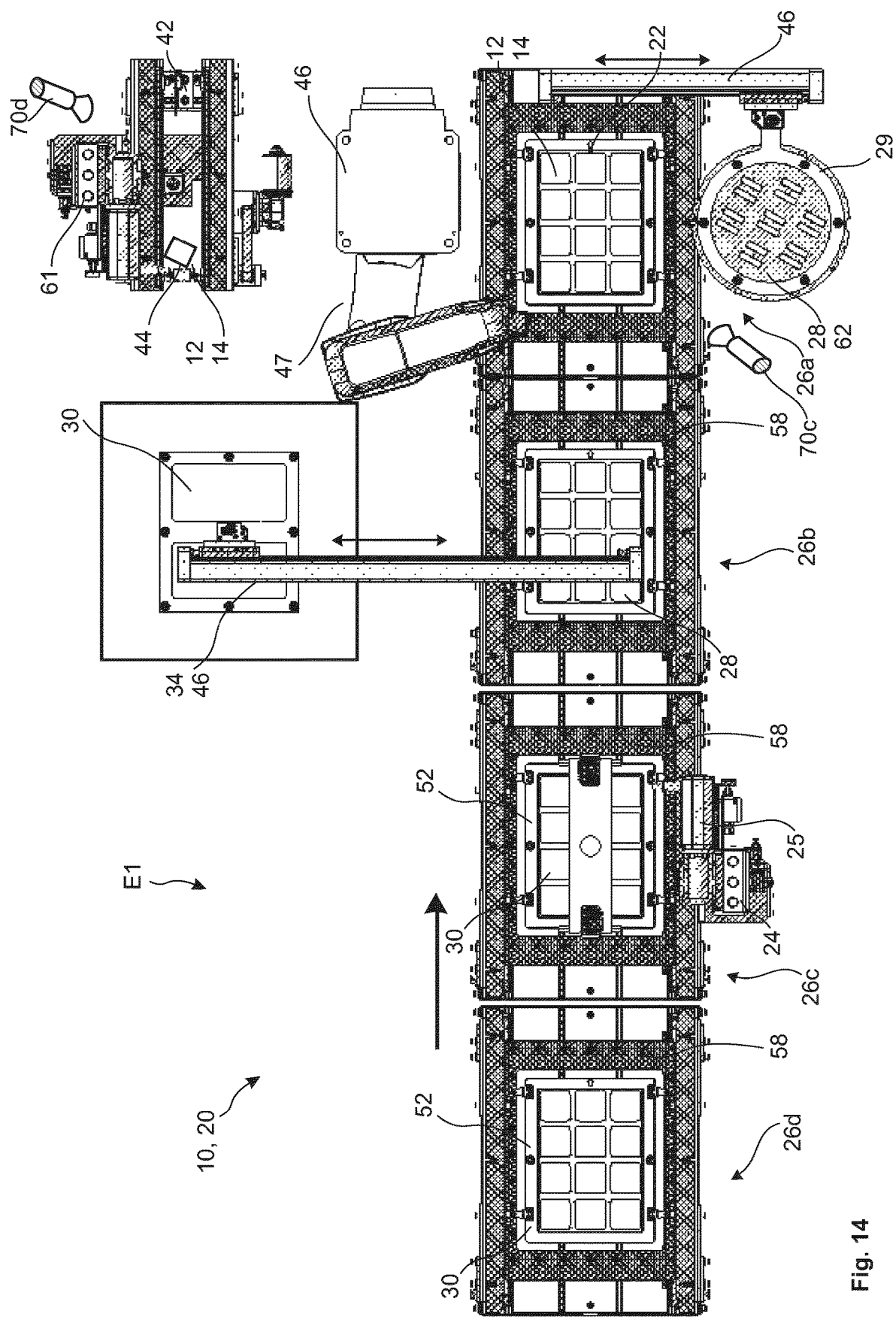
FIG. 14 shows a further embodiment of an unloading station with an optical inspection unit.

FIG. 14 illustrates the associated unloading station 20 which is complementary to the loading station 18 from FIG. 13. This also resembles, as a further embodiment 20, the unloading station 20 described in FIG. 7, reference accordingly being made to the description relating thereto. Using an inspection camera 70c above the working position 26a and a further inspection camera 70d above the lifting unit 61, an optical inspection means detects the rotational position and X/Y alignment of the workpieces 14 on the manufacturing workpiece carrier 22, and enables rotationally and positionally accurate transfer of the workpieces onto a conveying workpiece carrier 44.

FIG. 15a shows a plan view onto an embodiment of an insert of a manufacturing workpiece carrier 22 with optical reference marks 72 for an optical inspection means. The insert of the manufacturing workpiece carrier 22 can accommodate seven workpieces 14 in a matrix arrangement. Fastening elements 76, for example recesses or pegs, are provided for fastening in a tray-like frame of the manufacturing workpiece carrier 22. At the outer peripheral region of the insert, form-fitting edge sections 74 are provided for positionally correct form-fitting insertion in the frame of the manufacturing workpiece carrier 22.

The manufacturing workpiece carrier 22 has two optical reference marks 72 which are detected by the optical inspection means and enable an alignment of the manufacturing workpiece carrier even with a low resolution of the inspection camera 70 or under difficult lighting conditions. The detail in FIG. 15b illustrates an optical reference mark 72. This consists of a sequence of concentric contours, in this case concentric rings. Their defined spacing and widths enable both exact identification of the X/Y placement, and the position of two reference marks 72 on the manufacturing workpiece carrier 22 relative to one another enables determination of the rotational position of the manufacturing workpiece carrier 22.

Finally, FIG. 16 is a perspective view of a combination of a frame and of the insert, shown in FIG. 15a, of the manufacturing workpiece carrier 22 with workpieces accommodated therein. These are covered with a process cover 62 in the form of a mask 28 for a vacuum sintering method and connected by means of a retaining ring 52 to the manufacturing workpiece carrier 22. Subsequently, a foil/film 30 can may also be put in place for coverage, and optionally also fixed in place by the retaining ring 52. The foil/film 30 prevents an elastic sintering pad from sticking to a workpiece surface, for example during sintering.

Figure 17:
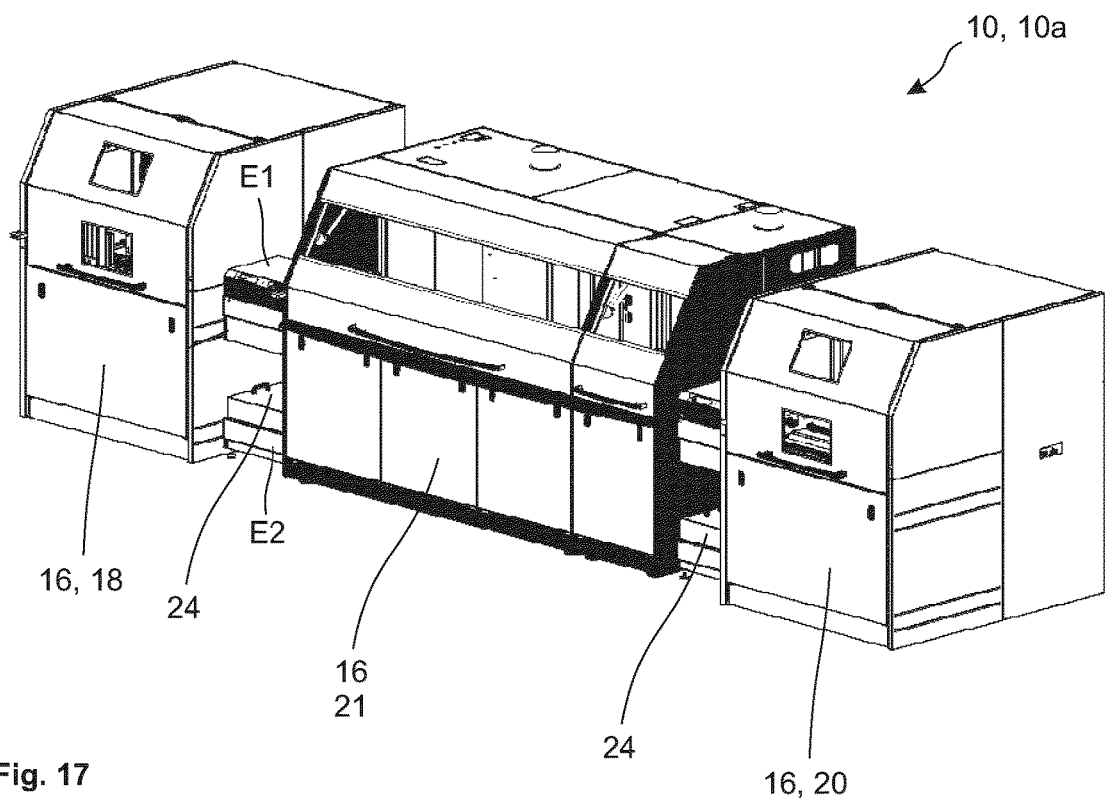
FIG. 17 shows a further embodiment of a system in accordance with the invention for connecting electronic assemblies and/or for manufacturing workpieces with multiple modules.

FIG. 17 shows a further embodiment of a system 10 in accordance with the invention for connecting electronic assemblies 12 and/or for manufacturing workpieces 14 with multiple modules. The system 10 has multiple modules 16. Such a system 10 can for example form a soldering system 10a. Using such a system 10, it is possible to produce for example thermally resistant soldered joints. In this embodiment, the system 10 has three modules 16. The first module 16 is designed as a loading station 18. This is adjoined by a manufacturing station 21. The module 16 at the right-hand end of the system is designed as an unloading station 20. To form a clean room, in particular an ISO 5 clean room, the system is preferably designed as a closed chamber and/or gas-tight. The modules 16 are therefore preferably connected to one another, but protected from external influences in a common housing. Unlike in the embodiment according to FIG. 1, the modules 16 are not connected directly to one another, but instead by a plurality of conveying units 24. At the various levels E1, E2, connections are formed in each case preferably as closed chambers and/or units of gas-tight design inside which the conveying units 24 run. One of the conveying units 24 may for example form an underfloor conveying unit 60.

Figure 18:
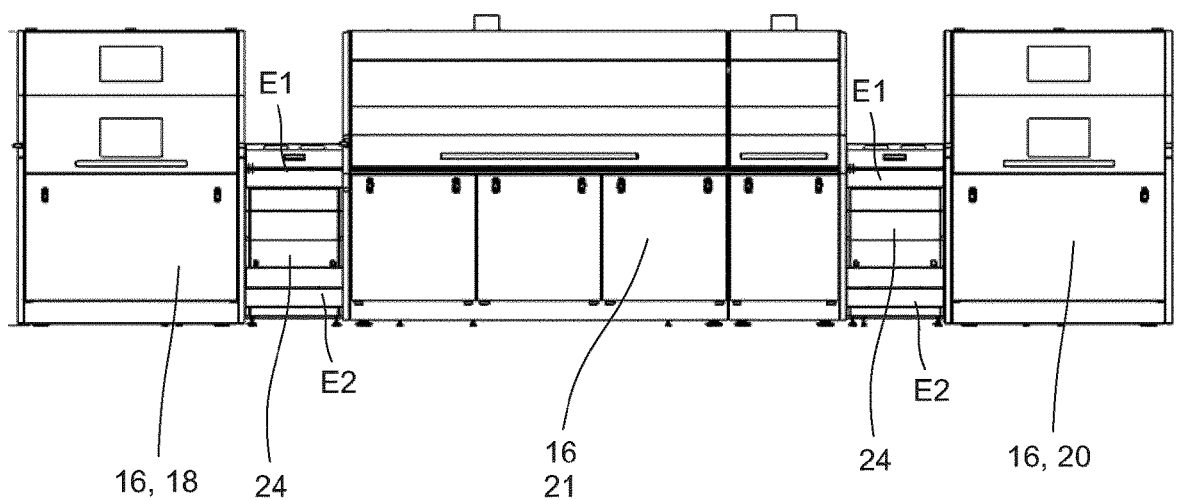
FIG. 18 shows the system from FIG. 17 in a front view.

FIG. 18 shows a front view of the system from FIG. 17. The individual connecting regions between the modules 16 in which the conveying units 24 run can be seen. Unlike in the embodiment according to FIGS. 1 and 2, the embodiment according to FIGS. 17 and 18 may be designed specifically as a soldering system. The difference from a system according to FIGS. 1 and 2 lies in the fact that in a soldering system, it is possible to dispense with the working position which is designed as a foil/film transfer unit 32 for placing foils/films. In further respects, the embodiment according to FIGS. 17 and 18 may match that according to FIGS. 1 and 2.

Figure 19:
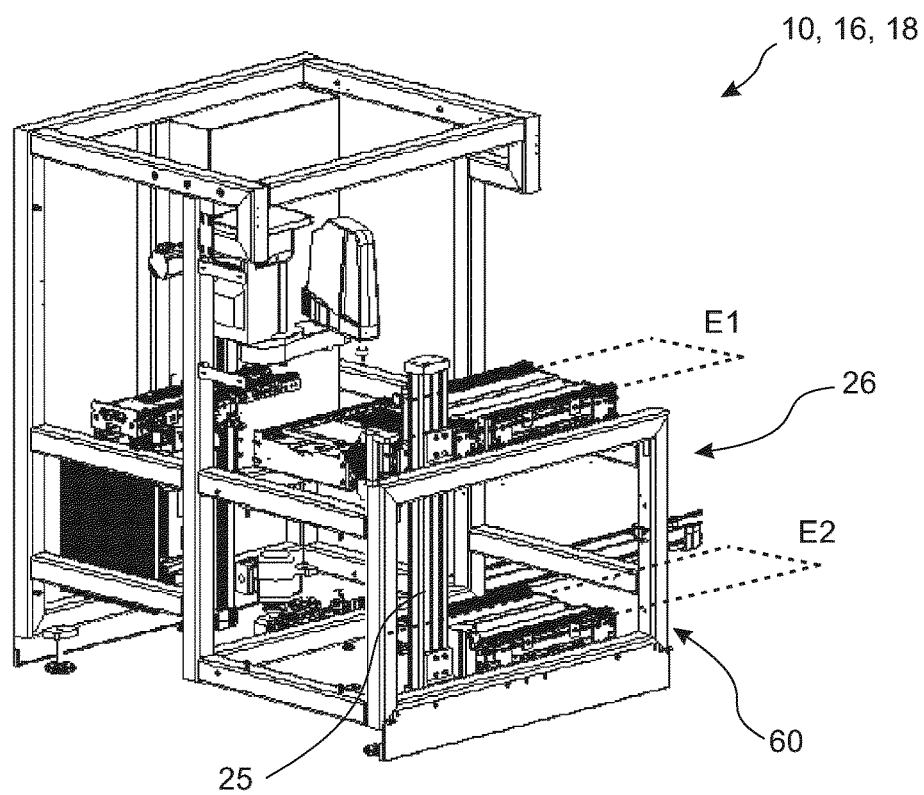
FIG. 19 shows a further embodiment of a module of a system in accordance with the invention which is designed as a loading station.

FIG. 19 shows a further embodiment of a module 16 of a system 10 in accordance with the invention which is designed as a loading station 18. The loading station 18 is illustrated without a housing, making the interior visible. In this illustration, a lifting unit 25 of the conveying unit 24 is shown on level E1. This is connected to the underfloor conveying unit 60 which is arranged on level E2, below level E1. The lifting unit 25 can be used to convey the manufacturing workpiece carriers 22 from the lower level E2, on which the underfloor conveying unit 60 is arranged, to the upper level E1, on which the working positions 26 are arranged. The lifting unit 25 may convey the manufacturing workpiece carriers 22 by traveling from level E1 to level E2 or vice versa. This operation has already been described in detail in relation to FIG. 3. Unlike the embodiment according to FIG. 3, the embodiment according to FIG. 19 shows a loading station 18 for a soldering system according to FIGS. 17 and 18. The foil/film transfer unit can be dispensed with in such an embodiment.

Figure 20:
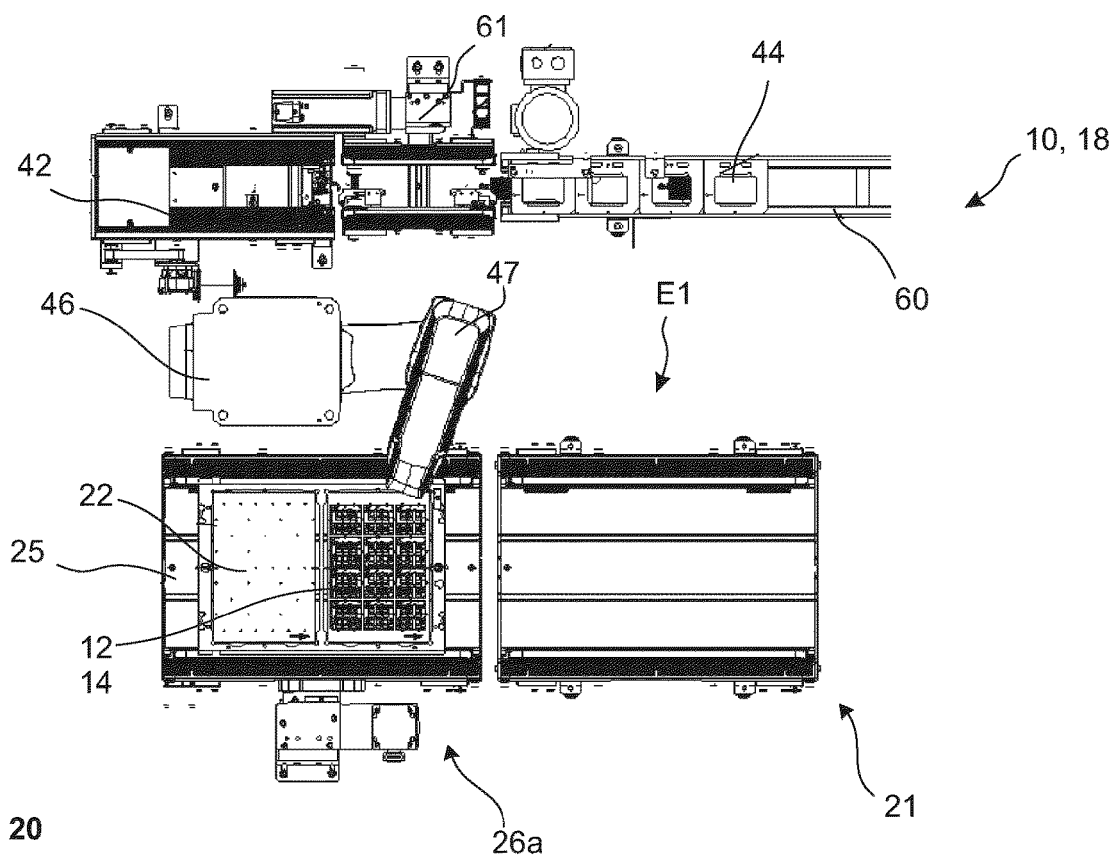
FIG. 20 shows the module from FIG. 19 showing different working positions in a plan view.

FIG. 20 shows a plan view of the module 16 from FIG. 19, showing different working positions. In the working position 26a, the electronic assemblies 12 and/or workpieces 14 are placed onto a manufacturing workpiece carrier 22. This may also be referred to as prefabrication in relation to the method 100. The electronic assemblies 12 and/or workpieces 14 can be transferred onto the manufacturing workpiece carrier 22 using an automation robot 46, in particular a robot arm 47. This can also be achieved by overhead mounting. Unlike in the embodiment according to FIG. 4, the embodiment according to FIG. 20 does not have a working position 26b for placing a foil/film. The embodiment according to FIG. 20 thus shows in particular a soldering system. Behind the working position 26a, a further manufacturing station 21 can be arranged, for example in the form of a conveyor belt, which serves as a buffer or buffer station. In the upper part of the figure, a second conveying unit 42 is arranged which has a lifting unit 61. An underfloor conveying unit 60, on which the conveying workpiece carriers 44 are arranged, is arranged at this second conveying unit 42. In the further embodiments, the illustration can have features like those of the embodiment according to FIG. 4, with the exception of the foil/film transfer unit 32.

Figure 21:
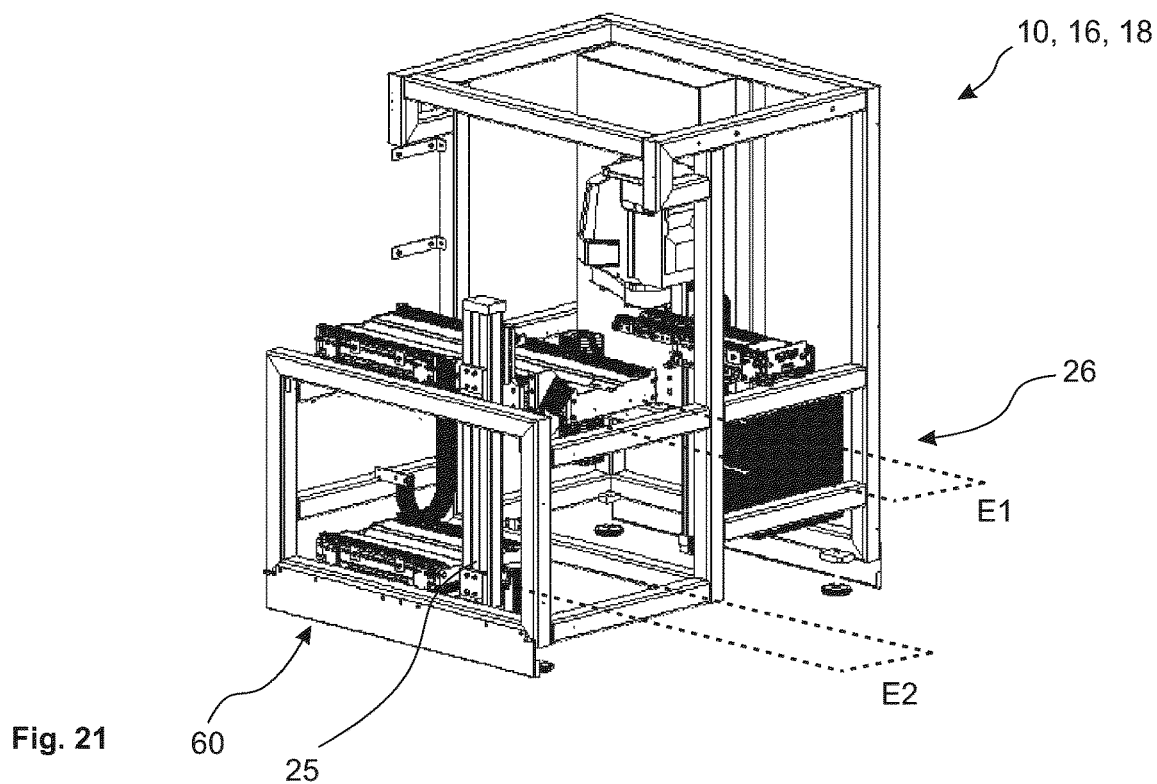
FIG. 21 shows a further embodiment of a module of a system in accordance with the invention which is designed as an unloading station.

FIG. 21 shows a further embodiment of a module 16 of a system 10 in accordance with the invention, which is designed as an unloading station 20. The unloading station 20 is shown without a housing, making the interior visible. In this illustration, a lifting unit 25 of the conveying unit 24 is shown on level E1. This is connected to the underfloor conveying unit 60 which is arranged on level E2, below level E1.

Figure 22:
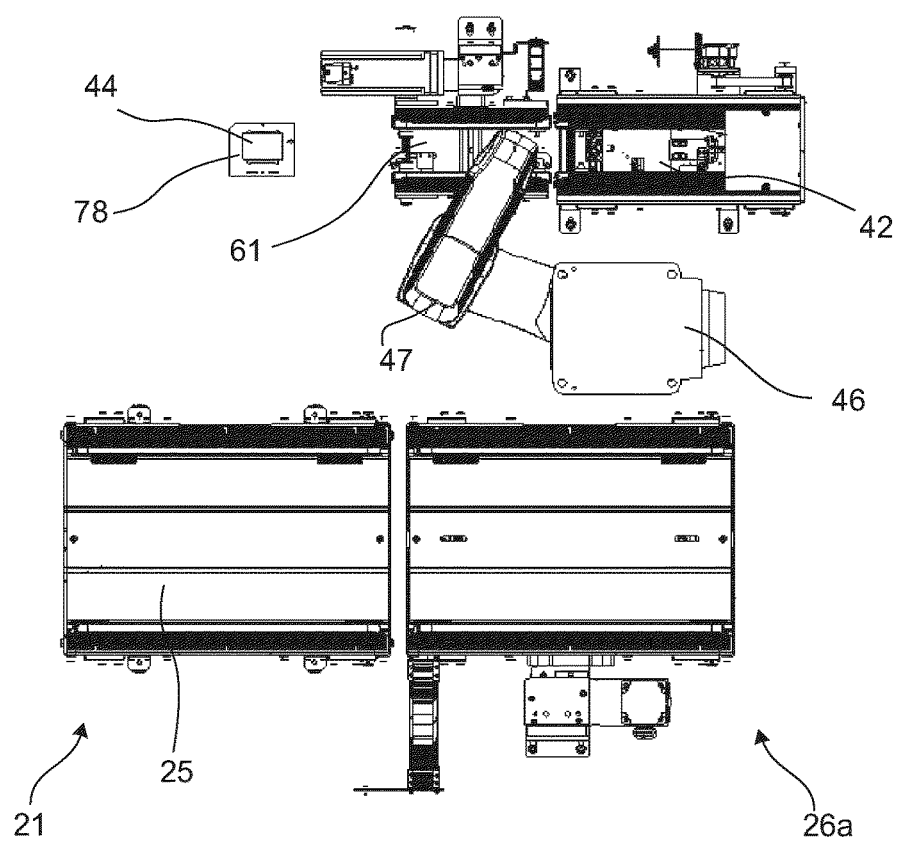
FIG. 22 shows the module from FIG. 21 showing different working positions in a plan view.

FIG. 22 is a plan view of the module 16 from FIG. 21, showing the working position 26a. A further manufacturing station 21, which can for example be designed as a cooling station, is arranged upstream of the working position 26. Using the robot arm 47, the workpieces 14 can be conveyed from the working position 26a onto the second conveying unit 42. The second conveying unit 42 comprises a lifting unit 61 for conveying the conveying workpiece carrier 44. Furthermore, a magazine 78 is comprised which can accommodate the empty conveying workpiece carriers 44.

Figure 23:
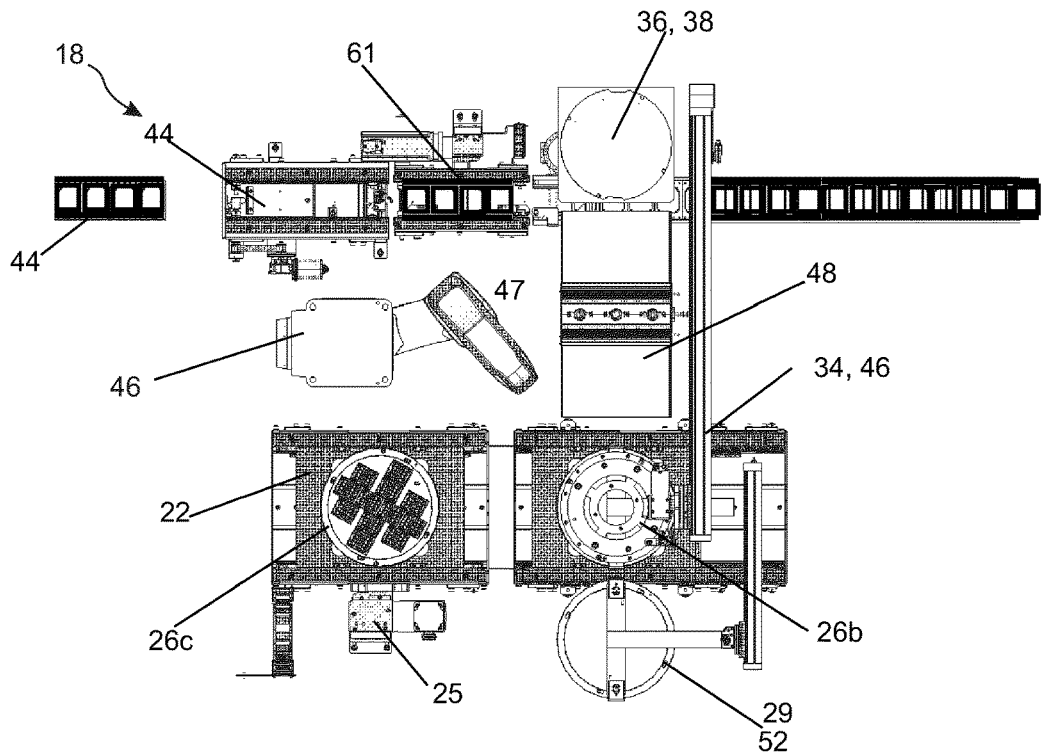
FIG. 23 shows a loading station of a further embodiment for sinter processing.
Figure 24:
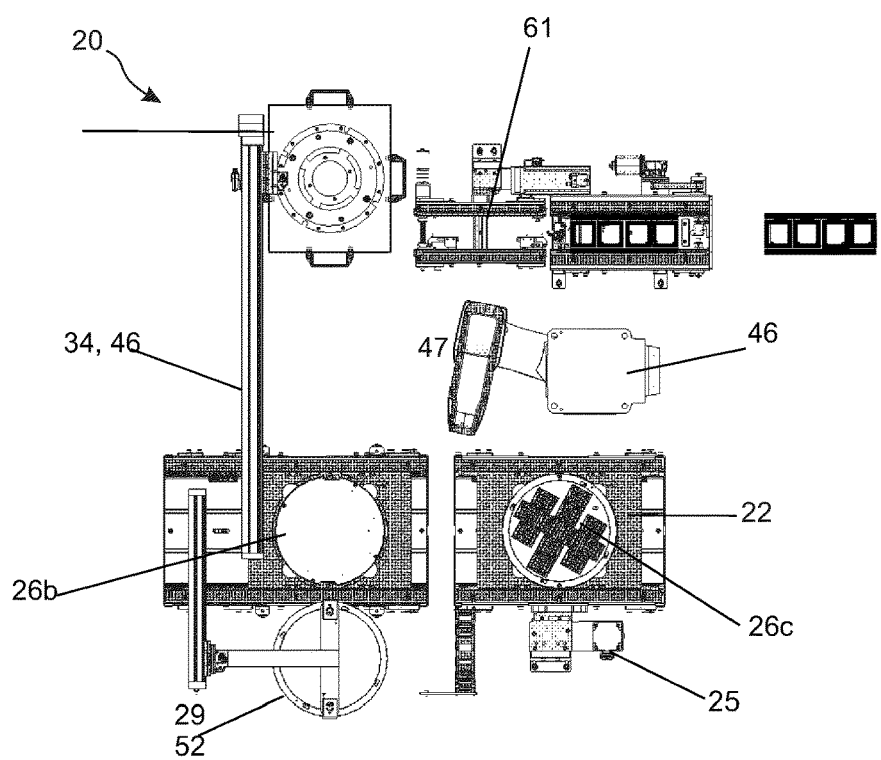
FIG. 24 shows an unloading station of a further embodiment for sinter processing.

FIGS. 23 and 24 show two further embodiments of a loading station 18 and an unloading station 20 as an add-on module 16 for a system 10. Generally speaking, these correspond in their functional procedure and structure to the loading and unloading stations 18, 20 explained in detail in relation to FIGS. 13 and 14.

One possible sequence of operations for the loading station 18 in FIG. 23, when using a single top foil/film 30 for a sintered joint, is as follows:

firstly a manufacturing workpiece carrier 22 can be lifted using a lifting unit from an underfloor conveying unit 60 to a working level at position 26c;

after this, a plurality of workpieces 14, for example 10 to 14, in particular 12 DCB PCBs (Direct Bonded Copper Printed Circuit Boards), are transferred by the robot arm 47 of the automation robot 46 from a conveying workpiece carrier 44 into the manufacturing workpiece carrier 22;

the filled manufacturing workpiece carrier 22 is then moved from position 26c to position 26b;

the retaining ring 52, hitherto stored on the manufacturing workpiece carrier 22, can then be transferred into a parked position 29;

a foil/film 30, for example a PTFE film for sinter processing, is removed as top foil/film from the foil/film stack 35 from the foil/film transfer unit 32, cleaned by the foil/film cleaning unit 48 and then placed onto the filled manufacturing workpiece carrier 22;

after this, the retaining ring 52 from the parked position 29 is placed and fastened on the manufacturing workpiece carrier 22 to fix the foil/film 30 in place;

subsequently, the workpiece carrier 22 is moved into a preheating module for preparation for the sintering process.

Alternatively, if a bottom foil/film 30 and a top foil/film 30 are used, after the manufacturing workpiece carrier 22 has already been lifted from the underfloor conveying unit 60 into position 26b after the retaining ring 29 has been brought into the parked position 52, the bottom foil/film 30 can firstly be placed onto the manufacturing workpiece carrier 22, after which filling of the workpieces 14 takes place in position 26c.

The unloading station 20 from FIG. 24, which is located sequentially after the sintering module 21 to enable flow production, may operate in a mirror-image manner and perform the following working steps when a top foil/film 30 is used for a sintered joint:

introducing a manufacturing workpiece carrier 22 from a manufacturing station 21, for example from a cooling module 16, into the unloading station 20;

lifting the retaining ring 52 and bringing it into a parked position 29 at a position 26b of the unloading station 20;

gripping and pulling off the foil/film 30 from the filled manufacturing workpiece carrier 22 by means of a foil/film transfer means 34;

returning the retaining ring 52 from the parked position 29 onto the manufacturing workpiece carrier 22;

moving the manufacturing workpiece carrier 22 from position 26b to position 26c;

transferring the workpieces 14 by means of the robot arm 47 from the manufacturing workpiece carrier 22 onto a conveying workpiece carrier 44, wherein each transfer operation requires less than 6 seconds, in particular 5.5 seconds;

moving the manufacturing workpiece carrier 22 by means of the lifting unit onto the underfloor conveying unit 60 for returning to the loading station 18.

When using a bottom foil/film 30 and a top foil/film 30, the bottom foil/film can then be pulled off by an automation robot 46 after movement of the manufacturing workpiece carrier 22 from position 26b to position 26c.

During return conveying from the loading station 20 into the unloading station 18, used foils/films can be placed onto the manufacturing workpiece carrier 22, conveyed back and placed back onto the foil/film stack 36, or placed onto a further foil/film stack inside the unloading station 20, which may be manually transferred back into the loading station 18 for re-use.

Once the used foil/film 30 has been removed, in the unloading station 20, the cleaning unit 48 or a second cleaning unit may already perform cleaning of the foil/film in the unloading station 20.

Figure 25:
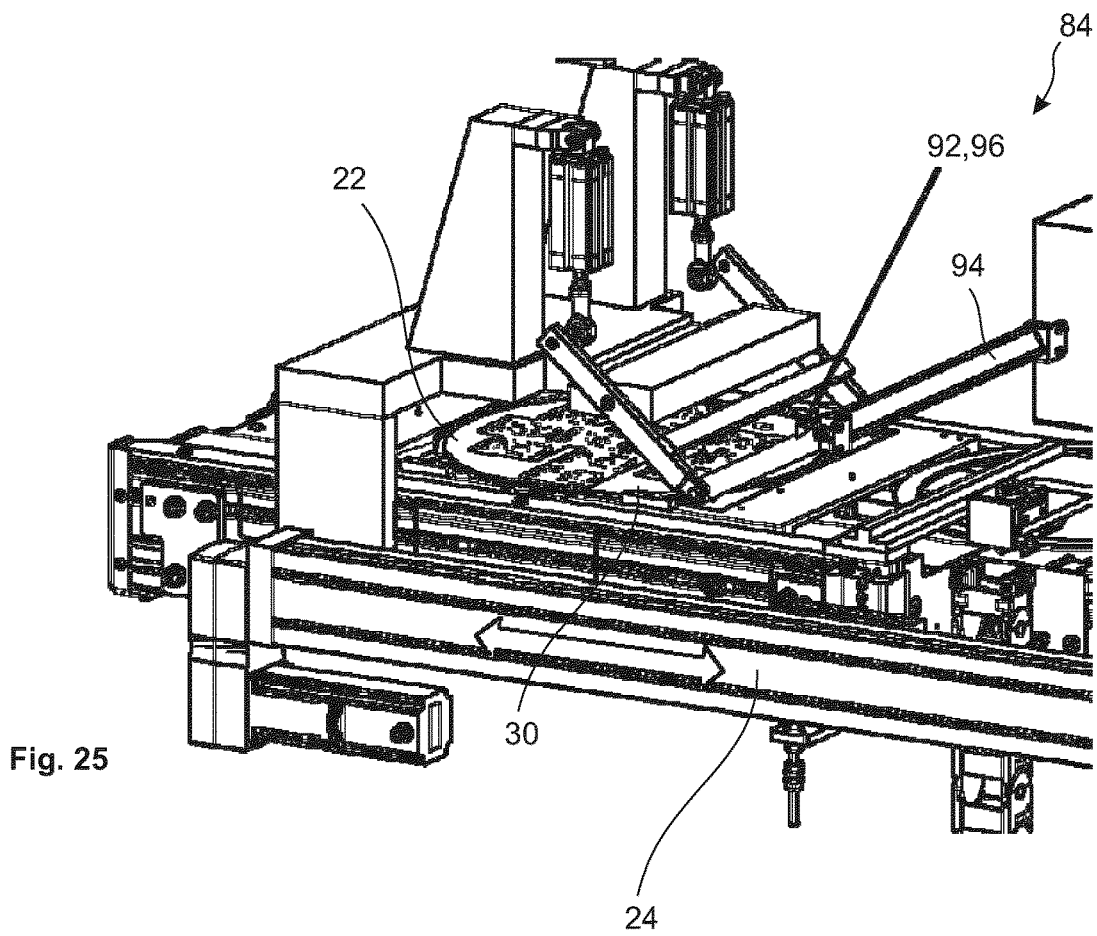
FIG. 25 shows an embodiment of a foil/film detachment unit.

FIG. 25 shows an embodiment of a foil/film detachment unit 84. The foil/film detachment unit 84 has a contact element 92 in the form of a roller 96. A foil/film 30 arranged above the manufacturing workpiece carrier 22 is held with the contact element 92 on the surface of the manufacturing workpiece carrier 22 with the workpieces 14. In this embodiment, the contact element 92 is designed as a roller 96 and can during a relative movement (in the direction shown by the arrow) of the manufacturing workpiece carrier 22 in relation to the foil/film detachment unit 84 roll over the surface of the foil/film 30. Once the foil/film 30 has, during a relative movement of the manufacturing workpiece carrier 22, passed the contact element 92, the latter can be gripped using the gripping element 94 and pulled away upwards, i.e. moved away from the manufacturing workpiece carrier 22. This allows the foil/film 30 to be removed in a controlled manner from the manufacturing workpiece carrier 22 with the workpieces 14. The foil/film detachment unit 84 can be arranged at a working position 26 of the unloading station 20, wherein the manufacturing workpiece carrier 22 can be moved relative to the foil/film detachment unit 84 in particular by the conveying unit 24. This allows the foil/film detachment unit 84 to remain at a fixed position. The foil/film 30 can be pulled off upwards by pivoting the gripping element 94.

Figure 26:
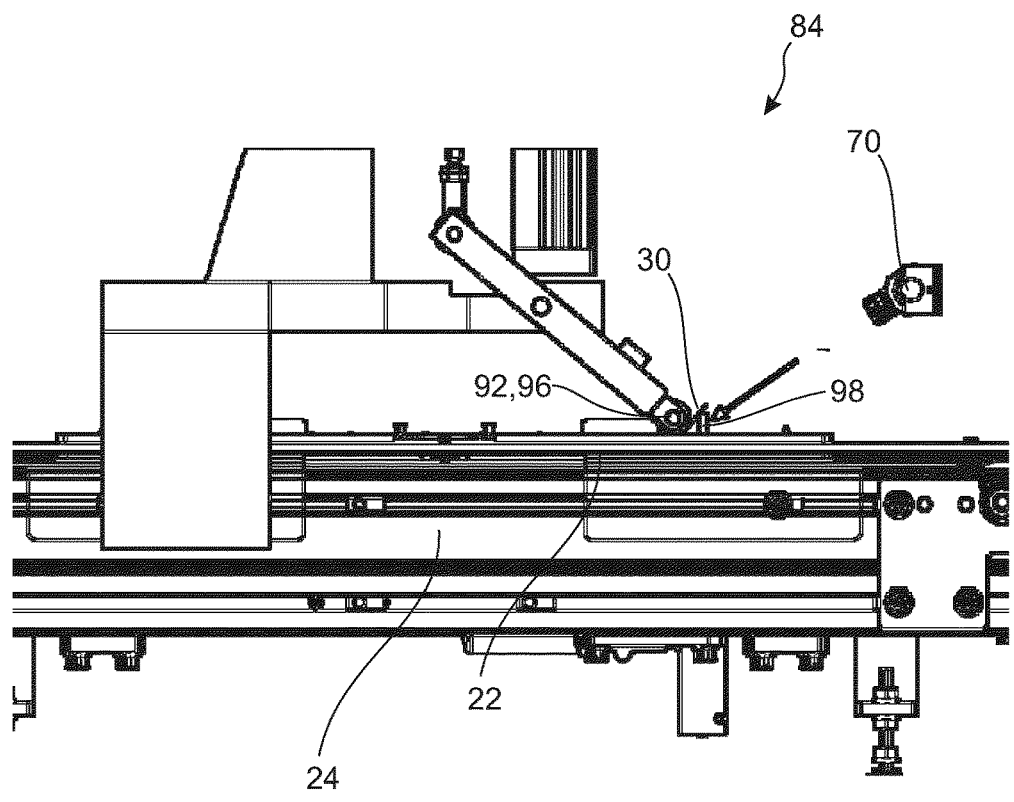
FIG. 26 shows a further view of the embodiment from FIG. 25.

FIG. 26 shows a further view of the embodiment from FIG. 25. It can be seen in this view that a foil/film lifter 98, by which the foil/film 30 is guided, is arranged in the area in front of the contact element 92. Thus allows the foil/film 30 to be gripped in simplified manner by the gripping element 94. Lifting of the foil/film 30 can also be assisted for example by an air flow, compressed or aspirated air, arranged in front of the foil/film lifter 98. Such an air flow can lift the foil/film 30 for example between the contact element 92 and the foil/film lifter 98, such that the foil/film 30 can be passed over the foil/film lifter 98. It is also conceivable for the foil/film 30 to be lifted by coming into mechanical contact with the foil/film lifter 98 and bulging upwards as a result. Since the foil/film 30 is pressed downwards behind the foil/film lifter 98 (on the left of the foil/film lifter 98 in the illustration) by the contact element 92, the foil/film 30 can be detached from the manufacturing workpiece carrier 22 in controlled manner. This operation can be controlled by an inspection camera 70 in a further embodiment.

Figure 27:
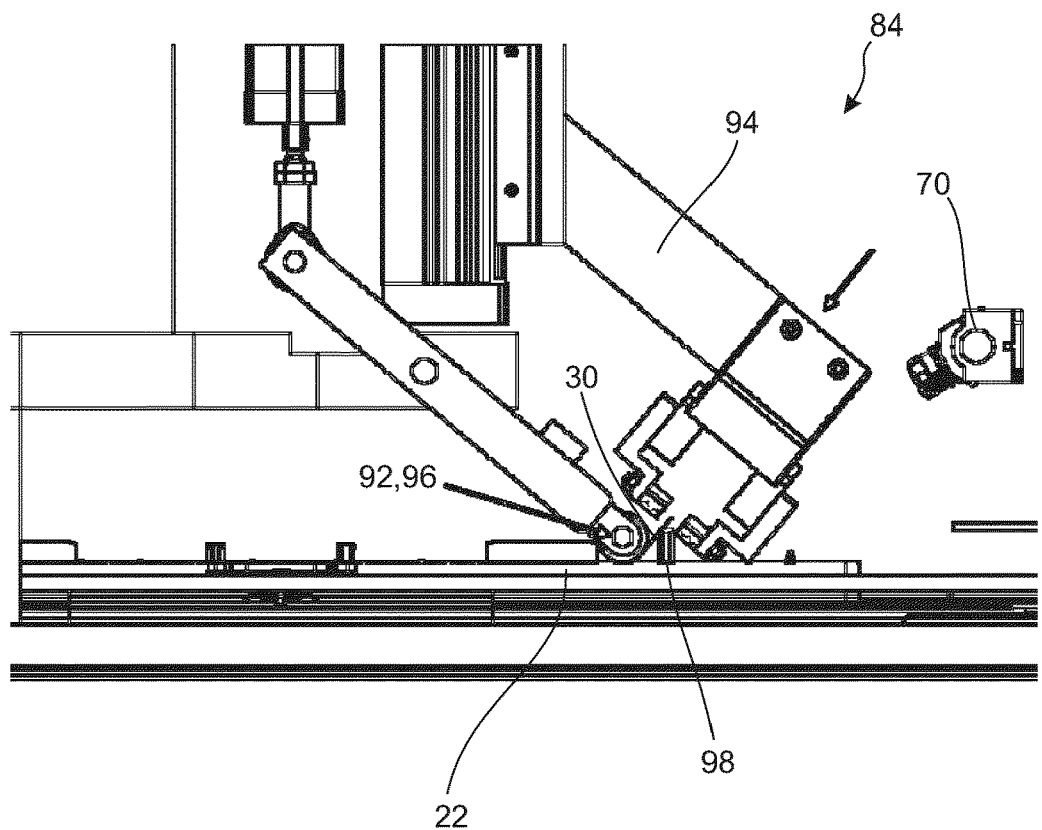
FIG. 27 shows a further embodiment of a foil/film detachment unit.

FIG. 27 shows a further embodiment of a foil/film detachment unit 84. In addition to the illustration according to FIG. 26, the gripping element 94 which fixes the foil/film 30 above the foil/film lifter 98 in clamping manner is shown. The gripping element 94 can be pivoted or moved in the direction of the foil/film 30 or in the direction of the manufacturing workpiece carrier 22 as soon as the foil/film 30 is in contact with the foil/film lifter 98. This can be controlled for example with the aid of the inspection camera 70.

Figure 28:
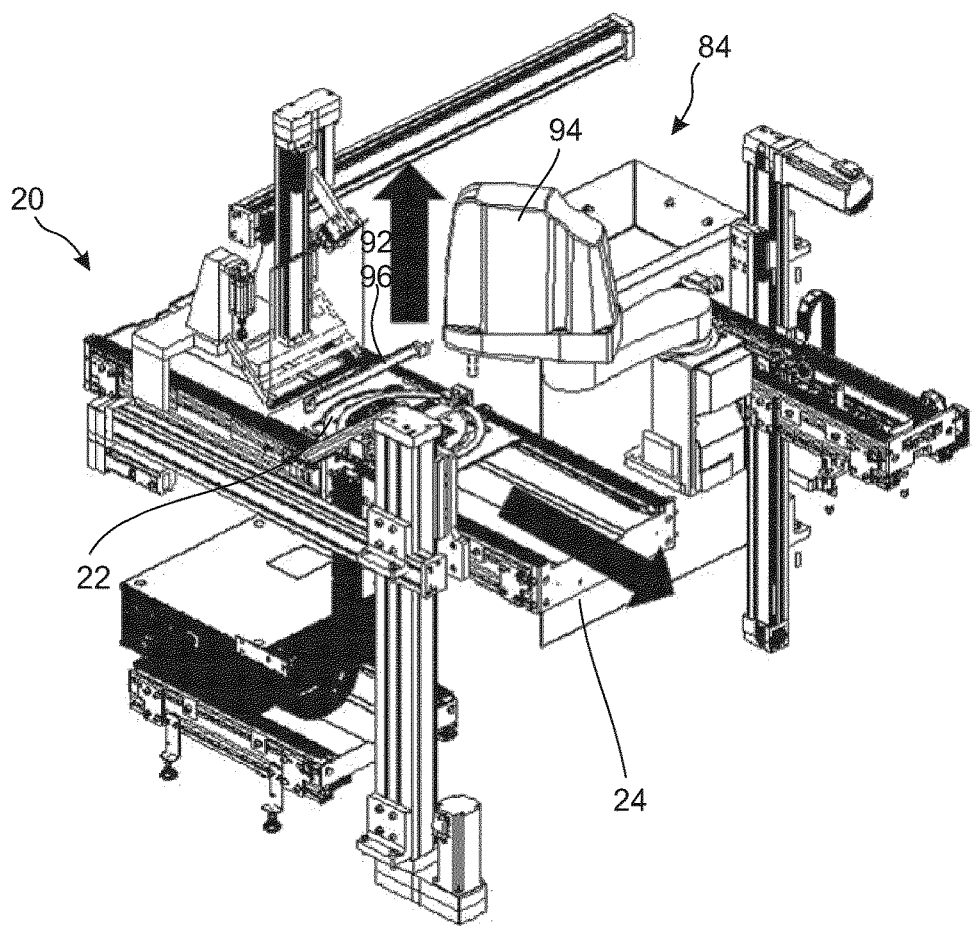
FIG. 28 shows a further view of the embodiment from FIG. 27.

FIG. 28 shows a further view of the embodiment from FIG. 27. Once the gripping element 94 has gripped the foil/film 30, the gripping element 94 moves upwards preferably at the same time (direction of arrow in the illustration), while the manufacturing workpiece carrier 22 is moved horizontally (direction of arrow in the illustration) in particular by the conveying unit 24. In particular, both movements take place at the same speed. This allows a continuous detachment of the foil/film 30 from the manufacturing workpiece carrier 22 to be achieved. FIG. 28 shows here as an example a working position of the unloading station 20. The gripping element 94 is located above the conveying unit 24. The contact element 92 is arranged preferably parallel to a surface of the manufacturing workpiece carrier 22 and extends in particular transversely to the movement direction of the conveying unit 24.

Figure 29:
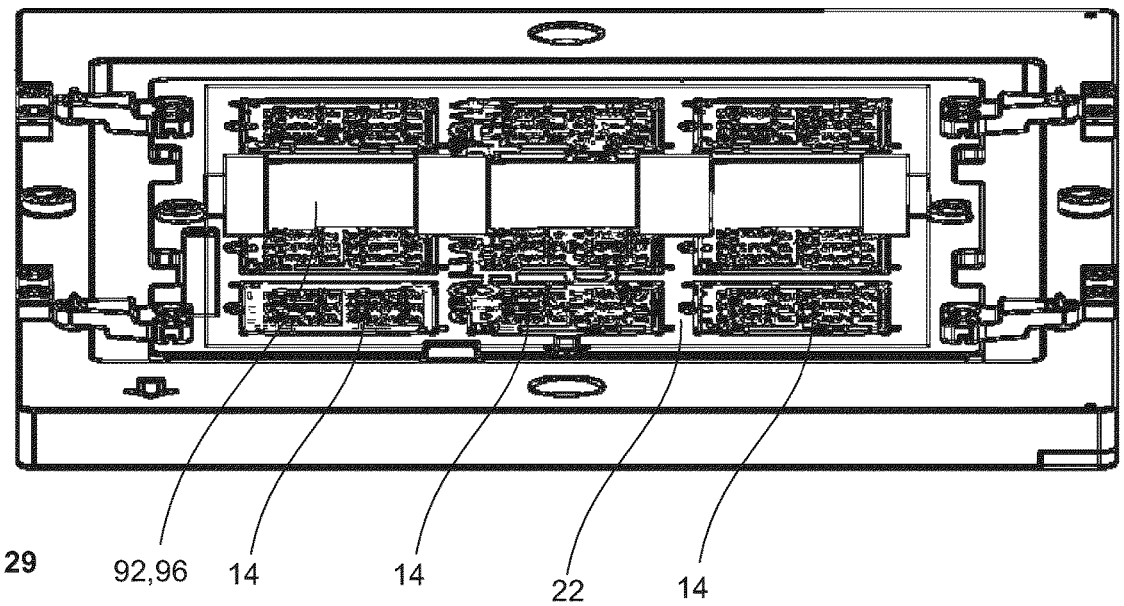
FIG. 29 shows an embodiment of a contact element.
Figure 30:
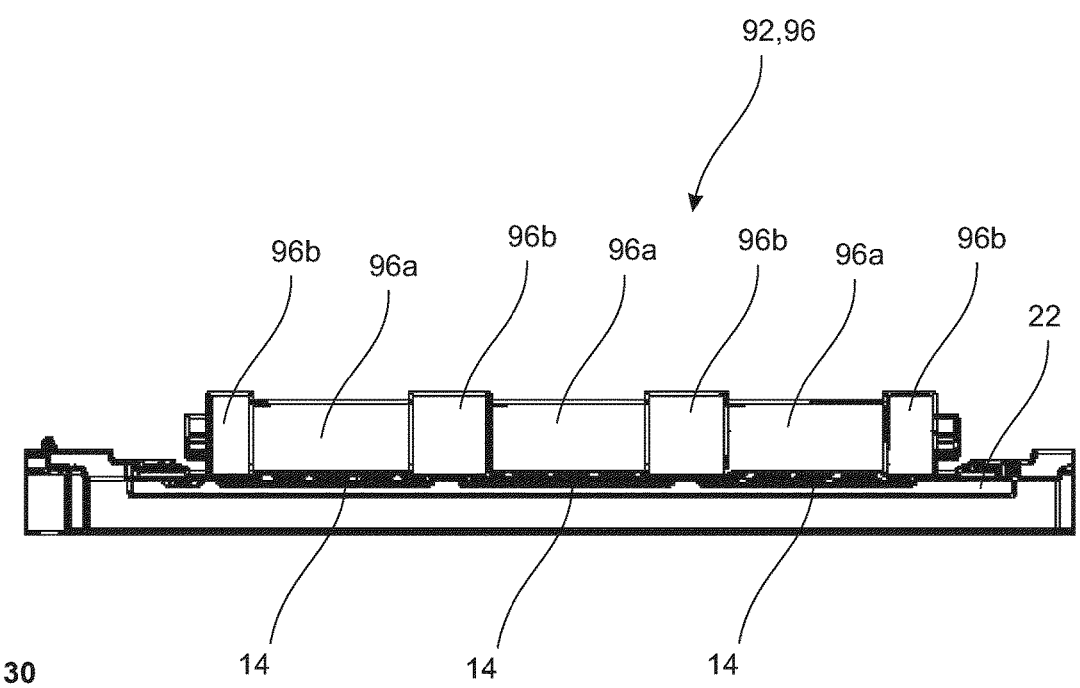
FIG. 30 shows a further view of the embodiment from FIG. 29.

FIG. 29 shows an embodiment of a contact element 92. In such an embodiment, the contact element 92 has the form of a roller 96 and is provided with recessed areas 96a and raised areas 96b, as shown in FIG. 30. The roller 96 can provide a negative form of the contour of the workpieces 14 on the workpiece carrier 22. If the workpiece carrier 22 is moved underneath the roller 96, in particular by the conveying unit 24, the roller 96 rotates over the foil/film 30 (not shown) and the workpieces 14 arranged underneath and the workpiece carrier 22 arranged underneath. The areas with the recessed areas 96a contact the workpieces 14 here, and the areas with the raised areas 96*b* contact the gaps arranged between them, and can in particular come directly into contact with the workpiece carrier 22. Such a roller can in effect provide an opposite form to the contour of the workpieces 14 on the workpiece carrier 22, allowing the contact element 92 to be guided exactly over the manufacturing workpiece carrier 22. Furthermore, pressing on of the foil/film 30 (not shown) can be assured even if the manufacturing workpiece carrier 20 with the workpieces 14 arranged thereon form an uneven surface.

FIG. 30 shows a further view of the embodiment from FIG. 29, wherein the alternatingly arranged recessed areas 96*a* and raised areas 96*b* are discernible.

Figure 31:
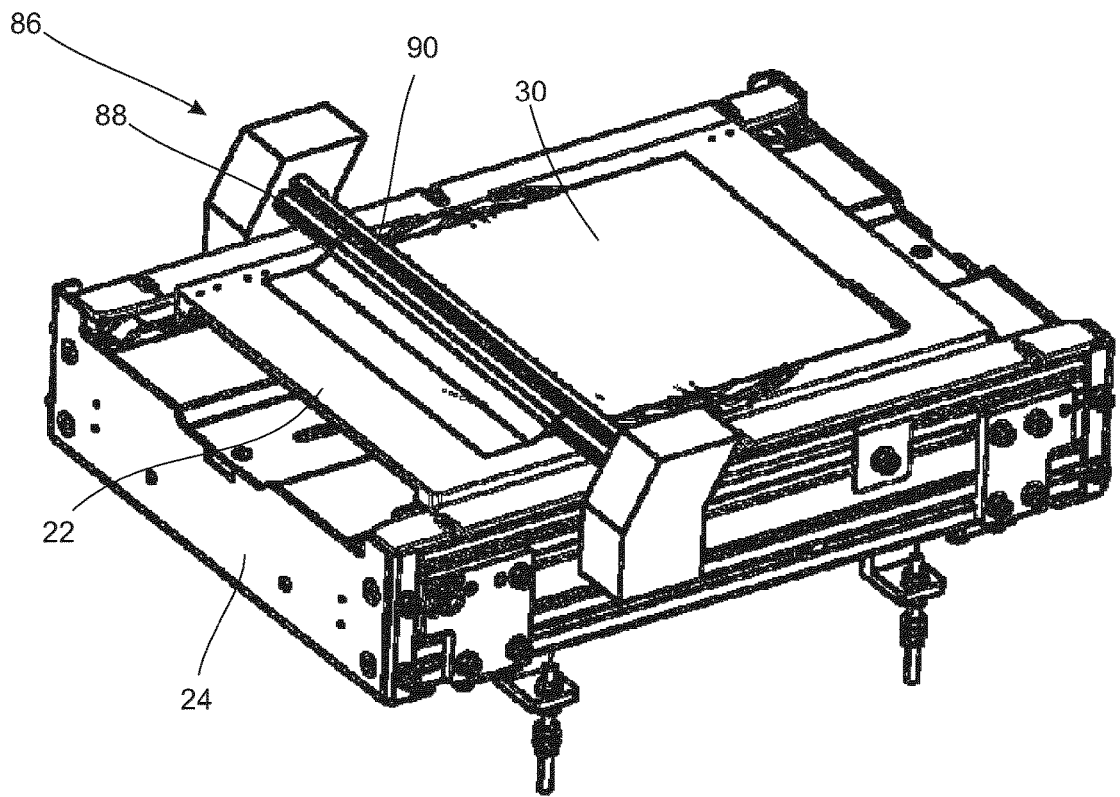
FIG. 31 shows a further embodiment of a foil/film detachment unit.

FIG. 31 shows a further embodiment of a foil/film detachment unit 84. The latter has a peeling-off unit 86 with a peeling-off element 88 and a retaining element 90. The peeling-off element 88 and the retaining element 90 are in this embodiment mounted on a retaining structure and can be moved relative to the conveying unit 24. The retaining structure can be guided along rail elements. In such an embodiment, the peeling-off unit 86 moves preferably relative to the manufacturing workpiece carrier 22 with the foil/film wherein in particular the peeling-off unit 86 is moved while the manufacturing workpiece carrier 22 remains unmoved. Preferably, the peeling-off element 88 inserts itself underneath the foil/film 30 while the retaining element 90 is arranged above the foil/film 30. The foil/film 30 can thereby be guided between the peeling-off element 88 and the retaining element 90 and detached from the manufacturing workpiece carrier 22 with the workpieces 14. The workpieces 14 are at the same time held down on the manufacturing workpiece carrier 22 by the peeling-off element 88.

Figure 32:
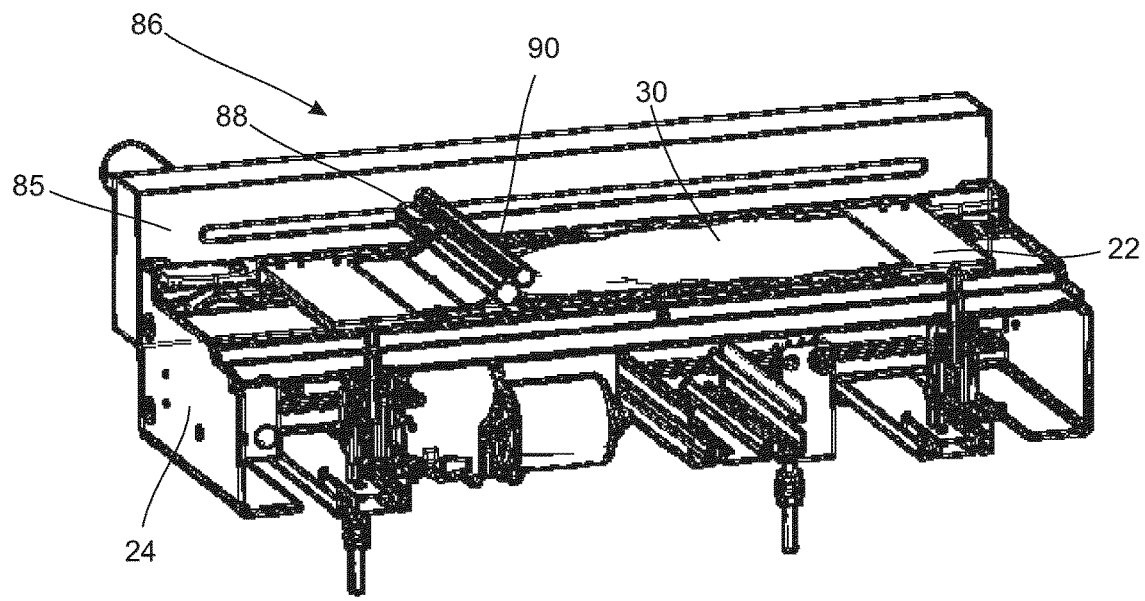
FIG. 32 shows a further embodiment of a foil/film detachment unit.

FIG. 32 shows a further embodiment of a foil/film detachment unit 84. It can be seen here that the peeling-off element 28 and the retaining element 90 are arranged slightly offset one above the other, such that the foil/film 30 can be guided between them. The peeling-off unit 86 can be moved relatively quickly, thus detaching the foil/film 33 from the manufacturing workpiece carrier 22. In the embodiment shown, the retaining structure is held in a linear unit 85 and can thus be moved parallel to the conveying unit 24.

Figure 33:
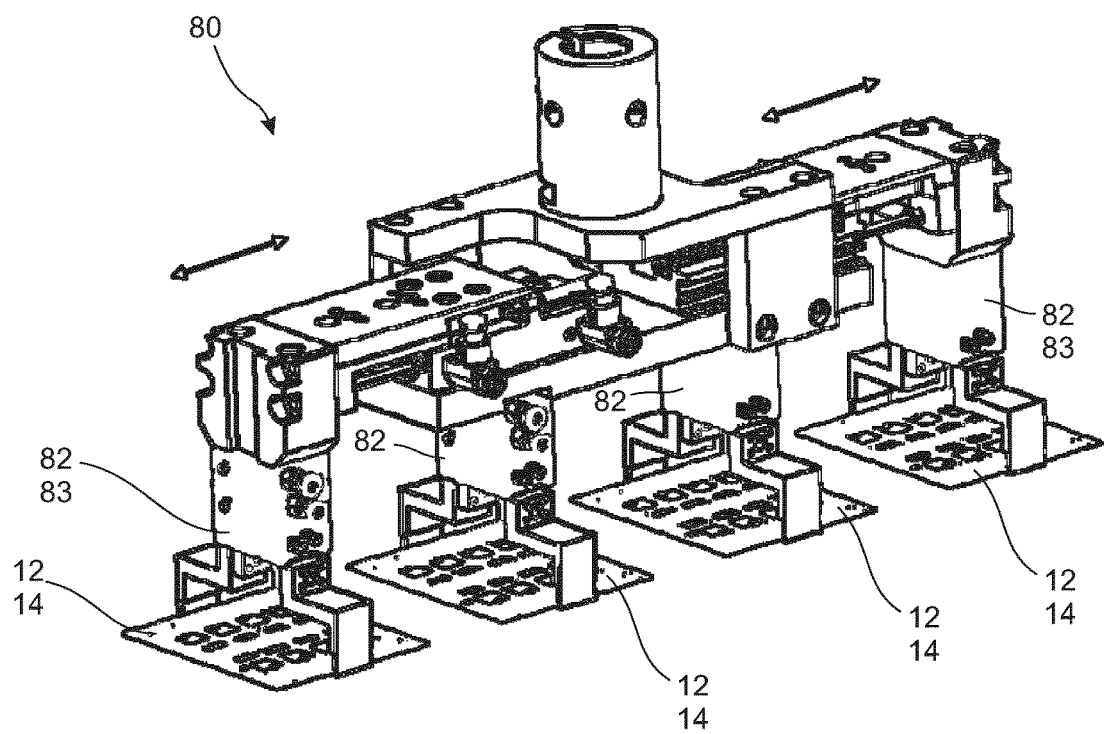
FIG. 33 shows an embodiment of a multiple gripper.

FIG. 33 shows an embodiment of a multiple gripper 80. The multiple gripper has in this embodiment four gripper arms 82 arranged along a line. The two outer gripper arms 83 can be moved along the virtual line (shown by the two arrows) such that the distance between the two inner gripper arms 82 and the two outer gripper arms 83 can be altered. In the area of the arrows, a pneumatically driven slide, in particular a mini-slide, can be provided that enables movement of the two outer gripper arms 83. In particular, all four gripper arms 82 can be pneumatically controlled and designed for example as parallel grippers. To pick up the workpieces 14 or electronic assemblies 12, a receptacle can be provided on every gripper arm 82. The receptacle can consist of two gripping elements that can clampably fix one workpiece 14 or one assembly 12 from two sides. A telescopable and/or pivotable section can be telescopically and/or pivotably arranged on a basic element of the multiple gripper 80. This allows the gripper arms 82, 83 to move relative to one another and relative to the basic element. In this embodiment, the multiple gripper 80 has a linear basic element.

Figure 34:
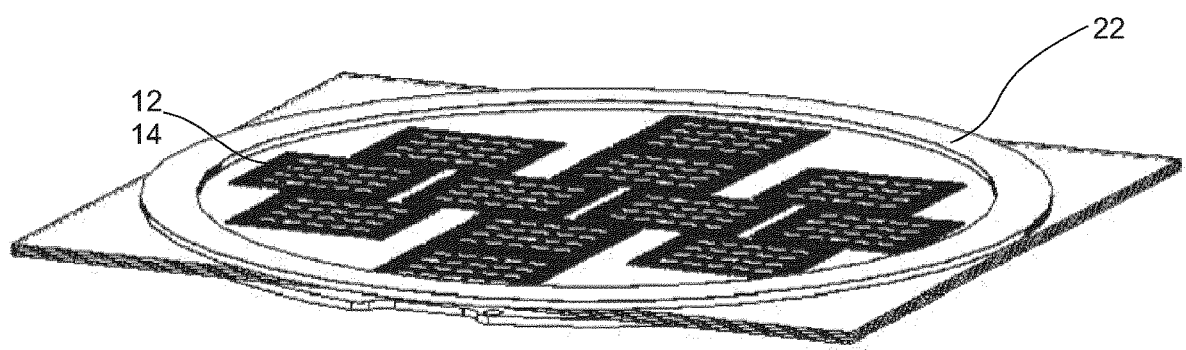
FIG. 34 shows an embodiment of a manufacturing workpiece carrier.

FIG. 34 shows an embodiment of a manufacturing workpiece carrier 22. Four of the workpieces 14 or electronic assemblies 12 arranged thereon can be gripped at the same time using the multiple gripper 80 shown. Thanks to pneumatic control, not only workpieces 14 or electronic assemblies 12 arranged on a virtual line can be gripped, placed or lifted, but also workpieces 14 or electronic assemblies 12 arranged in other ways.

Figure 35:
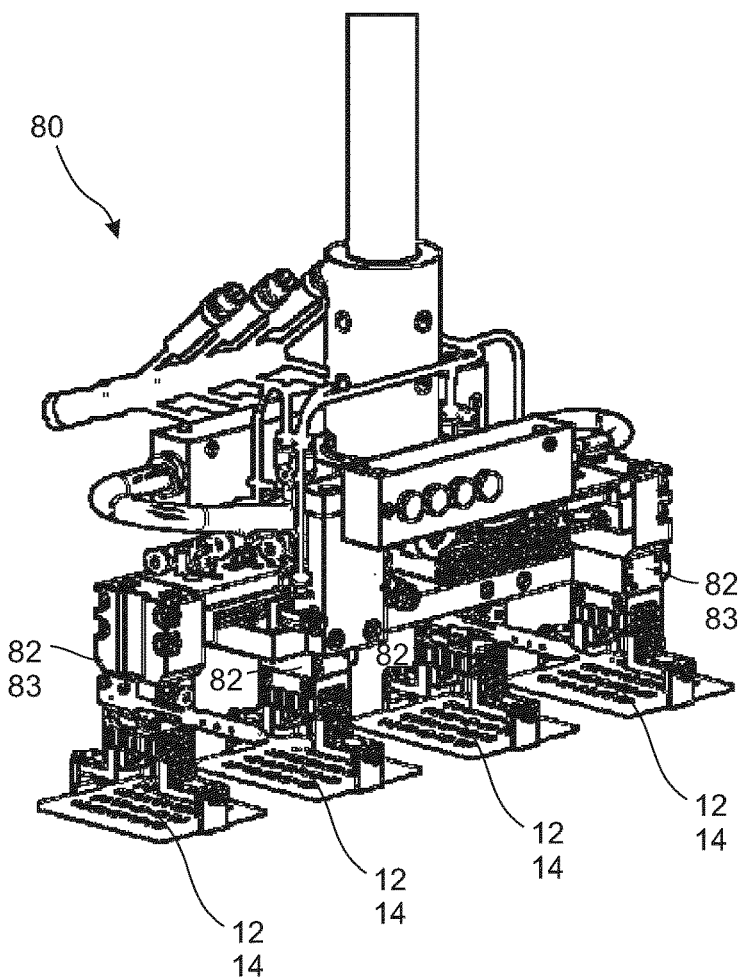
FIG. 35 shows a further embodiment of a multiple gripper.

FIG. 35 shows a further embodiment of a multiple gripper 80. In this embodiment the pneumatic system is discernible.

Figure 36:
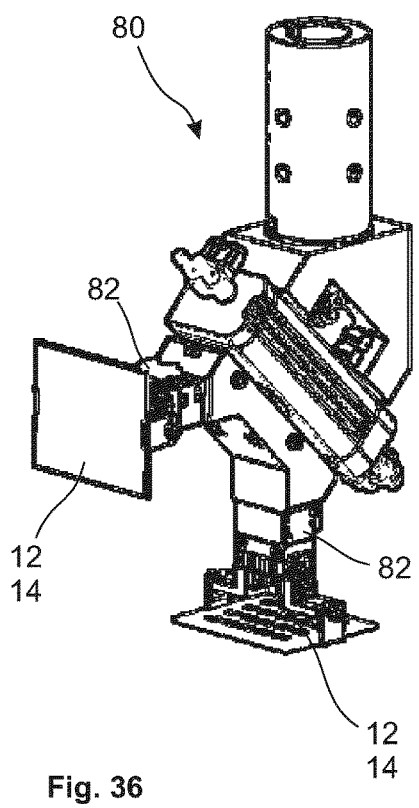
FIG. 36 shows a further embodiment of a multiple gripper.
Figure 37:
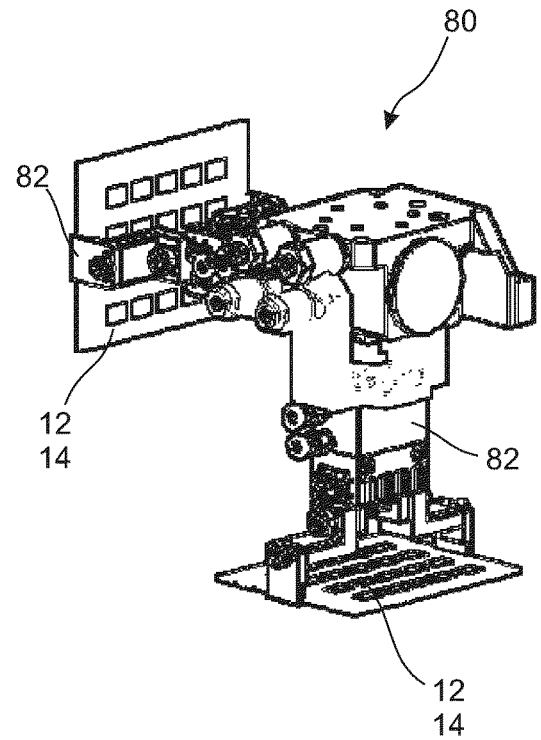
FIG. 37 shows a further view of the embodiment from FIG. 36.

FIG. 36 shows a further embodiment of a multiple gripper 80. This multiple gripper 80 has two gripper arms 82 that can be pivoted against one another. FIG. 37 shows a further view of the embodiment from FIG. 36.

Figure 38:
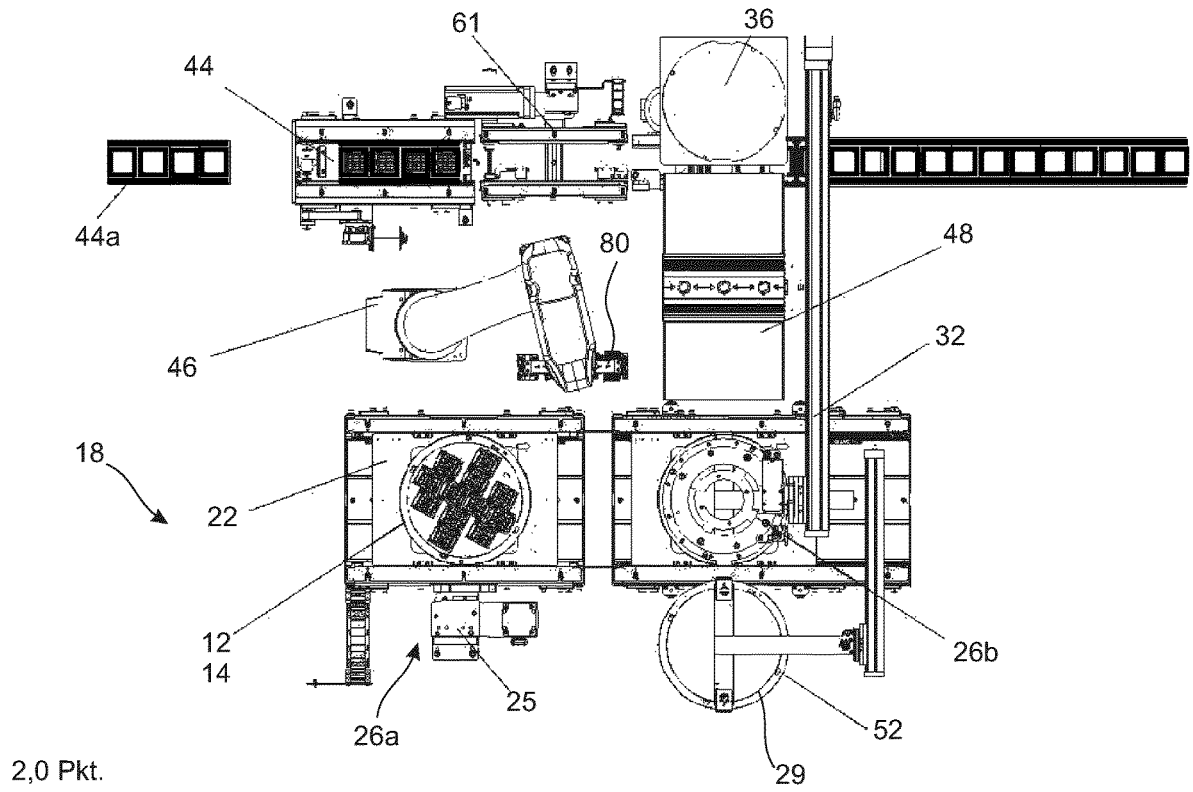
FIG. 38 shows an embodiment of a loading station with multiple gripper.

FIG. 38 shows an embodiment of a loading station 18 with multiple gripper With the aid of the flexible multiple gripper 80, a plurality of workpieces 14 or electronic assemblies 12 can be removed simultaneously from several conveying workpiece carriers 44 and placed onto a manufacturing workpiece carrier 22. It can be seen in the illustration that the conveying workpiece carriers 44 are arranged adjacent to one another along a virtual line. Using the multiple gripper 80, at least four workpieces 14 or electronic assemblies 12 can be removed from such an arrangement and placed in any arrangement onto the workpiece carrier 22. Reference is made to FIG. 13 in respect of the further aspects shown.

Figure 39:
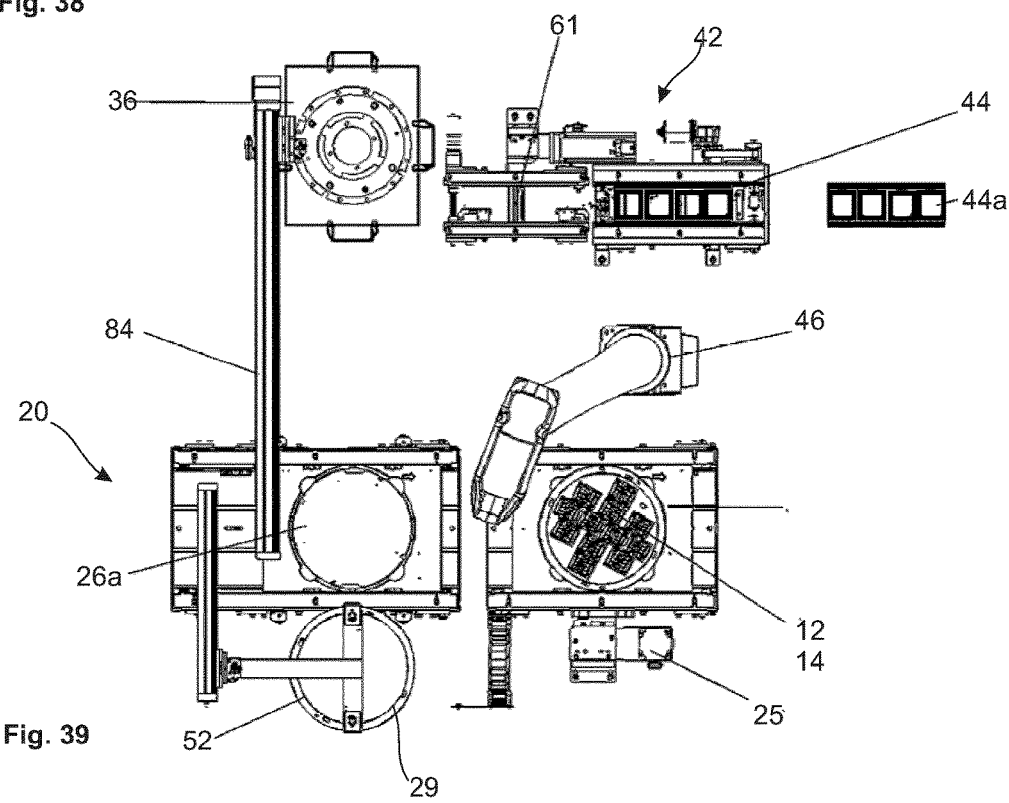
FIG. 39 shows an embodiment of a unloading station.

FIG. 39 shows an embodiment of an unloading station 20. In this embodiment, no multiple gripper 80 is arranged on the automation robot 96. The workpieces 14 or electronic assemblies 12 are therefore transferred individually from the manufacturing workpiece carrier 22 onto the conveying workpiece carrier 44. It is also conceivable to use a multiple gripper 80 in the unloading station 20, as shown in respect of the loading station 18 in FIG. 38. Reference is made to FIG. 14 in respect of the further aspects shown.

Figure 40:
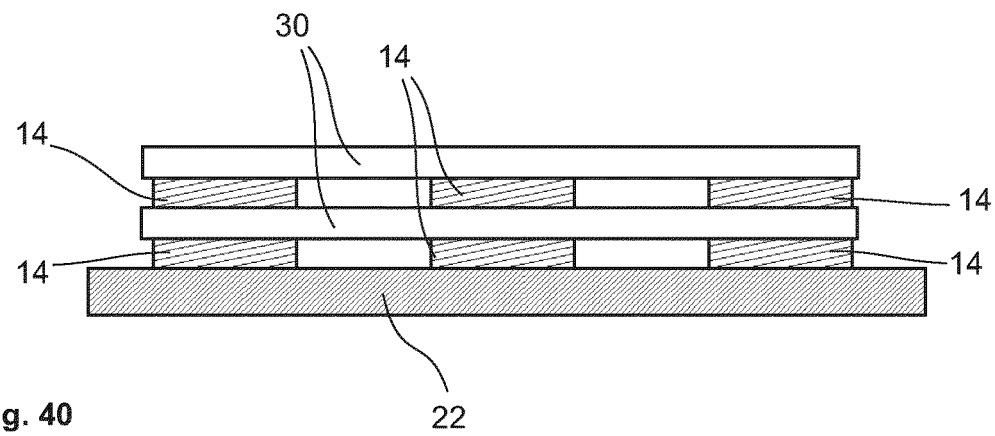
FIG. 40 shows an embodiment of a manufacturing workpiece carrier with workpieces or electronic assemblies mounted one above the other.

FIG. 40 shows an embodiment of a manufacturing workpiece carrier 22 with workpieces 14 arranged one above the other. In this embodiment, three first workpieces 14 are arranged underneath a first foil/film 30. Directly above the first three workpieces 14, three second workpieces 14 are placed above the foil/film 30, wherein a pressure pad or an equalizing foil/film can additionally be comprised. A further foil/film 30 is arranged above the second workpieces 14. The first and second workpieces 14 are arranged directly one above the other such that they can brace each other during a sintering process. In particular, the circumference and the geometry of the first workpieces match the circumference and the geometry of the second workpieces, such that the first and second workpieces can brace one another over their full width. A foil/film 30 and/or a pressure pad or an equalizing foil/film can be arranged between the layers of the workpieces 14. The workpieces 14 do not stick to one another and catching is prevented by the foil/film 30 arranged between them. The foils/films 30 used may be designed as a protective foil/film or as a pressure-equalizing foil/film. The workpieces 14 can be advantageously transferred using a multiple gripper 80.

Figure 41:
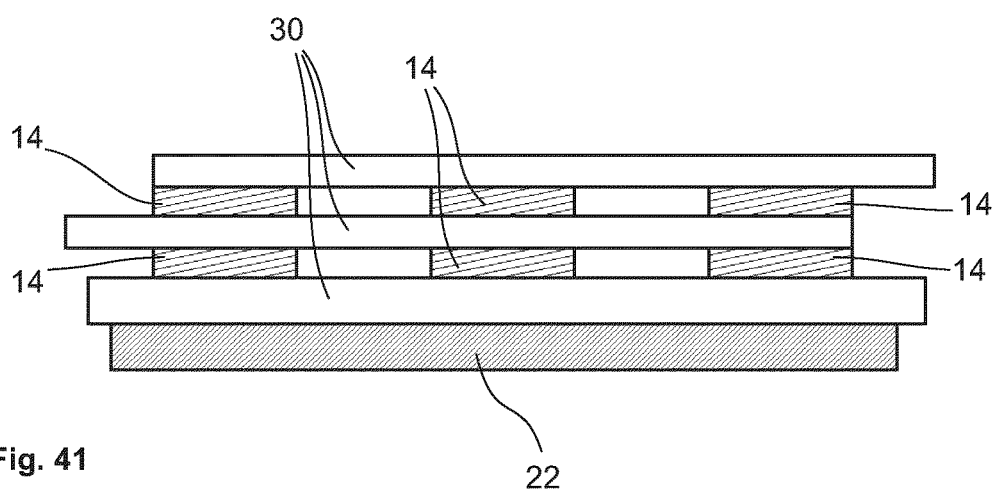
FIG. 41 shows a further embodiment of a manufacturing workpiece carrier with workpieces or electronic assemblies mounted one above the other.

FIG. 41 shows a further embodiment of a manufacturing workpiece carrier 22 with workpieces 14 arranged one above the other. Unlike in the illustration according to FIG. 40, a further foil/film is arranged underneath the first workpieces 14 to protect the manufacturing workpiece carrier from sticking to a pressure pad. It can be designed as a protective foil/film or as a pressure-equalizing foil/film.

Figure 42:
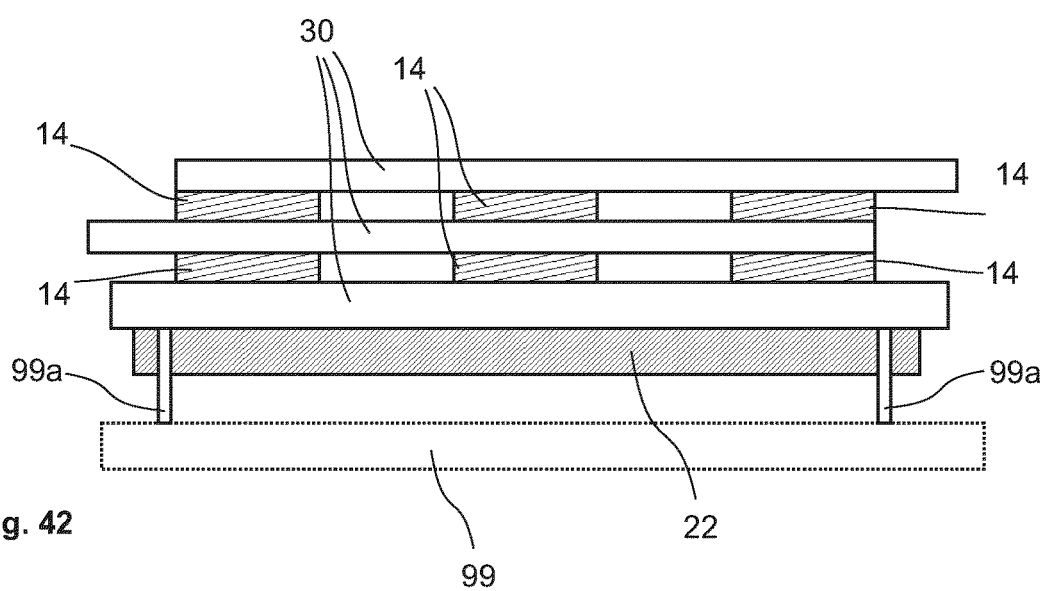
FIG. 42 shows a further embodiment of a manufacturing workpiece carrier with workpieces or electronic assemblies mounted one above the other.

FIG. 42 shows a further embodiment of a manufacturing workpiece carrier 22 with workpieces 14 arranged one above the other. To hold the bottom foil/film 30 during unloading and detachment of the foil/film 30, a vacuum nozzle unit 99 can be attached which is connected via passages 99*a* to the foil/film 30 and sucks up the latter.

For the manufacturing workpiece carrier 22 shown, with workpieces arranged one above the other 14, differing foil/film thicknesses and materials can be used. For example, PTFE or PFA can be used as the protective foil/film. A thicker pressure-equalizing foil/film can be placed onto it. Then an additional protective foil/film can be placed onto it and only after that the workpieces. Alternatively, sintering is also possible with a mask (not shown).

Figure 43:
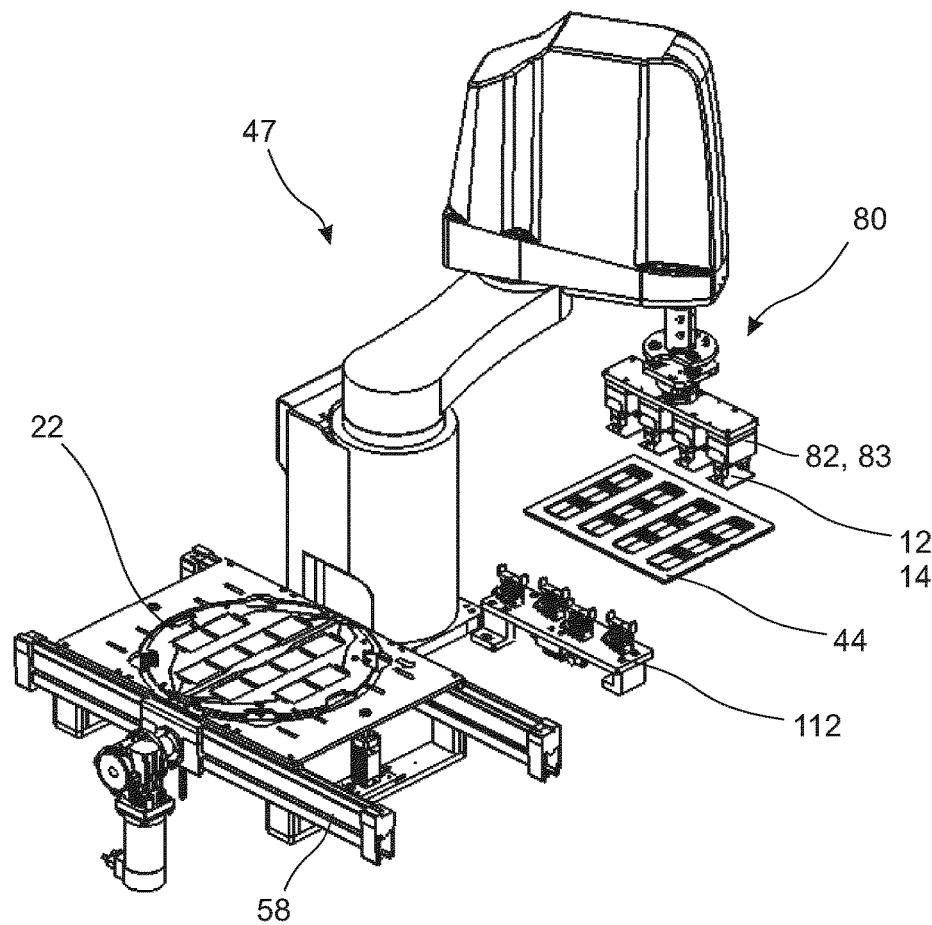
FIG. 43 shows a section of an embodiment of a loading station with a multiple gripper and an aligning unit.

FIG. 43 shows a section of an embodiment of a loading station 18 with a multiple gripper 80 and an aligning unit 112. The aligning elements of the multiple gripper and of the aligning unit 112 allow a precise transfer, i.e. gripping and aligned placement, of the workpieces/components from the conveying workpiece carrier onto the manufacturing workpiece carrier. This operation is described in the following. When the following mentions workpieces, this must also be taken to understood electronic assemblies.

The workpieces 14 are initially picked up from the conveying workpiece carrier 44 using the multiple gripper 80. Each workpiece 14 is held by one gripper arm 82. This is achieved using the gripping elements, which are described in more detail in relation to the following figures.

Figure 44:
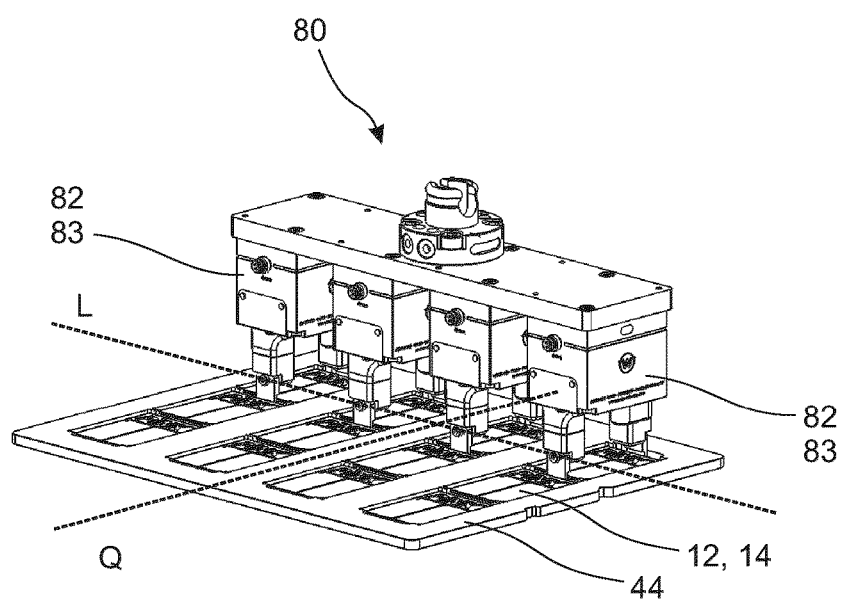
FIG. 44 shows an embodiment of a multiple gripper during operation.

FIG. 44 shows an embodiment of a multiple gripper 80 during operation. In the embodiment shown, each gripper arm 82 picks up one workpiece 14 from the conveying workpiece carrier 44. The different gripper arms 82 are arranged along a longitudinal axis L on the multiple gripper 80. Preferably, the gripper arms 82 can be moved along the longitudinal axis L relative to one another, as is explained in more detail in the previously described figures. To pick up further workpieces 14 from the conveying workpiece carrier 44, the complete multiple gripper 80 is moved along a transverse axis Q, such that the next row of workpieces 14 can be picked up.

Figure 45:
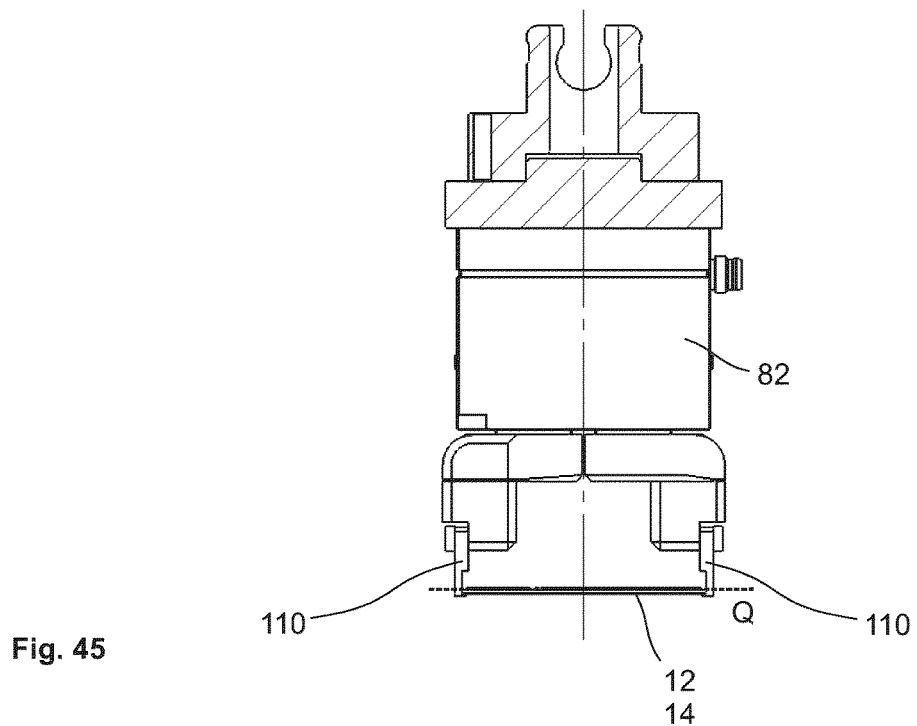
FIG. 45 shows a sectional representation through a gripper arm of a multiple gripper.

FIG. 45 shows a sectional representation through a gripper arm 82 of a multiple gripper 80. The two gripping elements 110 are arranged on two opposite sides of the gripper arm 82 and hold the workpiece 14. The gripping elements 110 also hold the workpiece 14 at two opposite lateral edges, such that the workpiece 14 is held in clamping manner. In the embodiment shown, the gripping elements 110 are arranged on the transverse axis Q. In another embodiment, the gripping elements 110 can also be arranged opposite on the longitudinal axis shown in FIG. 44, i.e. rotated 90°. A first alignment of the workpieces 14 can be achieved by the gripping elements 110, since a surface contact is made between the gripping elements 110 and the workpiece 14. As a result, the workpiece 14 is aligned at least on the longitudinal axis L or on the transverse axis Q.

Figure 46:
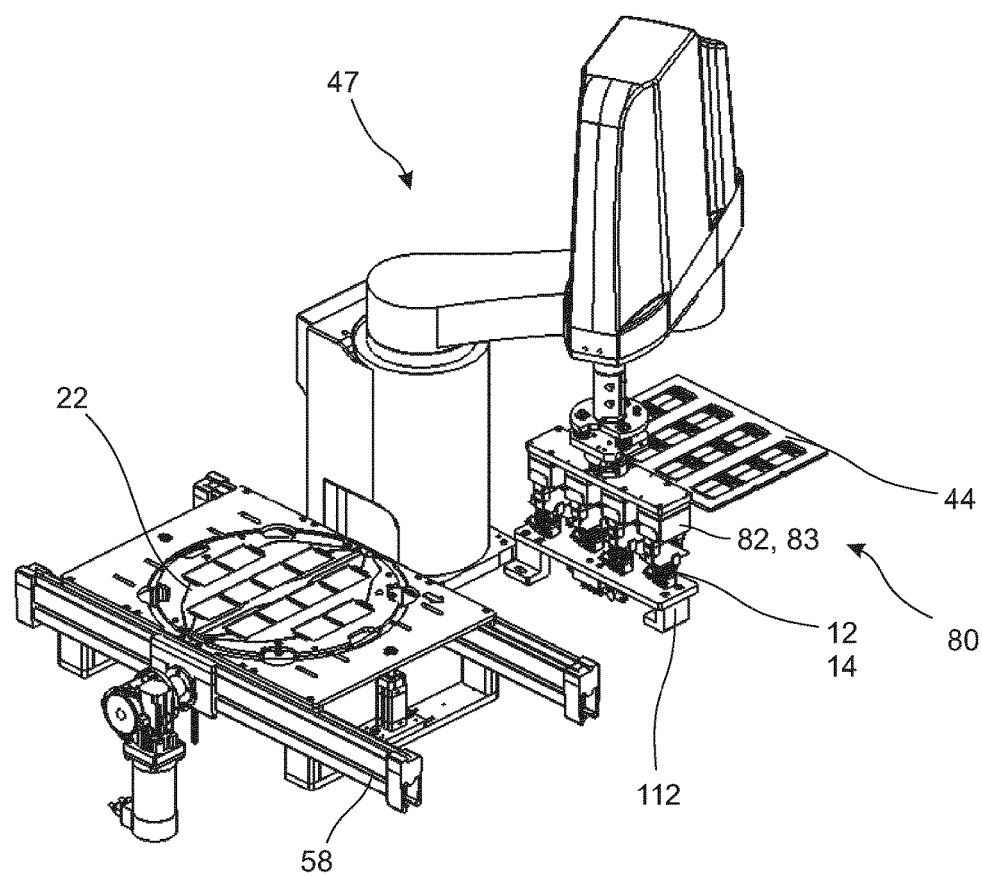
FIG. 46 shows a section of an embodiment of a loading station with a multiple gripper and an aligning unit.

FIG. 46 shows a section of an embodiment of a loading station 22 with a multiple gripper 80 and an aligning unit 112 in operation. In the situation shown, the multiple gripper 80 is arranged directly above the aligning unit 112. As a result, gripping elements of the aligning unit 112 can contact the workpieces 14, as explained in the following. This allows a further alignment of the workpieces 14 on the longitudinal axis L or the transverse axis Q. Preferably, a first alignment of the workpieces 14 in the longitudinal axis is achieved by the multiple gripper 80 and its gripping elements 110, and a further alignment of the workpieces 14 along the transverse axis Q by the aligning unit 112, wherein the longitudinal axis L and the transverse axis Q are arranged in a horizontal plane.

In an embodiment not shown, the aligning unit 112 can be designed as a type of stop edge against which the multiple gripper 80 with the workpieces 14 comes into contact. The contact of the workpieces 14 with an edge designed straight also permits an alignment of the workpieces 14 which are held on the multiple gripper 80. In particular it is those lateral edges of the 14 which are not in contact with gripping elements which should come into contact with the stop edge.

Figure 47:
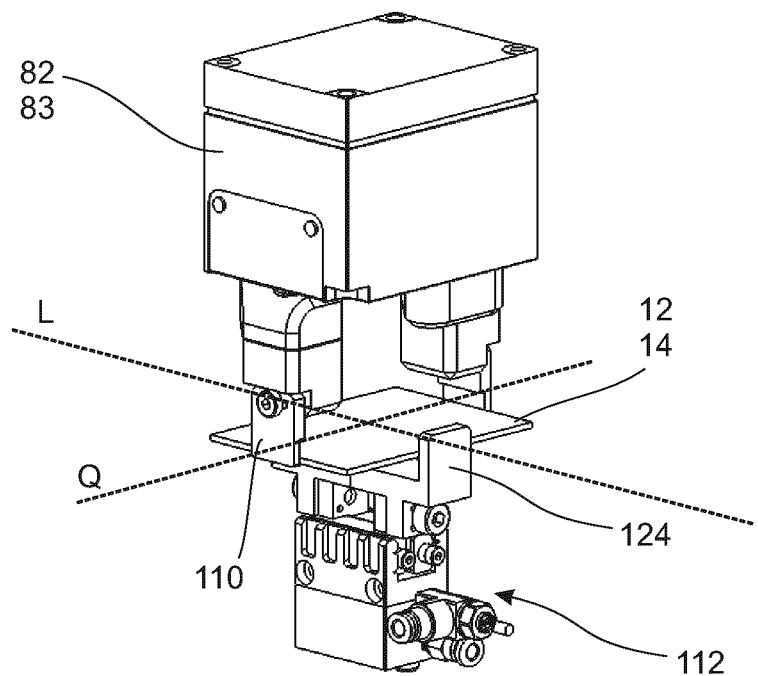
FIG. 47 shows a section of a multiple gripper with an aligning unit.

FIG. 47 shows a section of a multiple gripper 80 with an aligning unit 112. In the embodiment shown, it can be seen that the workpiece 14 is contacted on all four lateral edges with gripping elements 110 of the gripper arm 82 or with gripping elements 124 of the aligning unit 112. The workpiece 14 can thus be exactly aligned in the two axes L and Q. Parallel gripping by the gripping elements 110 enables the workpieces 14 to be centered in the longitudinal direction relative to the multiple gripper 80.

In other words, the workpieces 14 are gripped centrally with the multiple gripper 80 as a kind of parallel gripper in the longitudinal direction along the longitudinal axis L and aligned. The workpieces 14 are additionally aligned transversely to the longitudinal axis L, i.e. in the direction of the transverse axis Q, by the 90°-rotated parallel grippers 124 of the aligning unit 112. With a procedure like this, the workpieces 14 are centered on the multiple gripper 80 and can be exactly placed into the manufacturing workpiece carrier 22.

After gripping of the workpieces 14 with the multiple gripper 80 and centering with the aligning unit 112, conveying to the loading station 18 is possible using a robot arm 47.

Figure 48:
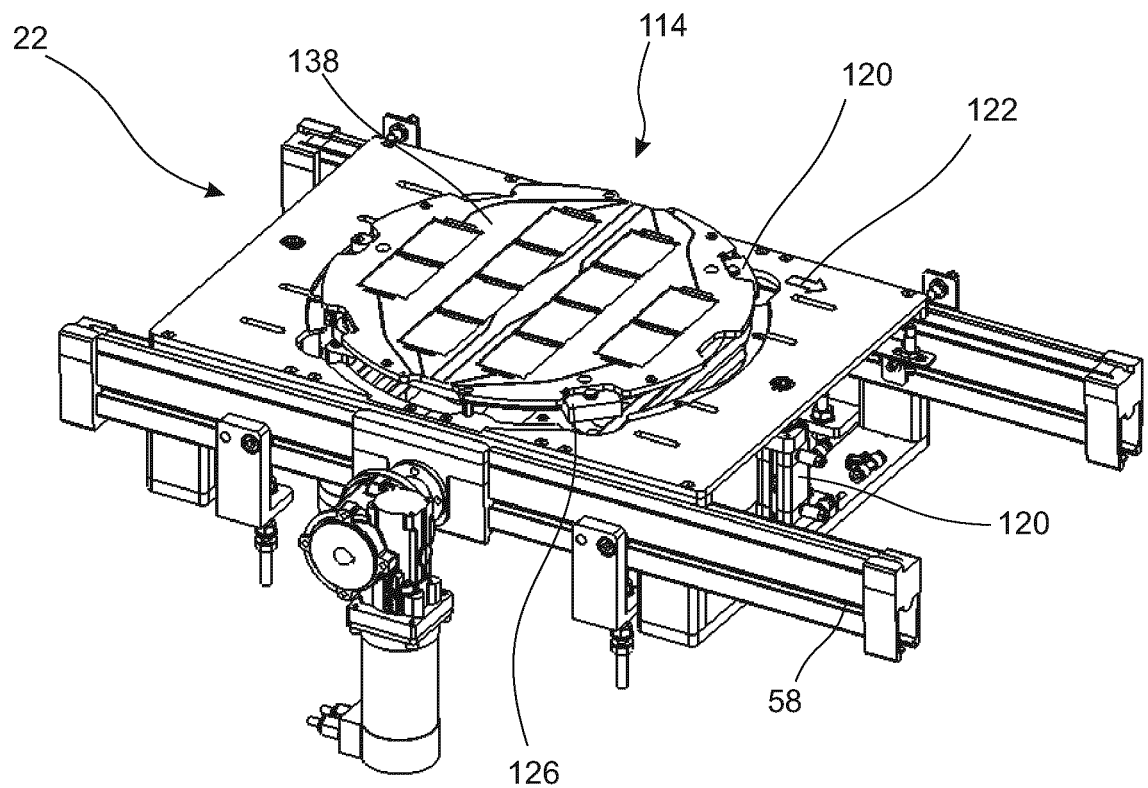
FIG. 48 shows a section of a loading station with a centering device.

FIG. 48 shows a section of a loading station 18 with a centering device 116. The manufacturing workpiece carrier 22 shown comprises a conveying frame 122 and a baseplate 138 displaceably inserted therein. The conveying frame 122 has a substantially circular recess in which the baseplate 138 is accommodated. The baseplate 136 integrated in the manufacturing workpiece carrier 22 should preferably be exactly centered and aligned relative to the conveying frame 122 in order to ensure accurate placing of the workpieces 14 into the receptacles, and serves preferably to exactly position accommodated workpieces 14 in a subsequent pressing process relative to press plungers in the manufacturing station 21. To do so, the manufacturing workpiece carrier 22 or the baseplate 138 accommodated therein can be aligned using a centering device 114. The centering device 114 comprises for example a centering plate 116 on which the baseplate 138 of the manufacturing workpiece carrier 22 is displaceably mounted. This allows the baseplate 138 of the manufacturing workpiece carrier 22 to be moved relative to the centering plate 116 and to the conveying frame 122. The centering plate 116 can be designed circular, for example, and be lifted relative to a frame element arranged around it. This allows the centering plate 116 to be moved.

Figure 49:
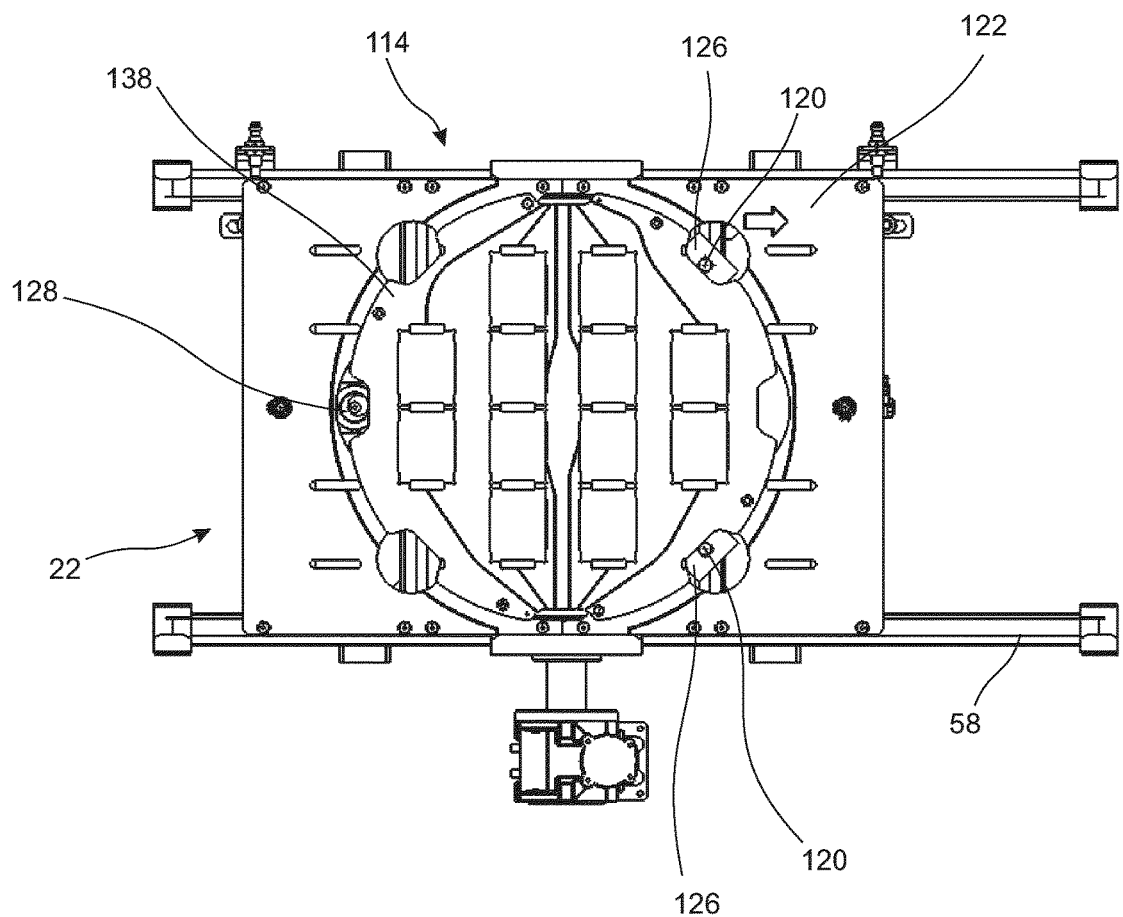
FIG. 49 shows a plan view onto a loading station with a centering device.

FIG. 49 shows a plan view onto a loading station 18 with a centering device 114. The centering device 114 has in this embodiment two pegs 120 against which the baseplate 138 of the manufacturing workpiece carrier 22 can be braced. The manufacturing workpiece carrier 22 is pressed against the pegs 120 and centered thereby using a contact element 128 which can be designed in particular as an eccentric.

Figure 50:
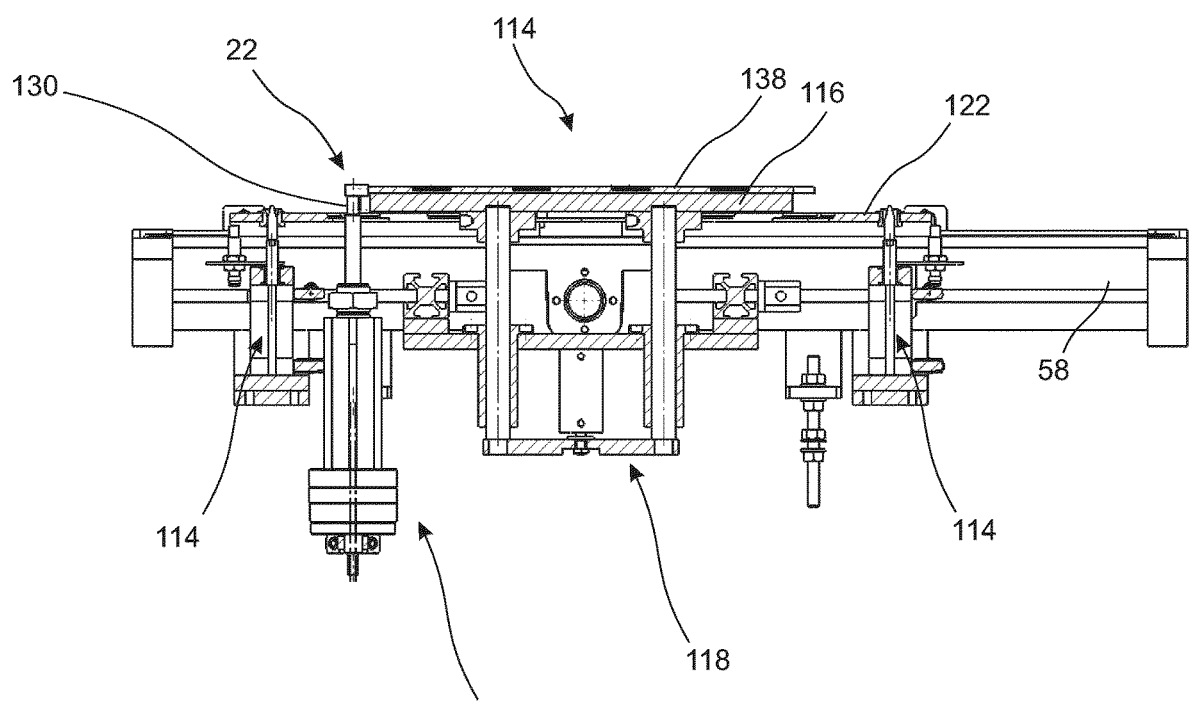
FIG. 50 shows a sectional representation through a loading station with a centering device.

FIG. 50 shows a section through a loading station 18 with a centering device 114. In this illustration, the centering plate 116 underneath the manufacturing workpiece carrier 22 is discernible. The pressing element 130 has a mechanism for control underneath the centering plate 116. A lifting unit 118 that can effect lifting and lowering of the centering plate 116 is also discernible. The conveying frame 122 is arranged around the centering plate 116 as a frame element in relation to which the baseplate 136 is to be aligned, and is a partial element of the manufacturing workpiece carrier 22.

Figure 51:
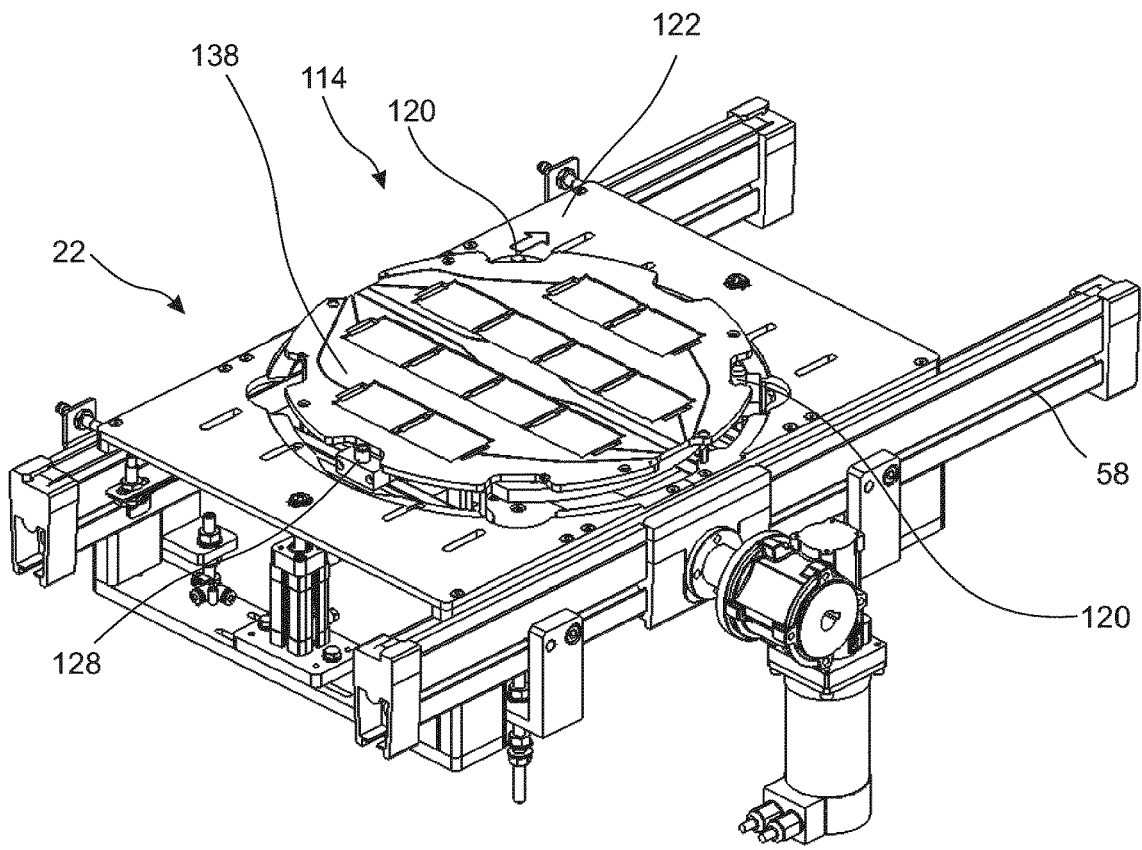
FIG. 51 shows a further view of a loading station with a centering device.
Figure 52:
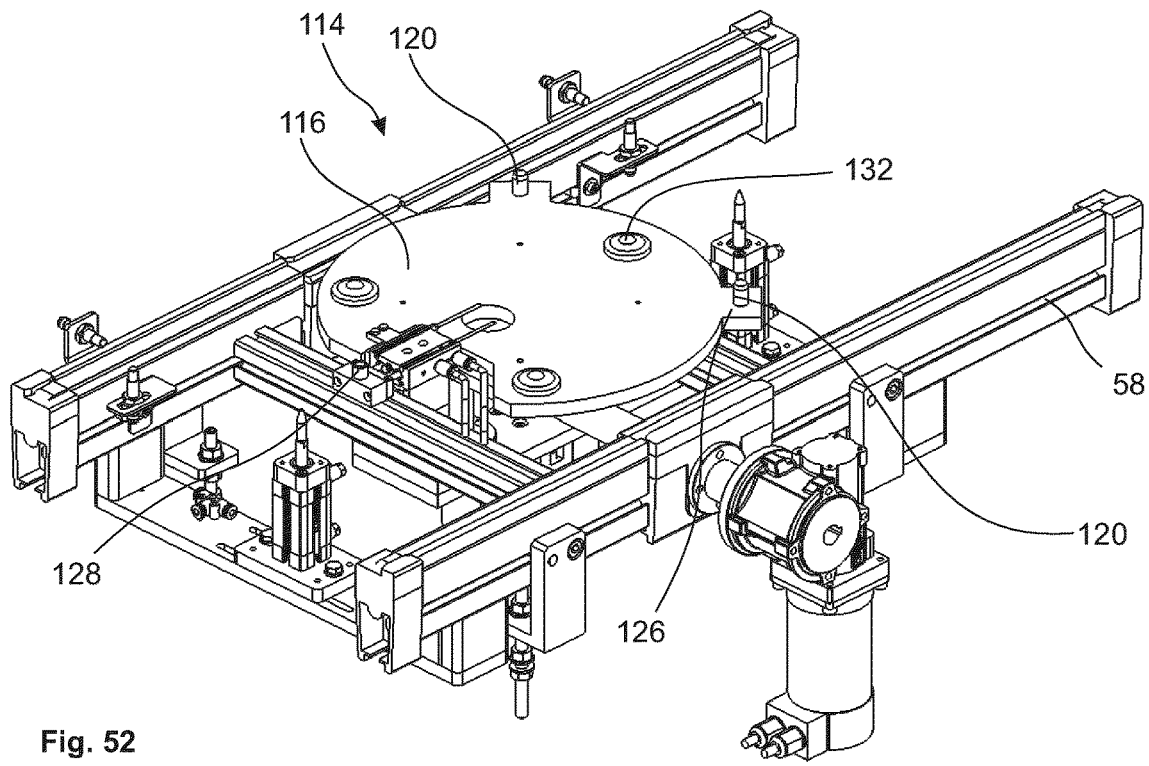
FIG. 52 shows the view from FIG. 51 without workpiece carrier.

FIG. 51 shows a further view of a loading station 18 with a centering device 116. FIG. 52 shows the view from FIG. 51 without workpiece carrier 22. It can be seen that the pegs 120 are arranged on a kind of ledge 126 of the centering plate 116. The pressing element 130 also has a contact element 128 designed as a kind of peg. This contact element 128 can however move relative to the centering plate 116. This permits a relative displacement of the baseplate 138 of the manufacturing workpiece carrier 22 relative to the centering plate 116 and to the conveying frame 122. The illustration also shows three supports 132 that can be designed for example as ball-bearing type supports, such that the baseplate 138 is mounted rotatable and displaceable by the centering plate 116 in order to be aligned in the conveying frame 122.

Figure 53:
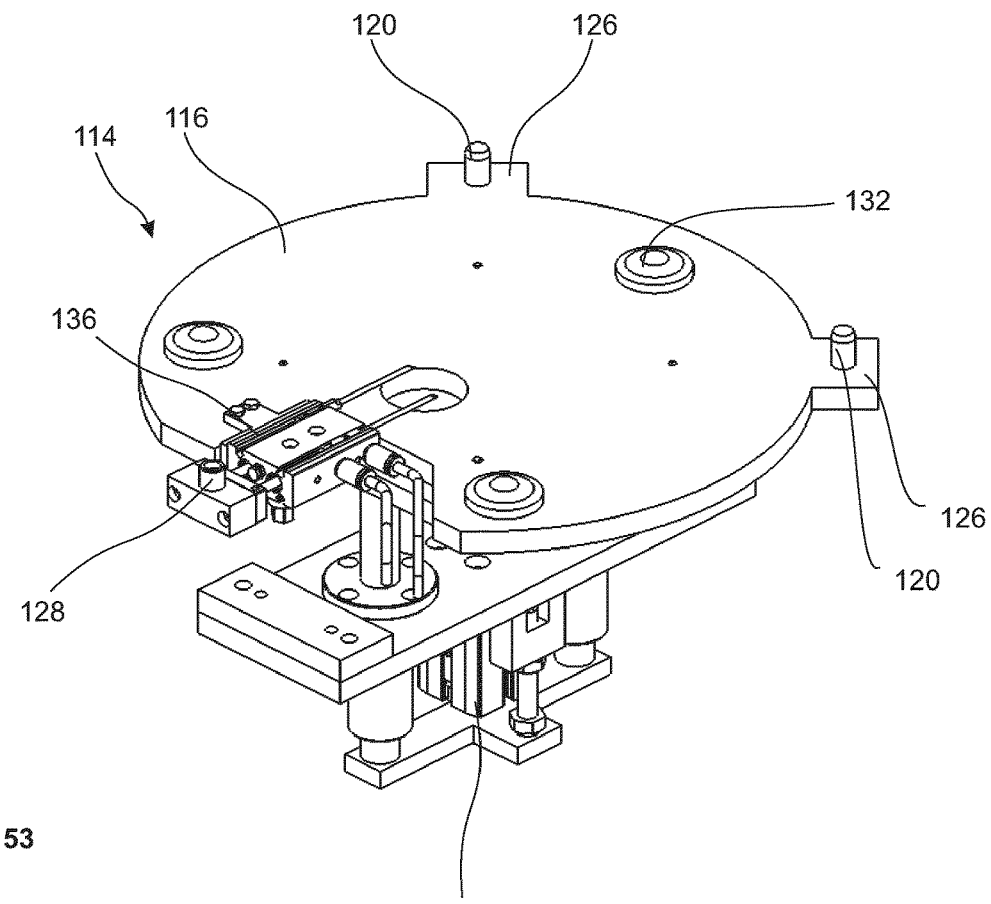
FIG. 53 shows a detailed view of the centering device.

FIG. 53 shows a detailed view of the centering device 114. The pegs 120 are arranged on the centering plate 116. In this embodiment, the centering plate 116 has ledges 126 on which the pegs 120 are arranged. A different embodiment is also conceivable. For example, the pegs 120 can be arranged at another position on the edge of the centering plate 116. The pressing element has a contact element 128 also designed as a peg. A different embodiment is conceivable here, for example in the form of a square-shaped projection or an elliptical projection. The centering plate 116 can be moved upwards and downwards using the lifting unit 118.

Figure 54:
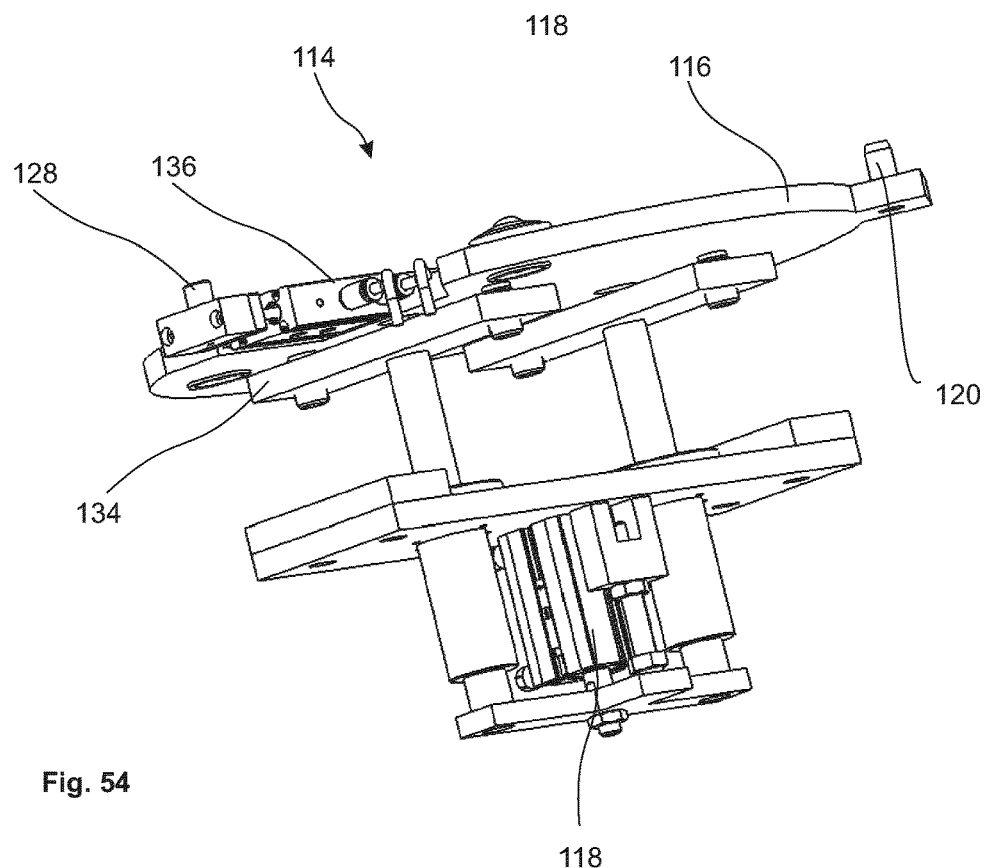
FIG. 54 shows a further detailed view of the centering device.

FIG. 54 shows a further detailed view of the centering device 114. In this embodiment, a leveling element 134 used for alignment of the centering plate 116 can be discerned. The pressing element has a pneumatic cylinder 136 used for pressing and for centering of the pressing element, i.e. in this embodiment of the contact element 128, on the baseplate 138 of the manufacturing workpiece carrier 22 accommodated in the conveying frame 122.

Exact alignment and positioning of the workpieces 14 or electronic assemblies during further processing in the manufacturing station 21 is achieved by means of the alignment of workpieces 14 or electronic assemblies during transfer from a conveying workpiece carrier 44 onto the manufacturing workpiece carrier 22 and preferably the previously performed alignment of the manufacturing workpiece carrier 22 or of a baseplate 138 relative to a conveying frame 122 of the manufacturing workpiece carrier 22.

The embodiments shown relating to the multiple gripper 80 can of course be combined as required with the embodiments shown of the centering device 114 and/or aligning unit 112. In particular, different multiple grippers 80 can be combined with a different number of gripper arms 82 or differently arranged and designed gripping elements 110.

REFERENCE NUMERAL LIST

10 System
10a Sintering or soldering system
12 Electronic assembly
14 Workpiece
16 Module
18 Loading station
20 Unloading station
21 Manufacturing station
22 Manufacturing workpiece carrier
24 Conveying unit
25 Lifting unit
26 Working position
26a-26d Working position
28 Mask
29 Parked position
30 Foil/film/individual foil/film element/equalizing foil/film (pressure pad)
32 Foil/film transfer unit
34 Foil/film transfer means
34a, 34b Foil/film transfer means
36 Foil/film stack of individual foil/film elements
38 Foil/film magazine
40 Foil/film lifting unit
42 Second conveying unit
44 Conveying workpiece carrier
46 Automation robot
47 Robot arm
48 Cleaning unit
50 Height-equalizing system
52 Retaining ring
54 Top
56 Removal surface
58 Displacement unit
60 Underfloor conveying unit
61 Lifting unit
62 Process cover
64 Linear unit
66 Foil/film carrier
68 Stack magazine of manufacturing workpiece carrier
70 Inspection camera
72 Optical reference mark
74 Form-fitting edge section
76 Fastening element
78 Magazine
80 Multiple gripper
82 Gripper arm
83 Outer gripper arm
84 Foil/film detachment unit
85 Linear unit
86 Peeling-off unit
88 Peeling-off element
90 Retaining element
92 Contact element
94 Gripping element
96 Roller
96a Recess
96b Raised area
98 Foil/film lifter
99 Vacuum nozzle unit
99a Passage
100 Method
110 Gripping element
112 Aligning unit
114 Centering device
116 Centering plate
118 Lifting unit
120 Peg
122 Conveying frame of manufacturing workpiece carrier
124 Gripping element
126 Ledge
128 Contact element
130 Pressing element
132 Support
134 Leveling element
136 Pneumatic cylinder
138 Baseplate of the manufacturing workpiece carrier
E1 Upper level
E2 Lower level
L Longitudinal axis
Q Transverse axis

The invention claimed is:

1. A system for connecting electronic assemblies and/or for manufacturing workpieces, in particular a sintering or soldering system, comprising:
   a plurality of modules for connecting the electronic assemblies and/or for manufacturing the workpieces; wherein;
   at least one module is designed as a loading station or one module as an unloading station;
   at least one further module is designed as a manufacturing station;
   a manufacturing workpiece carrier is provided for accommodating the electronic assemblies and/or workpieces which is movable by a conveying unit in automated manner from the loading station via the manufacturing station to the unloading station;
   the system is designed in particular for flow production;
   a multiple gripper is provided on a single robot by which at least two separate electronic assemblies and/or workpieces are simultaneously placeable onto the manufacturing workpiece carrier, wherein the multiple gripper having at least two gripper arms each designed to pick up one electronic assembly and/or one workpiece, and an alignment of at least one, in particular of all electronic assemblies and/or of at least one, in particular of all workpieces by the gripper arms takes place in an axis transverse or longitudinal to the multiple gripper.

2. The system according to claim 1, wherein the multiple gripper has four gripper arms, which are each designed to pick up one electronic assembly and/or one workpiece arm.

3. The system according to claim 1, wherein the multiple gripper has four gripper arms arranged parallel to one another along a line, two outer of the gripper arms being movable along the line such that they are movable relative to two inner of the gripper arms.

4. The system according to claim 1, further comprising at least one automation robot in the loading station and/or unloading station for guiding the multiple gripper by which at least two electronic assemblies and/or workpieces are placeable in automated manner and simultaneously from a conveying workpiece carrier onto the manufacturing workpiece carrier in the loading station.

5. The system according to claim 2, wherein at least one of the gripper arms, in particular every gripper arm, has at least two gripping elements for picking up an electronic assembly and/or workpiece, which effects an alignment of the electronic assembly and/or workpiece in an axis, wherein the axis passes in particular through both gripping elements.

6. The system according to claim 1, further comprising an aligning unit that effects an alignment of the electronic assembly and/or workpiece picked up by the multiple gripper in an axis parallel and/or transverse to the multiple gripper.

7. The system according to claim 6, wherein the aligning unit effects an alignment of the electronic assemblies and/or workpieces in an axis transverse to the alignment by means of the gripping elements.

8. The system according to claim 1, further comprising a centering device provided in the loading station for alignment and/or centering of the manufacturing workpiece carrier or of a baseplate of the manufacturing workpiece carrier accommodated in a conveying frame, the centering device effecting a horizontal and/or vertical alignment and/or centering of the manufacturing workpiece carrier before accommodating the electronic assemblies and/or workpieces.

9. The system according to claim 8, wherein the centering device comprises a centering plate and/or a lifting unit, wherein control is in particular pneumatic.

10. The system according to claim 8, further comprising at least one projection or peg, which is contactable with a stop on the manufacturing workpiece carrier, provided on the centering plate, such that alignment and/or centering of the manufacturing workpiece carrier relative to the centering plate takes place in the horizontal plane.

11. The system according to claim 4, further comprising a further conveying unit for accommodating the conveying workpiece carrier, the further conveying unit being movable, independently of the modules, from the loading station to the unloading station, in particular bypassing the manufacturing station.

12. The system according to claim 1, further comprising a manufacturing workpiece carrier with at least two workpieces, wherein the at least two workpieces are arranged one above the other on the manufacturing workpiece carrier, wherein a foil or film is arranged between the at least two workpieces arranged one above the other on the manufacturing workpiece carrier.

13. A method for connecting electronic assemblies and/or for manufacturing workpieces using a system according to claim 1, comprising the following steps:
   prefabricating electronic assemblies and/or workpieces by the multiple gripper by which at least two of the electronic assemblies and/or workpieces are placed simultaneously on the manufacturing workpiece carrier in the loading station, wherein during prefabrication in the loading station the electronic assemblies and/or workpieces are transferred in automated manner by the multiple gripper from a conveying workpiece carrier onto the manufacturing workpiece carrier;
   automatedly moving the manufacturing workpiece carrier from the loading station to at least one manufacturing station;
   unloading the electronic assemblies and/or workpieces by the multiple gripper from the manufacturing workpiece carrier onto the conveying workpiece carrier in the unloading station after passage of the electronic assemblies and/or workpieces through the manufacturing station; and
   automatedly returning the manufacturing workpiece carrier to the loading station, in particular bypassing the manufacturing station.

14. The method according to claim 13, wherein the returning of the manufacturing workpiece carrier takes place in a plane arranged below, above or adjacent in a plane in which the manufacturing workpiece carrier is arranged during loading and/or unloading.

15. The method according to claim 13, wherein the manufacturing workpiece carrier is returned by a first conveying unit, and the conveying workpiece carrier is arranged on a further conveying unit which is moved in particular in automated manner, wherein the first conveying unit and the further conveying unit are movable mutually independently, in particular bypassing the manufacturing station.

16. The method according to claim 13, wherein the conveying workpiece carrier accommodates one electronic assembly and/or one workpiece, and the manufacturing workpiece carrier accommodates more than two, in particular more than seven, especially twenty-four or more, electronic assemblies and/or workpieces, such that during loading and/or unloading the manufacturing workpiece carrier pauses at a position in the loading station until the conveying unit has fully loaded the manufacturing workpiece carrier with electronic assemblies and/or workpieces.

17. A method for loading a workpiece carrier of a system according claim 1, wherein an alignment of the workpieces is performed by the multiple gripper and/or by an aligning unit, such that all workpieces are aligned in a horizontal plane transversely and/or longitudinally to an axis of the multiple gripper.

18. The method according to claim 17, wherein a further alignment of the manufacturing workpiece carrier or of a baseplate of the manufacturing workpiece carrier accommodated in a conveying frame is performed by a centering device.

19. A method for loading a workpiece carrier of a system according to claim 12, comprising the steps:
　loading of the manufacturing workpiece carrier with at least one first workpiece;
　placing of the foil or film and/or of a pressure pad onto the first workpiece;
　further loading with at least one second workpiece above the foil or film and above the already arranged first workpiece;
　placing of a further foil or film and/or of a further pressure pad onto the second workpiece.

20. A method for unloading a manufacturing workpiece carrier of a system according to claim 12, comprising the steps:
　removing a top one of the foil or film and/or a top pressure pad,
　removing a top one of the workpiece or a top level of the workpieces from the manufacturing workpiece carrier;
　removing a further foil or film and/or a further pressure pad; and
　removing at least one further workpiece or a further level of workpieces from the manufacturing workpiece carrier.

* * * * *